US008669621B2

(12) United States Patent
Yamada

(10) Patent No.: US 8,669,621 B2
(45) Date of Patent: Mar. 11, 2014

(54) SEMICONDUCTOR DEVICE AND METHOD OF MANUFACTURING SEMICONDUCTOR DEVICE

(75) Inventor: Keiichi Yamada, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 13/806,112

(22) PCT Filed: Jun. 24, 2010

(86) PCT No.: PCT/JP2010/060753
§ 371 (c)(1),
(2), (4) Date: Dec. 20, 2012

(87) PCT Pub. No.: WO2011/161795
PCT Pub. Date: Dec. 29, 2011

(65) Prior Publication Data
US 2013/0093023 A1    Apr. 18, 2013

(51) Int. Cl.
*H01L 29/76* (2006.01)
(52) U.S. Cl.
USPC .... 257/370; 257/374; 257/378; 257/E27.015; 257/E21.695; 438/207; 438/234
(58) Field of Classification Search
USPC .......... 257/370, 374, 378, E27.015, E21.695; 438/207, 234
See application file for complete search history.

(56) References Cited

U.S. PATENT DOCUMENTS 6,693,344 B1   2/2004  Sato et al.
8,237,227 B2 *  8/2012  Lai et al. .................... 257/368

FOREIGN PATENT DOCUMENTS

| JP | 5-267593 | 10/1993 |
| JP | 7-86158 A | 3/1995 |
| JP | 10-256390 A | 9/1998 |
| JP | 2000-223600 A | 8/2000 |
| JP | 2001-274257 A | 10/2001 |

OTHER PUBLICATIONS

International Search Report (ISR) (PCT Form PCT/ISA/210) dated Sep. 28, 2010, in PCT/JP2010/060753.

* cited by examiner

*Primary Examiner* — Tu-Tu Ho
(74) *Attorney, Agent, or Firm* — McGinn IP Law Group, PLLC

(57) ABSTRACT

A semiconductor device includes a first insulated gate field effect transistor, a second insulated gate field effect transistor, a bipolar transistor, a first element isolation structure formed on a main surface above a pn junction formed between an emitter region and a base region, a second element isolation structure formed on the main surface above a pn junction formed between the base region and a collector region, and a third element isolation structure formed on the main surface opposite to the second element isolation structure relative to the collector region, in which the semiconductor device further includes a bipolar dummy electrode formed on at least one of the first element isolation structure, the second element isolation structure and the third element isolation structure and having a floating potential.

23 Claims, 65 Drawing Sheets

SEMICONDUCTOR DEVICE AND METHOD OF MANUFACTURING SEMICONDUCTOR DEVICE

TECHNICAL FIELD

The present invention relates to a semiconductor device and a method of manufacturing the semiconductor device.

BACKGROUND ART

In recent years, semiconductor devices having a series of required systems integrated on a single semiconductor chip have been proposed.

In such semiconductor devices, a circuit including a bipolar transistor as described in Japanese Patent Laying-Open No. 5-267593 and a circuit including an insulated gate field effect transistor are formed on the main surface of a semiconductor substrate.

CITATION LIST

Patent Literature

PTL 1: Japanese Patent Laying-Open No. 5-267593

SUMMARY OF INVENTION

Technical Problem

In a bipolar transistor, a silicide film may be formed on the upper surface of an emitter region in order to reduce contact resistance between the emitter region and the like and a contact. In an insulated gate field effect transistor, too, a silicide film may be formed on the upper surface of a gate electrode and the like in order to reduce resistance of the gate electrode. On the other hand, depending on the circuit to be incorporated, a silicide film may not be farmed on purpose on the upper surface of a gate electrode and the like of an insulated gate field effect transistor, for the purpose of securing wiring resistance.

Such a semiconductor device including a bipolar transistor having a silicide film formed on the upper surface of an emitter region and the like, an insulated gate field effect transistor having a silicide film formed on the upper surface of a gate electrode and the like, and an insulated gate field effect transistor not having a silicide film formed on the upper surface of a gate electrode and the like may be manufactured with the following method.

First, a bipolar transistor, and a first insulated gate field effect transistor and a second insulated gate field effect transistor not having a silicide film are formed on the main surface of a semiconductor substrate. Then, a protection film is formed to cover the bipolar transistor, the first insulated gate field effect transistor and the second insulated gate field effect transistor. The protection film is patterned to expose the bipolar transistor and the first insulated gate field effect transistor through the protection film. The second insulated gate field effect transistor remains covered with the protection film.

After the protection film is patterned, a metal film is formed on the bipolar transistor and the first insulated gate field effect transistor, and the metal film is subjected to heat treatment. As a result, a silicide film is formed on an emitter region of the bipolar transistor and on a gate electrode of the first insulated gate field effect transistor. On the other hand, since the second insulated gate field effect transistor is covered with the protection film, a silicide film is not formed on a gate electrode and the like of the second insulated gate field effect transistor. Then, the protection film and the metal film thereon are removed.

According to this method, a semiconductor device including a bipolar transistor having a silicide film formed on the upper surface of an emitter region and the like, a first insulated gate field effect transistor having a silicide film formed on the upper surface of a gate electrode and the like, and a second insulated gate field effect transistor not having a silicide film can be manufactured.

As a result of diligent studies by the present inventor, however, it has been found that the protection film deposited varies in thickness with the position in the manufacturing method as described above.

Specifically, on the main surface of the semiconductor substrate, the protection film increases in thickness in a region where the bipolar transistor has been formed, and decreases in thickness in regions where the first insulated gate field effect transistor and the second insulated gate field effect transistor have been formed.

For this reason, when the protection film is patterned to expose the bipolar transistor and the first insulated gate field effect transistor, the protection film may remain on the bipolar transistor.

If a salicidation step is performed with the protection film remaining on the upper surface of the emitter region and the like, the silicide film formed on the emitter region and the like of the bipolar transistor may vary in thickness, resulting in inability to obtain prescribed characteristics of the bipolar transistor.

The present invention was made in view of the problems as described above, and an object of the present invention is to provide a semiconductor device including a bipolar transistor and a first insulated gate field effect transistor having a silicide film, and a second insulated gate field effect transistor not having a silicide film, and a method of manufacturing the semiconductor device, capable of attaining a uniform thickness of the silicide film formed on the bipolar transistor.

Solution to Problem

A semiconductor device according to the present invention includes a semiconductor substrate having a main surface, a first insulated gate field effect transistor including a pair of first source/drain regions formed on the main surface, and a first gate electrode formed on the main surface between the pair of first source/drain regions, and a second insulated gate field effect transistor including a pair of second source/drain regions formed on the main surface, and a second gate electrode formed on the main surface between the pair of second source/drain regions. The semiconductor device includes a bipolar transistor including an emitter region formed on the main surface, a base region formed on the main surface to form a pn junction with the emitter region, and a collector region formed on the main surface opposite to the emitter region relative to the base region to form a pn junction with the base region. The semiconductor device includes a first element isolation structure formed on the main surface above the pn junction formed between the emitter region and the base region, a second element isolation structure formed on the main surface above the pn junction formed between the base region and the collector region, and a third element isolation structure formed on the main surface opposite to the second element isolation structure relative to the collector region. The pair of first source/drain regions, the emitter region, the base region and the collector region each have a silicided surface, and the pair of second source/drain regions and the second gate electrode each have a non-silicided surface. The semiconductor device further includes a bipolar dummy electrode which is formed on at least one of the first element isolation structure, the second element isolation structure and the third element isolation structure, and which is not used as a circuit.

A method of manufacturing a semiconductor device according to the present invention includes the steps of preparing a semiconductor substrate having a main surface, and forming a first insulated gate field effect transistor including a pair of first source/drain regions formed on the main surface, and a first gate electrode formed on the main surface between the pair of first source/drain regions. The method of manufacturing a semiconductor device includes the step of forming a second insulated gate field effect transistor including a pair of second source/drain regions formed on the main surface, and a second gate electrode formed on the main surface between the pair of second source/drain regions. The method of manufacturing a semiconductor device includes the step of forming a bipolar transistor including an emitter region formed on the main surface, a base region formed on the main surface to form a pn junction with the emitter region, and a collector region formed on the main surface opposite to the emitter region relative to the base region to form a pn junction with the base region. The method of manufacturing a semiconductor device includes the steps of forming a first element isolation structure on the main surface above the pn junction formed between the emitter region and the base region, forming a second element isolation structure on the main surface above the pn junction formed between the base region and the collector region, and forming a third element isolation structure on the main surface opposite to the second element isolation structure relative to the collector region. The method of manufacturing a semiconductor device includes the step of forming a bipolar dummy electrode, which is not used as a circuit, on an upper surface of at least one of the first element isolation structure, the second element isolation structure and the third element isolation structure. The method of manufacturing a semiconductor device includes the step of forming a protection film to cover the first insulated gate field effect transistor, the second insulated gate field effect transistor, the bipolar transistor and the bipolar dummy electrode. The method of manufacturing a semiconductor device includes the steps of patterning the protection film to expose the first insulated gate field effect transistor and the bipolar transistor, and forming a metal film to cover the first insulated gate field effect transistor and the bipolar transistor exposed through the protection film and the patterned protection film. The method of manufacturing a semiconductor device includes the step of subjecting the metal film to heat treatment to form a silicide film on each of the first source/drain regions, the emitter region, the base region and the collector region.

BRIEF DESCRIPTION OF DRAWINGS

FIG. 11 is a cross-sectional view taken along the line XI-XI shown in FIGS. 9 and 10, which illustrates a gate electrode GE1 and the like.

FIG. 157 is a graph illustrating emitter-collector voltages of unit bipolar transistor UB6 of inventive element TEG6 and unit bipolar transistors UB7, UB8 of inventive elements TEG7, TEG8.

FIG. 158 is a schematic diagram schematically showing the SEM picture shown in FIG. 90.

DESCRIPTION OF EMBODIMENTS

Figure 1:
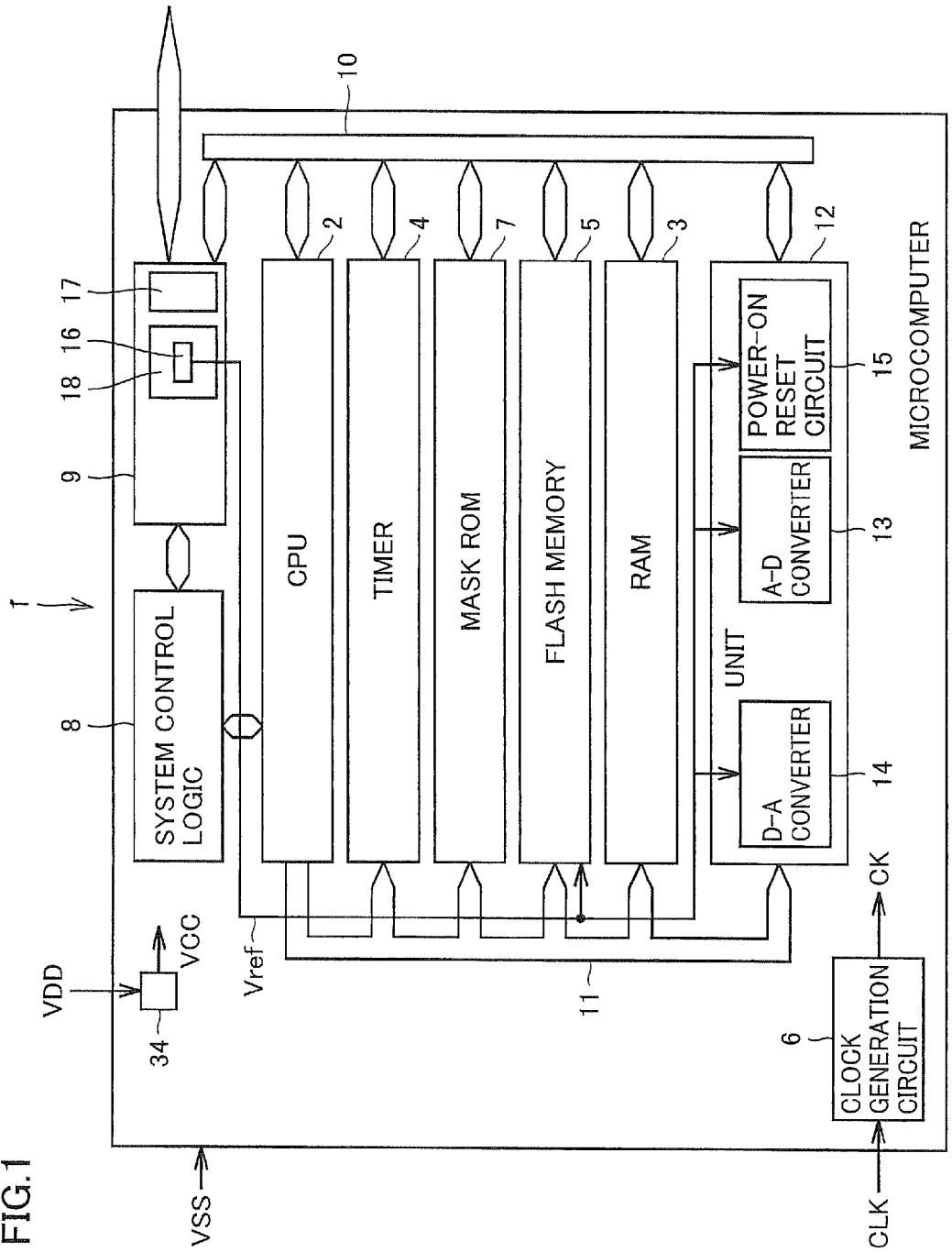
FIG. 1 is a block diagram showing a semiconductor device 1 according to a first embodiment.
Figure 158:
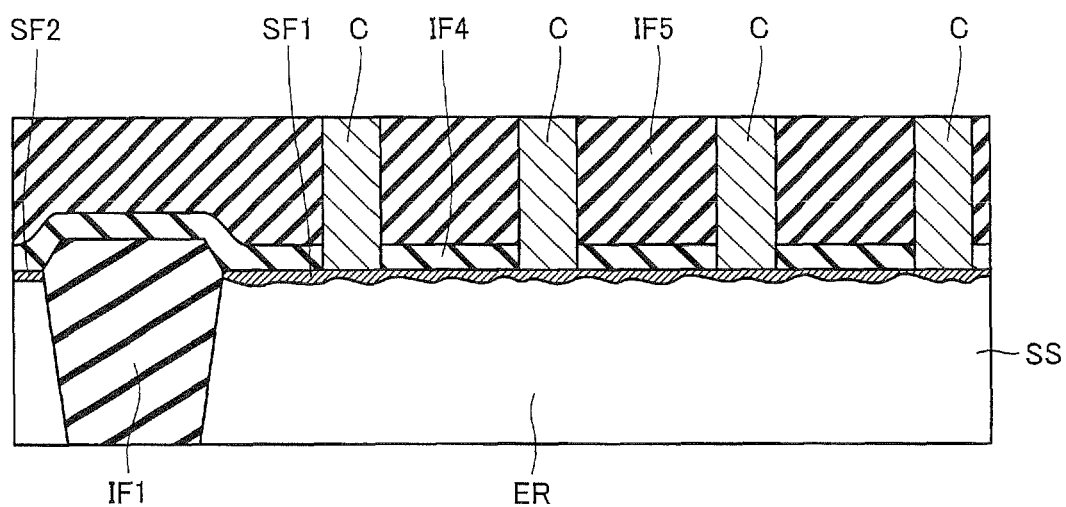

Referring to FIGS. 1 to 158, embodiments according to the present invention will be described. Whenever any reference is made to a number, an amount and the like in the embodiments described below, the scope of the present invention is not necessarily limited to that number, amount and the like unless otherwise specified. Moreover, in the following embodiments, each constituent element is not necessarily an essential element of the present invention unless otherwise specified. Furthermore, if there are a plurality of embodiments below, it is originally intended to combine features of the embodiments together as appropriate unless otherwise specified.

First Embodiment

FIG. 1 is a block diagram showing a semiconductor device 1 according to a first embodiment. Although not particularly limited, semiconductor device 1 is formed on a single semiconductor substrate or semiconductor chip such as single crystal silicon by a technique of manufacturing a semiconductor integrated circuit such as a CMOS.

Semiconductor device 1 includes a CPU (Central Processing unit) 2, a RAM (Random Access Memory) 3, a timer 4, a flash memory 5, a clock generation circuit 6, a mask ROM (Read Only Memory) 7, a system control logic 8, an input/output circuit 9, a data bus 10, an address bus 11, a peripheral circuit unit 12, and a power supply circuit 34.

Mask ROM 7 is used to store an operation program of CPU 2 and data. RAM 3 serves as a work area of CPU 2 or a temporary storage area of data, and is formed of a SRAM (Static Random Access Memory), a DRAM (Dynamic Random Access Memory) or the like.

CPU 2 fetches instructions from mask ROM 7, decodes the fetched instructions, and performs operand fetch and data operation based on the decoded result.

Peripheral circuit unit 12 includes an A-D converter 13, a D-A converter 14, a power-on reset circuit 15 and the like.

Input/output circuit 9 is used to input/output data, to input an external interrupt signal, and so on. Input/output circuit 9 is coupled to data bus 10, which is connected to CPU 2, RAM 3, timer 4, flash memory 5, peripheral circuit unit 12 and the like. In semiconductor device 1, CPU 2 is a bus master module. CPU 2 outputs an address signal to address bus 11 connected to RAM 3, timer 4, flash memory 5, mask ROM 7 and peripheral circuit unit 12. System control logic 8 performs control and interrupt control of an operation mode of semiconductor device 1. When a reset operation is indicated, the inside of semiconductor device 1 is initialized, causing CPU 2 to begin executing instructions starting with a leading address of a program in flash memory 5. Clock generation circuit 6 receives an external clock signal CLK to generate an internal clock signal CK. Semiconductor device 1 is operated in synchronization with internal clock signal CK.

Flash memory 5 is configured to be able to electrically erase and write stored information. A non-volatile memory such as an EEPROM (electrically erasable and programmable read-only memory) or a high dielectric memory may be employed instead of flash memory 5. Input/output circuit 9 includes an output buffer 17 and a control circuit 18. A reference voltage Vref generated by a reference voltage generation circuit 16 provided in control circuit 18 is, for example, supplied to A-D converter 13 and D-A converter 14 and utilized as a reference voltage for conversion, is supplied to power-on reset circuit 15 and utilized as a reference for detecting a power-on voltage, and is further supplied to flash memory 5 and utilized as a voltage for controlling voltage boost in a charge pump circuit that generates a high voltage for erasing and writing.

Figure 2:
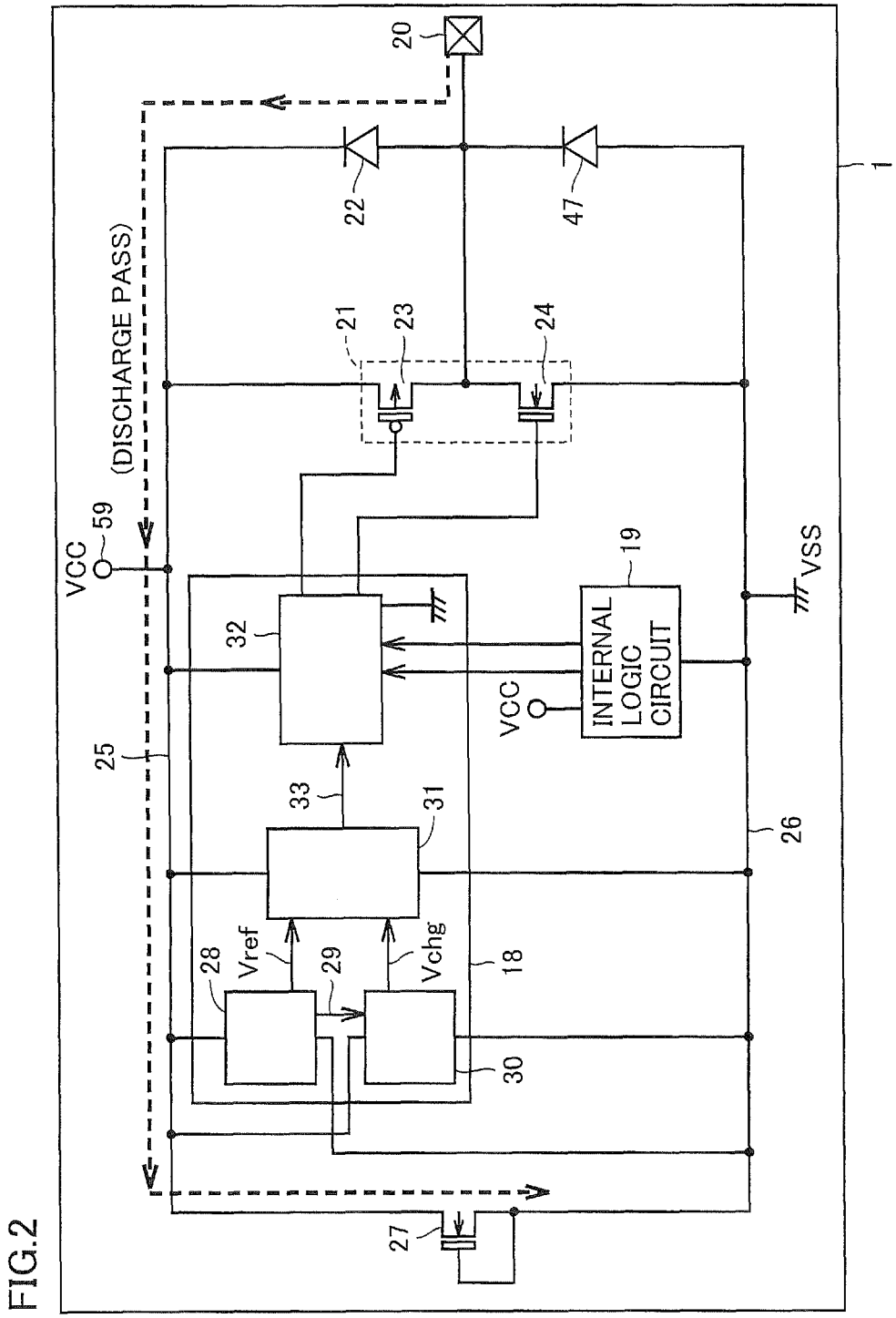
FIG. 2 shows a static protection circuit in semiconductor device 1.

FIG. 2 shows a static protection circuit in semiconductor device 1. Semiconductor device 1 includes an internal logic circuit 19, a relay terminal 20, an output buffer 21 capable of receiving a signal from internal logic circuit 19 for output to the relay terminal, and a power supply terminal 59 to which an output voltage VCC from power supply circuit 34 shown in FIG. 1 is applied. Semiconductor device 1 further includes a static protection diode 22 as a first static protection element of a PN junction type which is arranged in reverse connection between relay terminal 20 and power supply terminal 59, and control circuit 18 for controlling output buffer 21 to be in a high-output impedance state for at least a prescribed period of time in response to an increase in potential of power supply terminal 59. Output buffer 21 includes a p channel type MOS transistor 23 and an n channel type MOS transistor 24 in series.

When a positive static surge is applied to relay terminal 20, a surge current flows through static protection diode 22 to a power supply line 25. A clamping circuit 27 between power supplies is interposed between a ground line 26 connected to an earthing terminal VSS of the circuit and power supply line 25. Clamping circuit 27 between power supplies (protection element between power supplies) is formed of an n channel type MOS transistor in a so-called diode connection configuration in which a source and a gate connected to each other. The surge current flown to power supply line 25 breaks down clamping circuit 27 between power supplies, and is absorbed toward earthing terminal VSS of the circuit. The dashed line arrows in the figure indicate a discharge pass of the surge current due to the positive static surge. A static protection diode 47 as a second static protection element of a PN junction type which is arranged in reverse connection is provided between relay terminal 20 and earthing terminal VSS of the circuit, so that a negative surge can also be effectively addressed.

Control circuit 18 includes a reference voltage generation circuit 28 for receiving a voltage from power supply terminal 59 to generate reference voltage Vref, and a charge circuit 30 for receiving a voltage from power supply terminal 59 to perform charging operation, with a transition to an enable level in a control signal 29 which is enabled in response to the generation of prescribed reference voltage Vref as a trigger. Control circuit 18 further includes a comparator 31 for detecting that a charging voltage Vchg by charge circuit 30 reaches a target level, e.g., reference voltage Vref, and a buffer control logic circuit 32 for controlling output buffer 21 to be in a high output impedance state until the detection of matching by comparator 31.

The enable level of control signal 29 is a low level. Buffer control logic circuit 32 includes an inverter (not shown) which is inverted in response to an output signal 33 from comparator 31, a two-input NAND gate (not shown) for receiving an output from the inverter in an inverted manner, and a two-input NOR gate for receiving an output from the inverter. An output control signal which is output from internal logic circuit 19 is supplied to the other input terminal of each of the NAND gate and the NOR gate. This output control signal is a signal of a logical value corresponding to the logical value of data to be output in logical operation of internal logic circuit 19.

Figure 3:
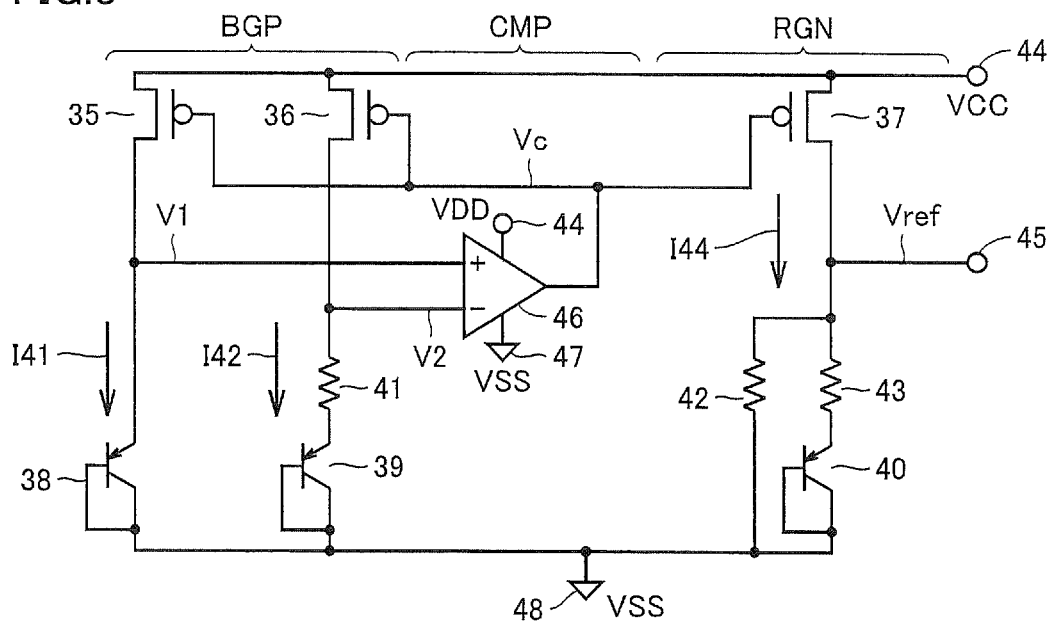
FIG. 3 is a circuit diagram of a reference voltage generation circuit 28.

FIG. 3 is a circuit diagram of reference voltage generation circuit 28. The reference voltage generation circuit shown in this figure includes p channel type current source MOS transistors 35, 36, 37 arranged on the side of a power supply terminal 44, and PN junction PNP bipolar transistors 38, 39, 40 as PN junction type load elements arranged on the side of an earthing terminal 48 of the circuit. Current source MOS transistors 35, 36, 37 function as current sources having current values in a prescribed ratio. PN junction PNP bipolar transistors 38, 39, 40 function as PN junction type load elements having areas in a prescribed ratio. The area ratio between PN junction PNP bipolar transistor 38 and PN junction PNP bipolar transistor 39 is set to M (positive number equal to or more than 1):N (positive number equal to or more than 1, which is greater than M). A resistor 41 is disposed in a current path passing through current source MOS transistor 36, and resistors 43, 42 are disposed in a current path passing through current source MOS transistor 37. Resistor 43 is in series with PN junction PNP bipolar transistor 40, and resistor 42 is in parallel with a path in which resistor 43 and PN junction PNP bipolar transistor 40 are in series. Power supply voltage VCC is supplied to power supply terminal 44, and a ground voltage of the circuit is supplied to earthing terminal 48.

Current source MOS transistor 35 generates a first voltage V1, with PN junction PNP bipolar transistor 38 as a load circuit. Current source MOS transistor 36 generates a second voltage V2, with a first series connection circuit having PN junction PNP bipolar transistor 39 and resistor 41 connected in series as a load circuit. A comparison circuit 46 compares the first voltage with the second voltage to generate a control voltage Vc, and collectively controls current source MOS transistors 35, 36, 37 to equalize first voltage V1 with second voltage V2. Comparison circuit 46 is formed of a differential amplifier. A drain voltage of current source MOS transistor 37 is output as an output voltage to an output terminal 45, and this voltage is utilized as a reference voltage.

Figure 4:
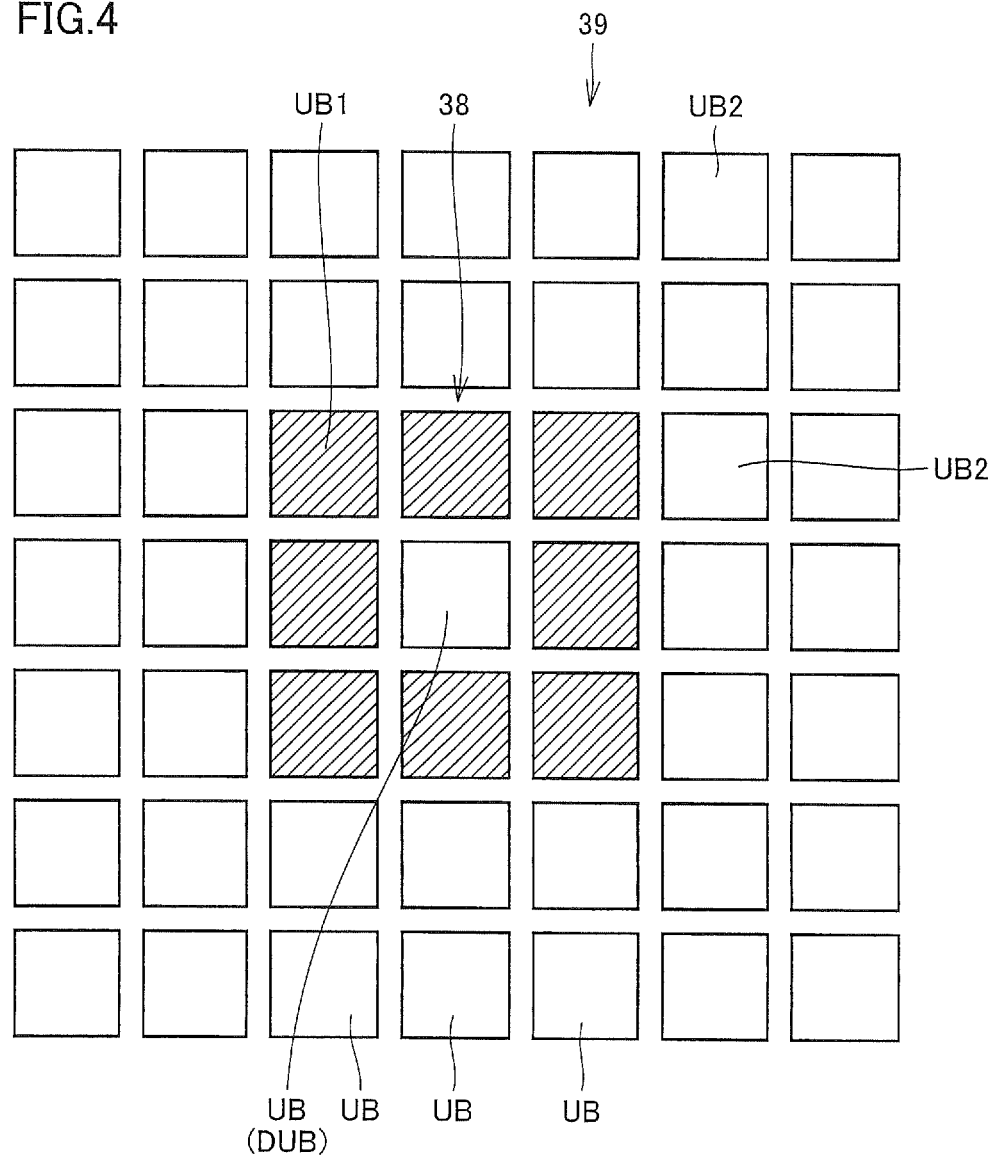
FIG. 4 is a plan view of a PN junction PNP bipolar transistor 38 shown in FIG. 3.

FIG. 4 is a plan view of PN junction PNP bipolar transistor 38 and PN junction PNP bipolar transistor 39 shown in FIG. 3. As shown, each of PN junction PNP bipolar transistor 38 and PN junction PNP bipolar transistor 39 includes a plurality of unit bipolar transistors UB arranged in an array on a main surface of a semiconductor substrate SS.

In the example shown in FIG. 4, seven unit bipolar transistors UB are aligned in a row direction, and seven unit bipolar transistors UB are aligned in a column direction. One of unit bipolar transistors UB arranged in an array that is positioned in a central portion is a dummy unit bipolar transistor DUB. Dummy unit bipolar transistor DUB is not connected to wires and the like, and is electrically floating. Furthermore, dummy unit bipolar transistor DUB is not used as a circuit. Although dummy unit bipolar transistor DUB may be fixed to some potential without electrically floating, it is not used as a circuit.

In the example shown in FIG. 4, eight unit bipolar transistors UB1 surrounding the periphery of dummy unit bipolar transistor DUB form PN junction PNP bipolar transistor 38. In FIG. 4, unit bipolar transistors UB1 are hatched for illustrative purposes. Forty unit bipolar transistors UB2 provided on an outer side relative to PN junction PNP bipolar transistor 38 form PN junction PNP bipolar transistor 39. As such, both of the plurality of unit bipolar transistors UB1 forming PN junction PNP bipolar transistor 38 and the plurality of unit bipolar transistors UB2 forming PN junction PNP bipolar transistor 39 are arranged with dummy unit bipolar transistor DUB as a center, with the centroid of PN junction PNP bipolar transistor 38 matching the centroid of PN junction PNP bipolar transistor 39. Such arrangement of PN junction PNP bipolar transistors 38, 39 where the centroids of a plurality of elements match with each other is referred to as a common centroid arrangement. The effect provided by the common centroid arrangement of PN junction PNP bipolar transistor 38 and PN junction PNP bipolar transistor 39 will be described later.

Figure 5:
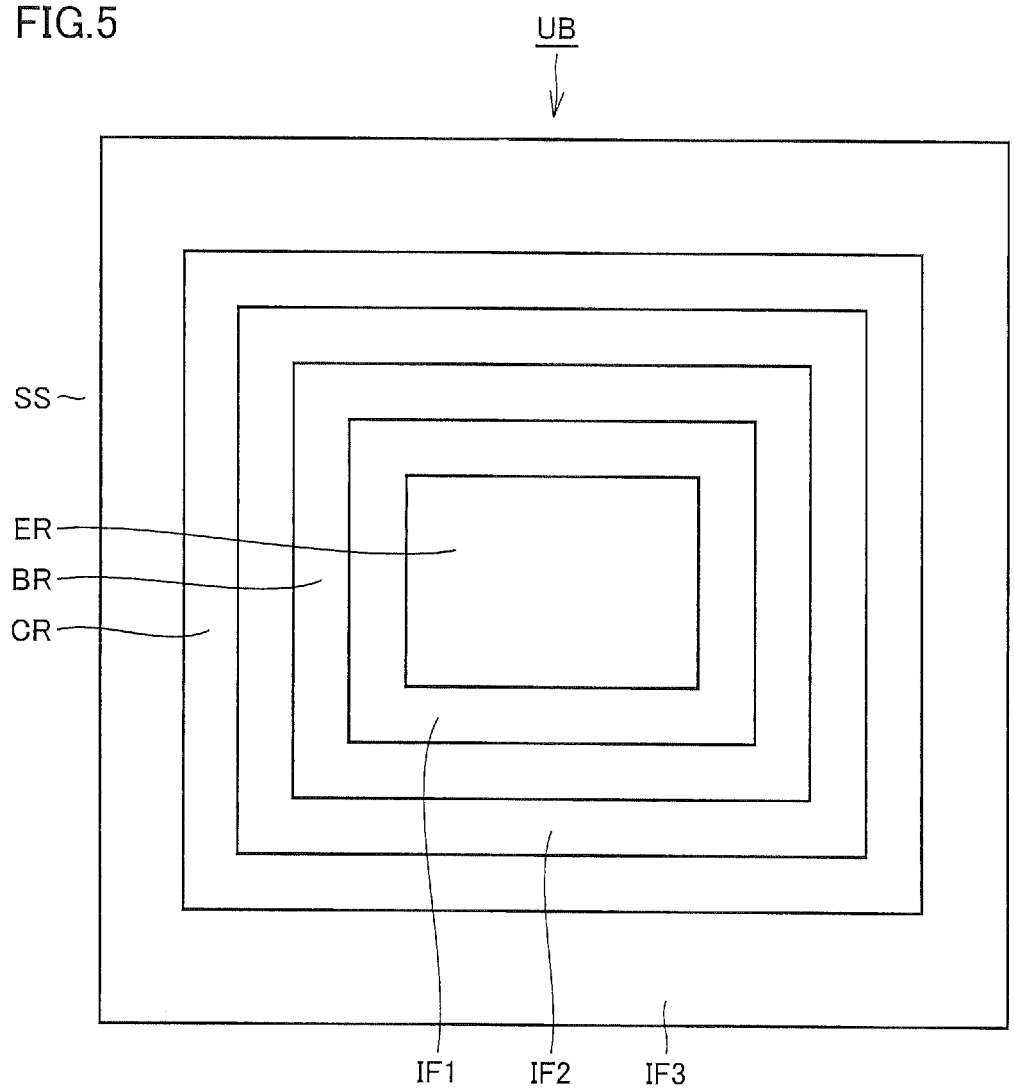
FIG. 5 is a plan view of a unit bipolar transistor UB.

FIG. 5 is a plan view of unit bipolar transistor UB. Unit bipolar transistor UB includes an emitter region ER, a base region BR and a collector region CR formed on the main surface of semiconductor substrate SS.

An isolation insulating film IF1 is formed between emitter region ER and base region BR, and an isolation insulating film IF2 having an STI structure is formed between base region BR and collector region CR. An isolation insulating film IF3 is formed around collector region CR. Isolation insulating film IF1 is positioned on the main surface of semiconductor substrate SS above a pn junction between emitter region ER and base region BR, and isolation insulating film IF2 is positioned on the main surface of semiconductor substrate SS above a pn junction between base region BR and collector region CR.

Isolation insulating film IF1 is formed on the main surface of semiconductor substrate SS to surround the periphery of emitter region ER, and base region BR is formed on the main surface to surround the periphery of isolation insulating film IF1. Isolation insulating film IF2 is formed on the main surface to surround the periphery of base region BR. Collector region CR is formed on the main surface to surround the periphery of isolation insulating film IF2. Isolation insulating film IF3 is formed on the main surface to surround the periphery of collector region CR.

Figure 6:
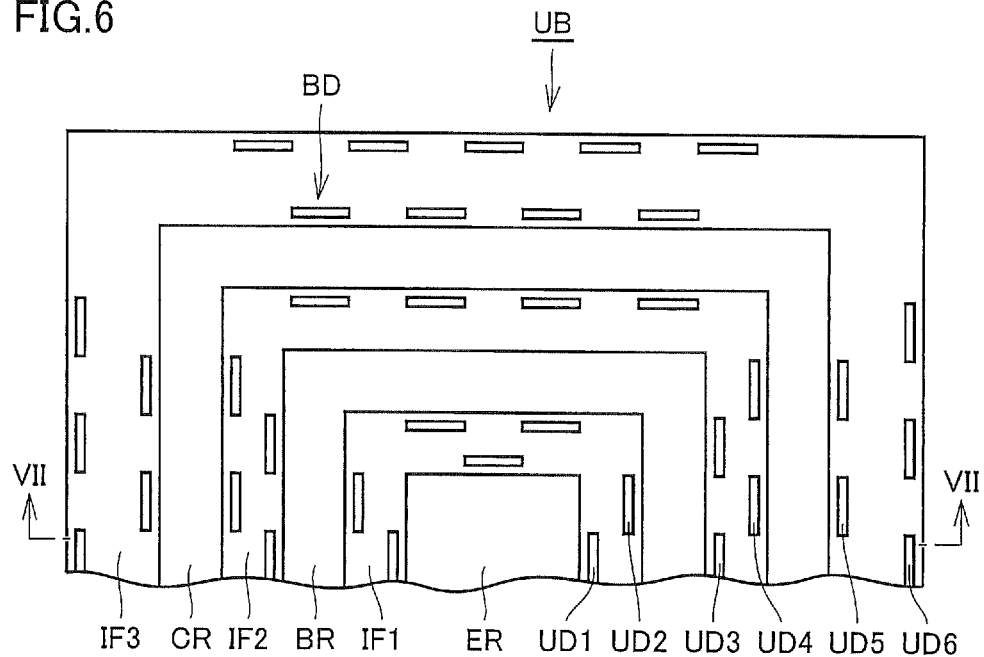
FIG. 6 is a plan view of an enlarged portion of unit bipolar transistor UB.

FIG. 6 is a plan view of an enlarged portion of unit bipolar transistor UB. As shown in FIG. 6, bipolar dummy electrode BD is formed on the upper surfaces of isolation insulating film IF1, isolation insulating film IF2 and isolation insulating film IF3. Bipolar dummy electrode BD is a dummy gate electrode, and has a laminated structure the same as that of a gate electrode of a MOS transistor TR1 and the like to be described later.

Bipolar dummy electrode BD includes a plurality of unit bipolar dummy electrodes UD1, UD2, UD3, UD4, UD5, UD6. Specifically, the plurality of unit bipolar dummy electrodes UD1 and the plurality of unit bipolar dummy electrodes UD2 are formed on the upper surface of isolation insulating film IF1.

The plurality of unit bipolar dummy electrodes UD1 are spaced from one another along an inner peripheral edge portion of isolation insulating film IF1. The plurality of unit bipolar dummy electrodes UD2 are spaced from one another along an outer peripheral edge portion of isolation insulating film IF1.

The plurality of unit bipolar dummy electrodes UD3 and the plurality of unit bipolar dummy electrodes UD4 are formed on the upper surface of isolation insulating film IF2. The plurality of unit bipolar dummy electrodes UD3 are spaced from one another along an inner peripheral edge portion of isolation insulating film IF2. The plurality of unit bipolar dummy electrodes UD4 are spaced from one another along an outer peripheral edge portion of isolation insulating film IF2.

The plurality of unit bipolar dummy electrodes UD5 are spaced from one another on the upper surface of isolation insulating film IF3, along an inner peripheral edge portion of isolation insulating film IF3. The plurality of unit bipolar dummy electrodes UD6 are spaced from one another on an outer side relative to unit bipolar dummy electrodes UD5.

All of unit bipolar dummy electrodes UD1 to UD6 are formed in the same shape, which is a rectangular shape when unit bipolar dummy electrodes UD1 to UD6 are viewed two-dimensionally from above. The length of a long side portion of each of unit bipolar dummy electrodes UD1 to UD6 is set to about 1.0 μm, and the width of each of unit bipolar dummy electrodes UD1 to UD6 is set to about 0.1 μm.

The space between unit bipolar dummy electrodes UD1 in a direction in which the isolation insulating films extend is set to about 1 μm, for example. Likewise, the space between adjacent ones of the other unit bipolar dummy electrodes is set to about 1 μm.

The distance between an outer peripheral edge portion of emitter region ER and unit bipolar dummy electrodes UD1 is set to about 0.15 μm, for example. Likewise, the distance between an inner peripheral edge portion of base region BR and unit bipolar dummy electrodes UD2, the distance between an outer peripheral edge portion of base region BR and unit bipolar dummy electrodes UD3, and the distance between an inner peripheral edge portion of collector region CR and unit bipolar dummy electrodes UD4 are set to about 0.15 μm.

Likewise, the distance between an outer peripheral edge portion of collector region CR and unit bipolar dummy electrodes UD5 is set to about 0.15 μm. Unit bipolar dummy electrodes UD1 to UD6 thus arranged are electrically independent from other elements, and are electrically floating. Unit bipolar dummy electrodes UD1 to UD6 are not used as circuits. Although unit bipolar dummy electrodes UD1 to UD6 may be fixed to some potential without electrically floating, they are not used as circuits.

A dummy active region is not provided on the lower surfaces of and around unit bipolar dummy electrodes UD1 to UD6. This is because a dummy active region would vary the characteristics of unit bipolar transistor UB. The dummy active region as used herein refers to an active region not used as a circuit.

The width of each of base region BR and collector region CR is set to about 1 μm, and the width of each of isolation insulating films IF1 to IF3 is also set to about 1 μm.

Figure 7:
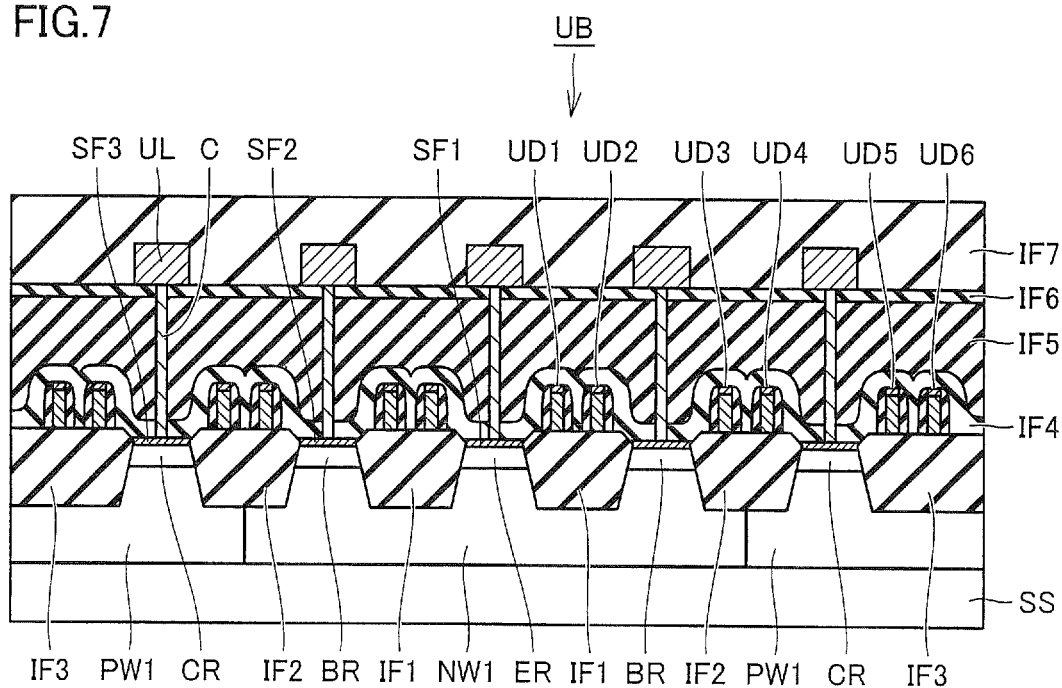
FIG. 7 is a cross-sectional view taken along the line VII-VII shown in FIG. 6.

FIG. 7 is a cross-sectional view taken along the line VII-VII shown in FIG. 6. As shown in FIG. 7, an N well NW1 and a P well PW1 are formed on semiconductor substrate SS. P well PW1 is formed to surround the periphery of N well NW1.

Isolation insulating film IF1, emitter region ER, base region BR and a part of isolation insulating film IF2 are formed on the upper surface of N well NW1, Emitter region ER is formed in an active region surrounded by isolation insulating film IF1, and base region BR is formed in an active region positioned between isolation insulating film IF1 and isolation insulating film IF2. Emitter region ER is formed by implanting boron fluoride ($BF_2$) at 10 keV (implantation energy) and $2 \times 10^{15}$ cm$^{-2}$ (implantation amount) into the main surface of semiconductor substrate SS, for example, and is a P type high concentration impurity region.

Base region BR is formed by implanting arsenic ($As^+$) ions at 20 keV (implantation energy) and $2 \times 10^{15}$ cm$^{-2}$ (implantation amount) into the main surface of semiconductor substrate SS, for example, and is an N type high concentration impurity region.

A part of isolation insulating film IF2, isolation insulating film IF3 and collector region CR are formed on the upper surface of P well PW1. N-well NW1. Collector region CR is formed in an active region positioned between isolation insulating film IF2 and isolation insulating film IF3. Collector region CR is formed by implanting boron fluoride ($BF_2$) at 10 keV (implantation energy) and $2\times10^{15}$ cm$^{-2}$ (implantation amount) into the main surface of semiconductor substrate SS, for example, and is a P type high concentration impurity region.

Emitter region ER and base region BR form a pn junction, and base region BR and collector region CR form a pn junction.

A silicide film SF1 such as cobalt silicide (CoSi) or nickel silicide (NiSi) is formed on the upper surface of emitter region ER. Likewise, a silicide film SF2 is formed on the upper surface of base region BR, and a silicide film SF3 is formed on the upper surface of collector region CR. Each of silicide film SF1, silicide film SF2 and silicide film SF3 has a thickness of about 20 nm.

Although a PNP bipolar transistor is employed as unit bipolar transistor UB by way of example in this embodiment, an NPN bipolar transistor may be employed as unit bipolar transistor UB.

An insulating film IF4 formed of a silicon nitride (SiN) film, for example, is formed on the main surface of semiconductor substrate SS. Insulating film IF4 is formed to cover the upper surfaces of isolation insulating films IF1 to IF3, unit bipolar dummy electrodes UD1 to UD6, and silicide films SF1 to SF3.

An interlayer insulating film IF5 formed of a silicon oxide ($SiO_2$) film, for example, is provided on the upper surface of insulating film IF4. An insulating film IF6 formed of a silicon oxynitride (SiON) film, for example, is provided on the upper surface of interlayer insulating film IF5.

A plurality of contact holes are formed in insulating film IF6, interlayer insulating film IF5 and insulating film IF4, with a connection member C formed in each contact hole. Each connection member C includes a barrier metal formed on the inner periphery of the contact hole, and a plug formed on the barrier metal. The barrier metal is made of titanium nitride (TiN), for example, and the plug is made of tungsten (W), for example. Connection members C are connected to the upper surface of silicide film SF1, the upper surface of silicide film SF2 and the upper surface of silicide film SF3, respectively.

A plurality of upper layer wires UL are formed on the upper surface of insulating film IF6, with silicide film SF1, silicide film SF2 and silicide film SF3 connected to upper layer wires UL via connection members C. Upper layer wires UL are made of copper (Cu), for example.

An insulating film IF7 is formed on the upper surface of insulating film IF6 to cover upper layer wires UL. Insulating film IF7 is formed of a carbon-containing silicon oxide film (SiOC film), for example.

Figure 8:
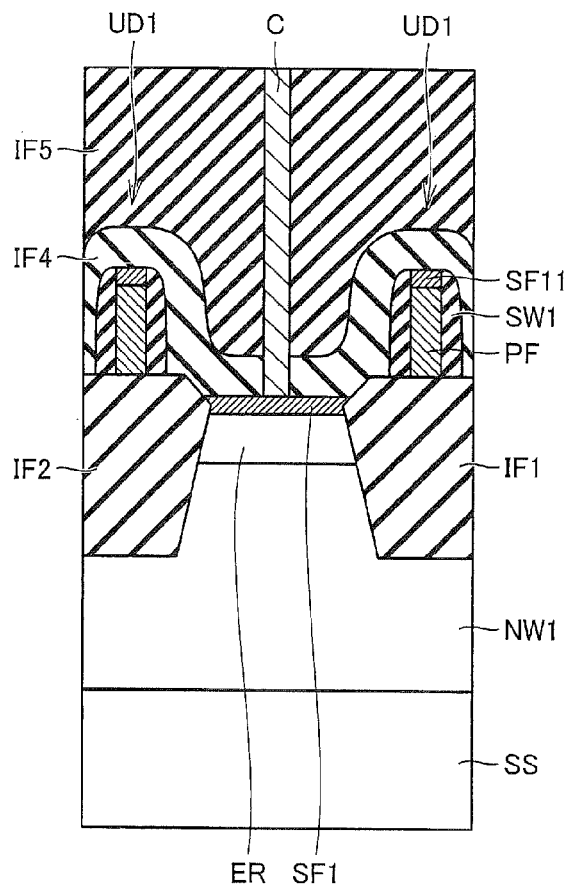
FIG. 8 is a cross-sectional view of an enlarged portion of FIG. 7, which illustrates an emitter region ER and its surrounding structure.

FIG. 8 is a cross-sectional view of an enlarged portion of FIG. 7, which illustrates emitter region ER and its surrounding structure. As shown in FIG. 8, unit bipolar dummy electrode UD1 includes a polysilicon film PF formed on the upper surface of isolation insulating film IF1, a silicide film SF11 formed on polysilicon film PF, and a sidewall SW1 formed on the side surfaces of polysilicon film PF and silicide film SF11. Sidewall SW1 is formed of a silicon nitride (SiN) film. Silicide film SF11 has a thickness of about 20 nm.

Figure 9:
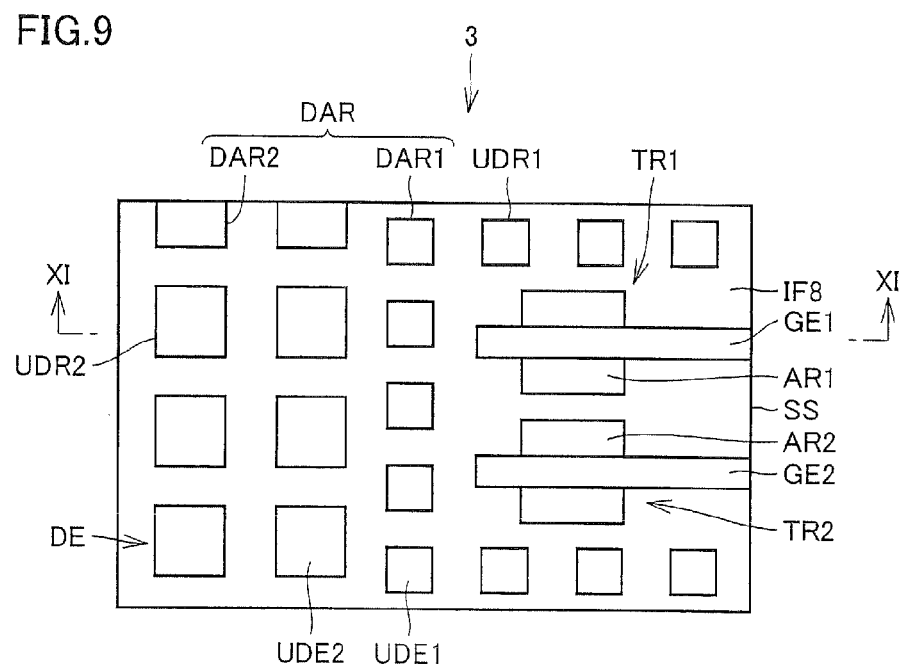
FIG. 9 is a plan view showing a RAM 3 shown in FIG. 1.

FIG. 9 is a plan view showing a part of RAM 3 shown in FIG. 1. In FIG. 9, a MOS transistor TR1 (first insulated gate field effect transistor) and a MOS transistor TR2 (second insulated gate field effect transistor) are provided on the main surface of semiconductor substrate SS in a portion where RAM 3 is located. For example, MOS transistors TR1, TR2 form a part of the SRAM provided on RAM 3. By employing MOS transistors TR1, TR2 having a silicide film for RAM 3, wiring resistance of RAM 3 is reduced.

An isolation insulating film IF8 is formed on the main surface of semiconductor substrate SS. Isolation insulating film IF8 separates active regions AR1, AR2 from a dummy active region DAR on the main surface of semiconductor substrate SS. A dummy electrode DE is formed on the upper surface of dummy active region DAR.

Dummy active region DAR is formed on the main surface of semiconductor substrate SS around MOS transistors TR1, TR2.

Dummy active region DAR includes a first dummy active region DAR1 provided adjacent to MOS transistors TR1, TR2, and a second dummy active region DAR2 provided opposite to MOS transistors TR1, TR2 relative to first dummy active region DAR1, on the main surface of semiconductor substrate SS.

First dummy active region DAR1 is formed of a plurality of unit dummy active regions UDR1 which are spaced equidistant from one another and are arranged with an equal pitch from one another. Second dummy active region DAR2 is formed of unit dummy active regions UDR2 which are spaced equidistant from one another and are arranged with an equal pitch from one another. The area of an upper surface (plane area) of each of unit dummy active regions UDR2, and the space between and the pitch of unit dummy active regions UDR2 are larger than the area of an upper surface (plane area) of each of unit dummy active regions UDR1, the space between and the pitch of unit dummy active regions UDR1, respectively.

A dummy electrode DE includes unit dummy electrodes UDE1 formed on the upper surfaces of unit dummy active regions UDR1, and unit dummy electrodes UDE2 formed on the upper surfaces of unit dummy active regions UDR2. Unit dummy electrodes UDE1 may be formed in at least some of the plurality of first dummy active regions DAR1, and unit dummy electrodes UDE2 may likewise be formed on the upper surfaces of some of the plurality of second dummy active regions DAR2. Although dummy electrode DE and dummy active region DAR are arranged to be completely placed on each other when viewed two-dimensionally in the example shown in FIG. 9, the present invention is not limited to such an arrangement.

As shown in FIG. 9, when unit dummy electrodes UDE1 and unit dummy electrodes UDE2 are viewed two-dimensionally from above, the area of an upper surface (plane area) of each of unit dummy electrodes UDE1 is smaller than the area of an upper surface (plane area) of each of unit dummy electrodes UDE2. In addition, the space between adjacent unit dummy electrodes UDE1 is smaller than the space between adjacent unit dummy electrodes UDE2.

That is, on the main surface of semiconductor substrate SS, the small unit dummy electrodes are arranged with a small pitch in a portion adjacent to MOS transistors TR1, TR2, and the large unit dummy electrodes are arranged with a large pitch in a portion distant from MOS transistors TR1, TR2.

Dummy electrode DE exists in order to, when processing the gate electrodes of transistors actually used such as MOS transistors TR1 and TR2, improve processing accuracy by matching the occupancy of the gate electrodes on the entire chip with the occupancy of the gate electrodes in the vicinity of the transistors actually used. For example, by bringing the occupancy of the gate electrodes in the vicinity of gate electrodes GE1, GE2 and its surroundings closer to the occupancy of the gate electrodes on the entire chip, a variation in etchant can be suppressed when forming the gate electrodes by patterning polysilicon or the like, thereby etching the gate electrodes well.

Dummy active region DAR exists in order to, when processing an element isolation region, avoid damage to the active regions of the transistors actually used such as transistors TR1 and TR2. The details will be discussed in the description of a manufacturing method to be described later.

There are both large and small patterns of dummy electrode DE and dummy active region DAR. The small dummy pattern exists to further improve processing accuracy and reduce damage by being arranged in a gap where the large dummy pattern cannot fit. The dummy patterns are arranged with an automatic placement tool. If there is only the small dummy pattern, a load on the automatic placement tool increases to affect operation of designing the semiconductor device. The large dummy pattern exists to address this problem.

Dummy electrode DE and dummy active region DAR are not used as circuits. Although dummy electrode DE and dummy active region DAR may be fixed to some potential without electrically floating, they are not used as circuits.

Figure 10:
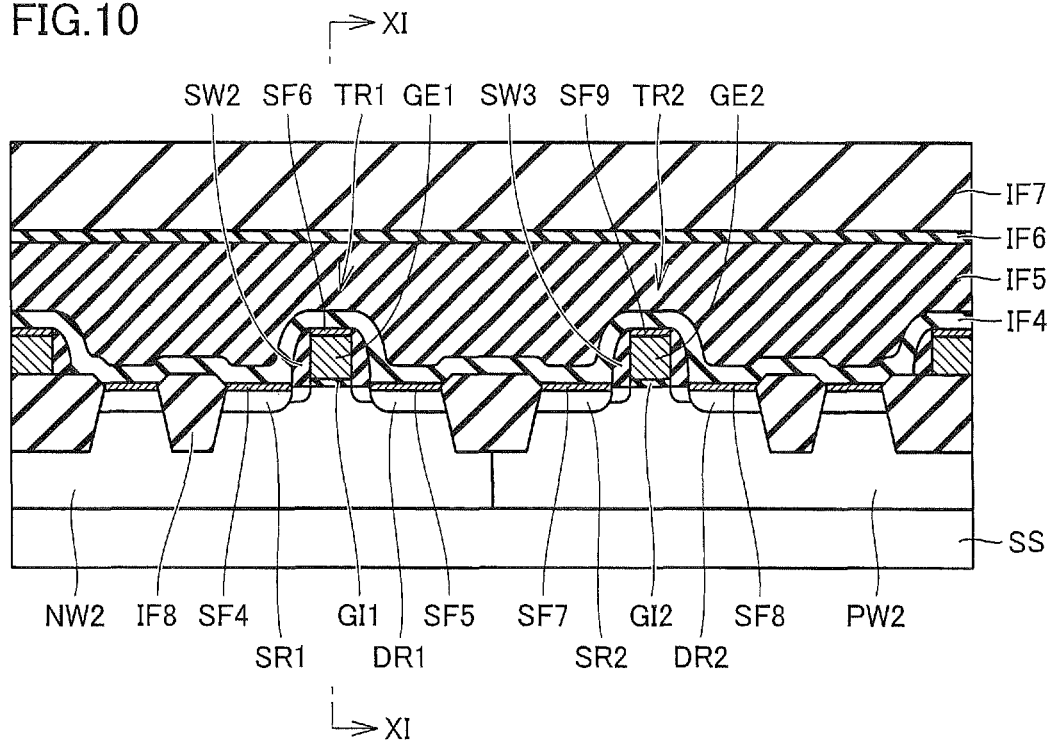
FIG. 10 is a cross-sectional view of a MOS transistor TR1 and a MOS transistor TR2.

FIG. 10 is a cross-sectional view of MOS transistor TR1 and MOS transistor TR2. As shown in FIG. 10, MOS transistor TR1 is fanned on the upper surface of an N well NW2. MOS transistor TR1 includes a gate insulating film GI1 formed on an active region, a gate electrode GE1 formed on gate insulating film GI1, a source region SR1 formed adjacent to gate electrode GE1, and a drain region DR1 formed opposite to source region SR1 relative to gate electrode GE1.

Source region SR1 includes a P type low concentration impurity region and a P type high concentration impurity region. Drain region DR1 includes a P type low concentration impurity region and a P type high concentration impurity region. Gate electrode GE1 is formed of a polysilicon film containing an impurity.

A silicide film SF4 such as cobalt silicide (CoSi) or nickel silicide (NiSi) is formed on the upper surface of source region SR1, and a silicide film SF5 such as cobalt silicide (CoSi) or nickel silicide (NiSi) is formed on the upper surface of drain region DR1. A silicide film SF6 is formed on the upper surface of gate electrode GE1, and a sidewall SW2 such as a silicon nitride (SiN) film is formed on the side surfaces of gate electrode GE1.

MOS transistor TR2 is formed on the upper surface of a P well PW2. MOS transistor TR2 includes a gate insulating film GI2 formed on the upper surface of an active region, a gate electrode GE2 formed on the upper surface of gate insulating film GI2, a source region SR2 formed adjacent to gate electrode GE2, and a drain region DR2 formed opposite to source region SR2 relative to gate electrode GE2.

Source region SR2 includes an N type low concentration impurity region and an N type high concentration impurity region. Drain region DR2 includes an N type low concentration impurity region and an N type high concentration impurity region. Gate electrode GE2 is formed of a polysilicon film containing an impurity.

A silicide film SF7 such as cobalt silicide (CoSi) or nickel silicide (NiSi) is formed on the upper surface of source region SR2, and a silicide film SF8 such as cobalt silicide (CoSi) or nickel silicide (NiSi) is formed on the upper surface of drain region DR2. A silicide film SF9 such as cobalt silicide (CoSi) or nickel silicide (NiSi) is formed on the upper surface of gate electrode GE2. A sidewall SW3 is formed on the side surfaces of gate electrode GE2.

As such, in MOS transistors TR1, TR2, the silicide films are formed on the upper surfaces of the gate electrodes, the source regions and the drain regions in order to reduce resistance in the regions. A MOS transistor having silicide films formed on the upper surfaces of a gate electrode, a source region and a drain region as with MOS transistors TR1, TR2 is provided not only in RAM 3 shown in FIG. 1, but also in a logic circuit such as CPU 2. By employing an element with reduced wiring resistance such as MOS transistors TR1, TR2 for a frequently driven logic circuit such as CPU 2, power savings can be achieved. Each of unit bipolar dummy electrodes UD1, UD2, UD3, UD4, UD5, UD6 shown in FIG. 6 has a laminated structure the same as that of gate electrode GE1, silicide film SF6 and sidewall SW2.

Figure 11:
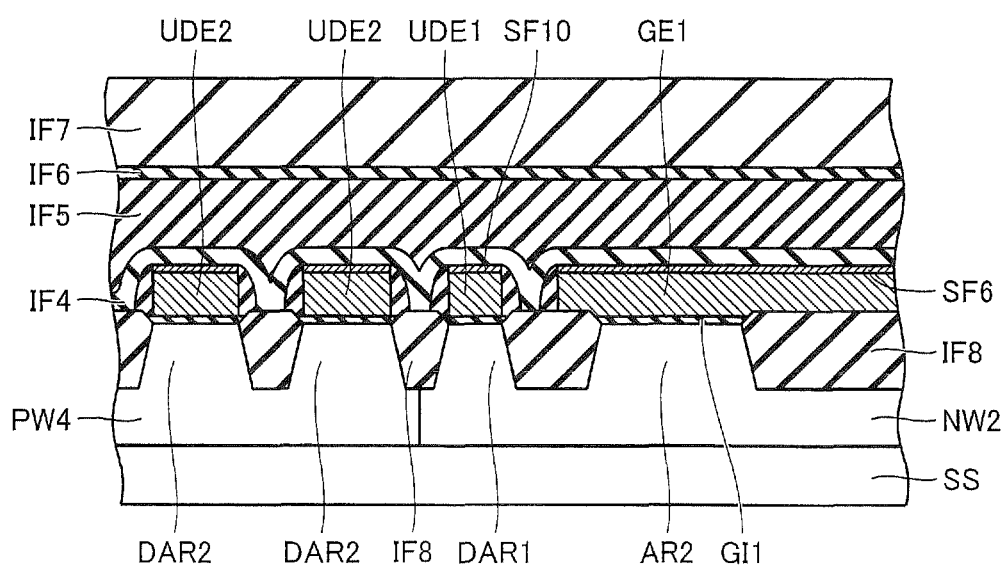

FIG. 11 is a cross-sectional view taken along the line XI-XI shown in FIGS. 9 and 10, which illustrates gate electrode GE1 and the like. As shown in FIG. 11, isolation insulating film IF8 is formed on the main surface of semiconductor substrate SS. Isolation insulating film IF8 forms active region AR2, first dummy active region DAR1 and second dummy active region DAR2 on the main surface of semiconductor substrate SS.

Gate insulating film GI1 is formed on active region AR2, and gate electrode GE1 is formed on gate insulating film GI1.

A silicon oxide film is formed on the upper surface of first dummy active region DAR1, on which unit dummy electrode UDE1 is formed. Likewise, a silicon oxide film is formed on second dummy active region DAR2, on which unit dummy electrode UDE2 is formed. A silicide film SF10 is formed on the upper surfaces of unit dummy electrode UDE1 and unit dummy electrode UDE2. A sidewall is formed on the side surfaces of each of unit dummy electrode UDE1 and unit dummy electrode UDE2.

As shown in FIG. 11, N well NW2 and a P well PW4 form a pn junction, and isolation insulating film IF8 formed above the junction between N well NW2 and P well PW4.

Figure 12:
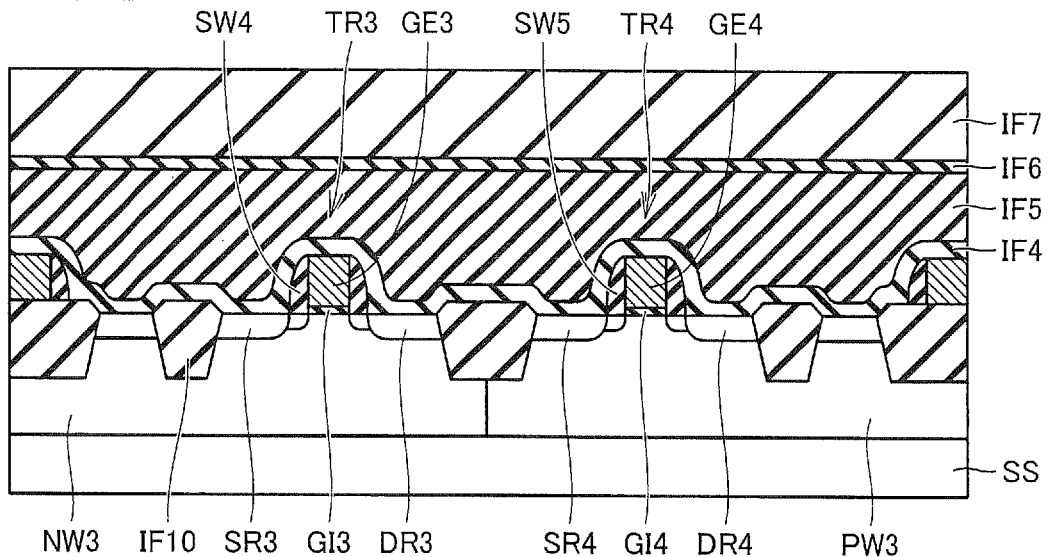
FIG. 12 is a cross-sectional view showing a MOS transistor TR3 and a MOS transistor TR4 provided in an input/output circuit 9 shown in FIG. 1.

FIG. 12 is a cross-sectional view showing a MOS transistor TR3 (third insulated gate field effect transistor) and a MOS transistor TR4 (fourth insulated gate field effect transistor) provided in input/output circuit 9 shown in FIG. 1. As shown in FIG. 12, MOS transistor TR3 is formed on the upper surface of an N well NW3. MOS transistor TR3 includes a gate insulating film GI3 formed on the main surface of semiconductor substrate SS, a gate electrode GE3 formed on the upper surface of gate insulating film GI3, a source region SR3 adjacent to gate electrode GE3, and a drain region DR3 formed opposite to source region SR3 relative to gate electrode GE3. A silicide film is not formed on source region SR3, drain region DR3 and gate electrode GE3. A sidewall SW4 is formed on the side surfaces of gate electrode GE3.

MOS transistor TR4 is formed on the upper surface of a P well PW3. MOS transistor TR4 includes a gate insulating film GI4 formed on the upper surface of a source region SR4, a gate electrode GE4 formed on the upper surface of gate insulating film GI4, a source region SR4 adjacent to gate electrode GE4, and a drain region DR4 formed opposite to source region SR4 relative to gate electrode GE4. A silicide film is not formed on source region SR4, drain region DR4 and gate electrode GE4. A sidewall SW5 is formed on the side surfaces of gate electrode GE4.

MOS transistor TR3 and MOS transistor TR4 may be provided not only in input/output circuit 9 shown in FIG. 1, but also in reference voltage generation circuit 28. Furthermore, MOS transistors TR3, TR4 are also applicable to A-D converter 13, D-A converter 14, power-on reset circuit 15, and power supply circuit 34.

Figure 13:
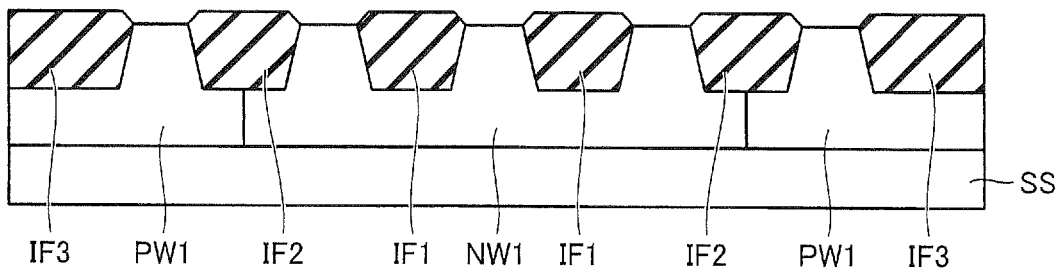
FIG. 13 is a cross-sectional view of a position corresponding to FIG. 7, which illustrates a first step of manufacturing semiconductor device 1.
Figure 14:
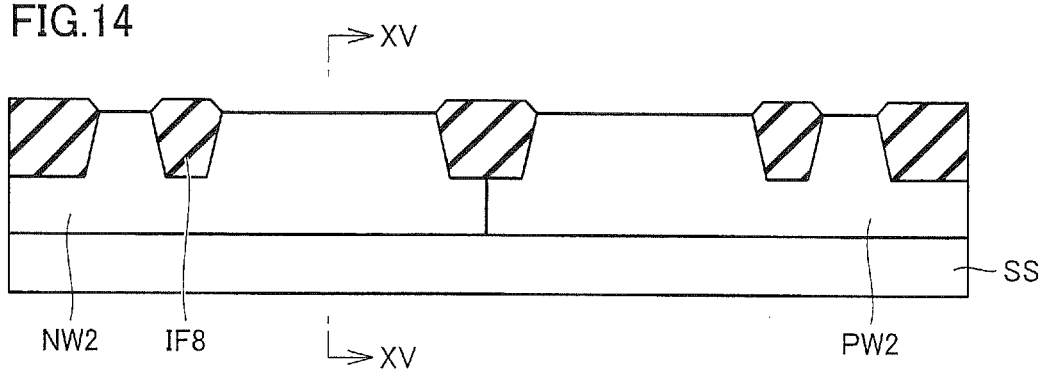
FIG. 14 is a cross-sectional view of a position corresponding to FIG. 10, which illustrates the first step of manufacturing semiconductor device 1.
Figure 15:
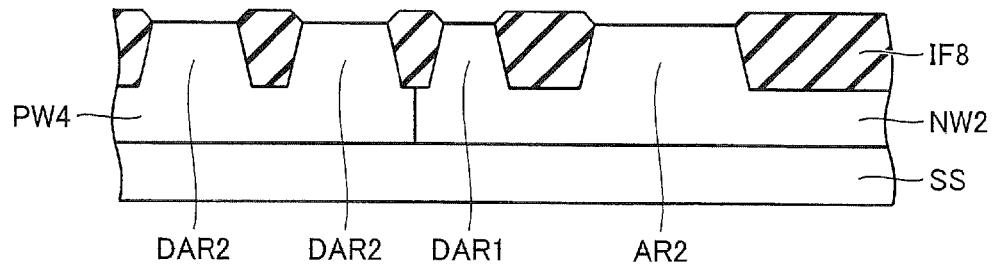
FIG. 15 is a cross-sectional view of a position corresponding to FIG. 11, which illustrates the first step of manufacturing semiconductor device 1.
Figure 16:
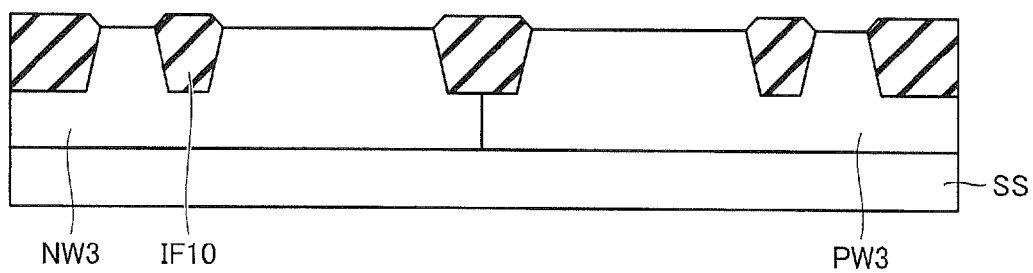
FIG. 16 is a cross-sectional view of a position corresponding to FIG. 12, which illustrates the first step of manufacturing semiconductor device 1.
Figure 17:
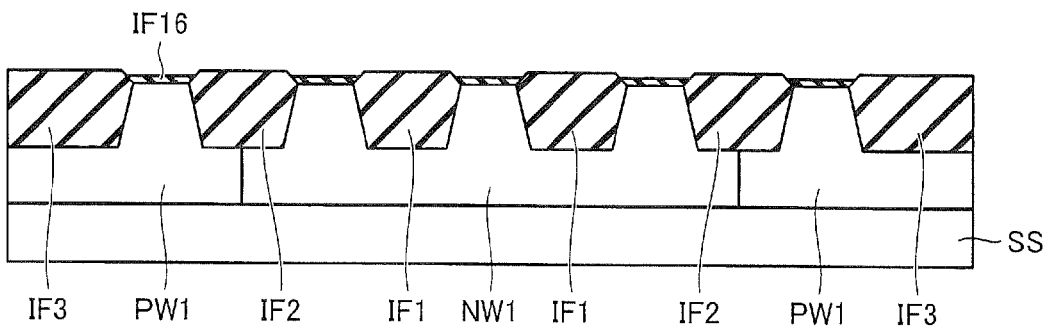
FIG. 17 is a cross-sectional view showing a manufacturing step subsequent to the manufacturing step shown in FIG. 13.
Figure 18:
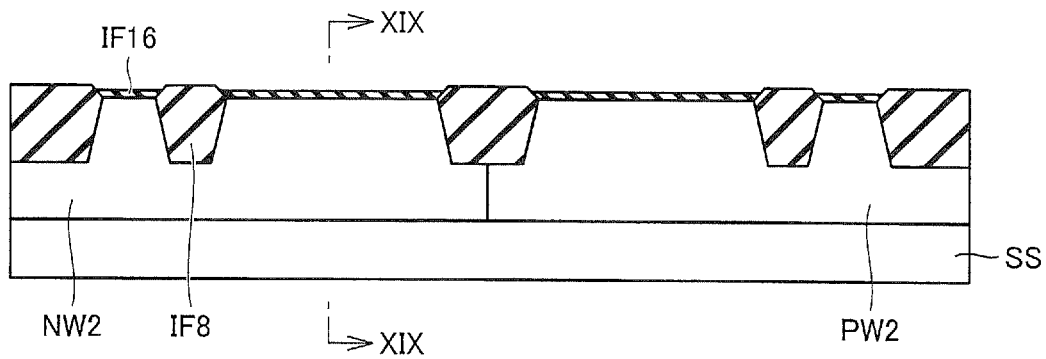
FIG. 18 is a cross-sectional view showing a manufacturing step subsequent to the manufacturing step shown in FIG. 14.
Figure 19:
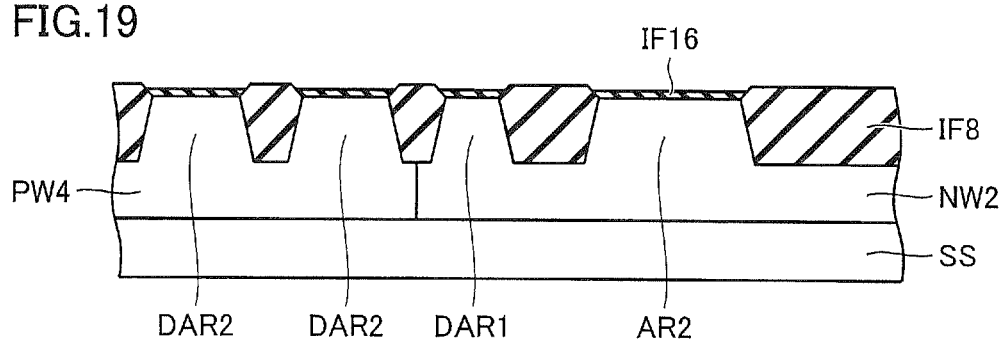
FIG. 19 is a cross-sectional view showing a manufacturing step subsequent to the manufacturing step shown in FIG. 15.
Figure 20:
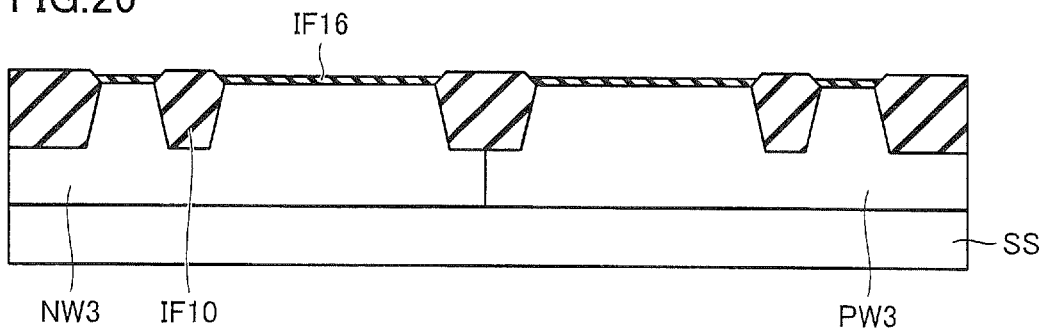
FIG. 20 is a cross-sectional view showing a manufacturing step subsequent to the manufacturing step shown in FIG. 16.
Figure 74:
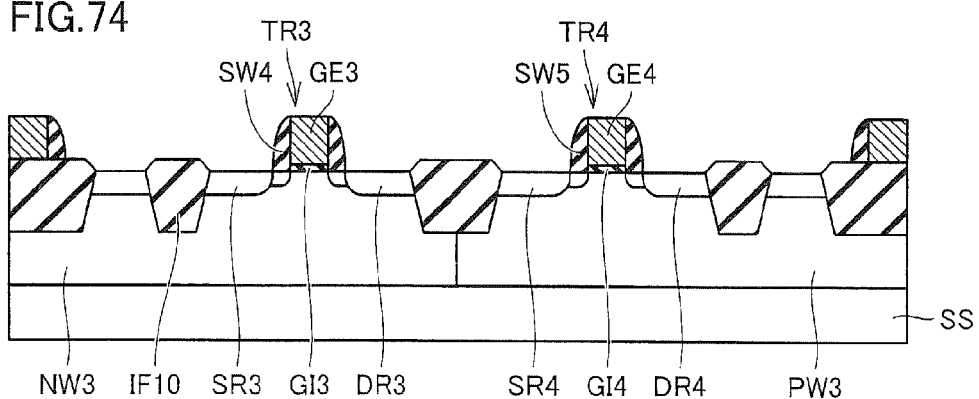
FIG. 74 is a cross-sectional view showing a manufacturing step subsequent to the manufacturing step shown in FIG. 70.

Referring to FIGS. 13 to 74, a method of manufacturing semiconductor device 1 according to the first embodiment will be described. FIG. 13 is a cross-sectional view of a position corresponding to FIG. 7, which illustrates a first step of manufacturing semiconductor device 1. FIG. 14 is a cross-sectional view of a position corresponding to FIG. 10, which illustrates the first step of manufacturing semiconductor device 1. FIG. 15 is a cross-sectional view of a position corresponding to FIG. 11, which illustrates the first step of manufacturing semiconductor device 1. FIG. 16 is a cross-sectional view of a position corresponding to FIG. 12, which illustrates the first step of manufacturing semiconductor device 1.

As shown in FIGS. 13 to 16, semiconductor substrate SS having a main surface is prepared. First, an underlying oxide film and a silicon nitride film are successively laminated on the main surface of semiconductor substrate SS, and then a mask is formed on the silicon nitride film. The silicon nitride film and the underlying oxide film are successively patterned to form a groove in the main surface of semiconductor substrate SS. Then, a thermal oxide film is formed on the inner wall of the groove by thermal oxidation, and then an oxide is deposited on the entire surface by CVD (Chemical Vapor Deposition). Next, the oxide that has been formed on the silicon nitride film is removed by CMP (Chemical Mechanical Polishing) with the silicon nitride film as a stopper, to leave the oxide only in the groove. Next, the silicon nitride film is removed with a hot phosphoric acid solution, and then the underlying oxide film is removed with hydrofluoric acid. As a result, isolation insulating films IF1, IF2, IF3 shown in FIG. 13, isolation insulating film IF8 shown in FIGS. 14 and 15, and an isolation insulating film IF10 shown in FIG. 16 FIG. 15 are formed.

In FIG. 15, first dummy active region DAR1 and second dummy active region DAR2 are provided around active region AR2. In the above step of removing the underlying oxide film, hydrofluoric acid reacts not only with the underlying oxide film positioned above active region AR2, but also with the underlying oxide film formed on the upper surfaces of first dummy active region DAR1 and second dummy active region DAR2. As such, intensive reaction of the hydrofluoric acid with the underlying oxide film positioned on active region AR2 can be suppressed, to suppress damage to active region AR2 after removal of the underlying oxide film positioned on active region AR2. Furthermore, first dummy active region DAR1 and second dummy active region DAR2 suppress excessive removal of the silicon nitride film formed on active region AR2 actually used as a circuit by CMP when forming the isolation insulating film, which would vary the characteristics of the transistor formed in this active region.

Subsequently, a P type impurity is introduced into the active region to form P well PW1, P well PW2, P well PW3 and P well PW4, and an N type impurity is introduced into the active region to form N well NW1, N well NW2 and N well NW3.

In FIG. 15, the regions where N well NW2 and P well PW4 are formed are separated by isolation insulating film IF8, so that the impurities can be readily implanted separately to suppress mixing of the impurities.

Next, as shown in FIGS. 17 to 20, the main surface of semiconductor substrate SS is oxidized by lamp oxidation, for example, to form an oxidized insulating film IF16. Oxidized insulating film IF16 has a thickness of about 7.5 nm, for example.

Figure 21:
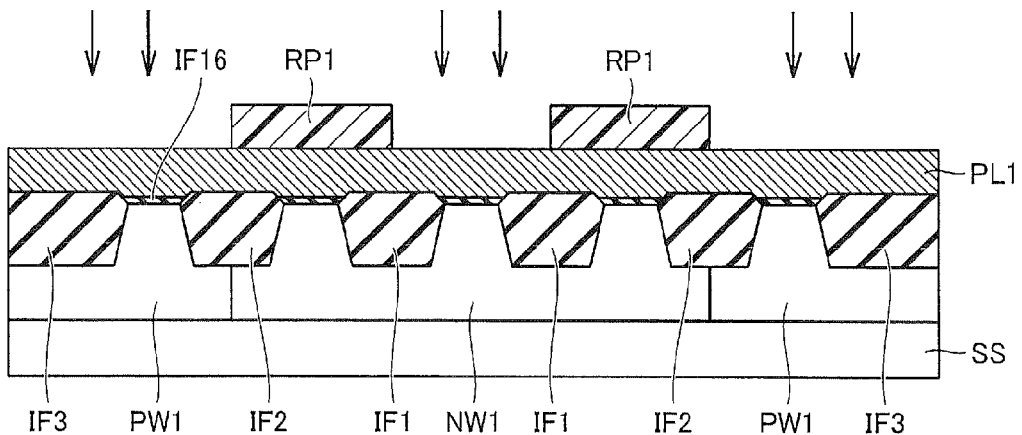
FIG. 21 is a cross-sectional view showing a manufacturing step subsequent to the manufacturing step shown in FIG. 17.

Next, as shown in FIG. 21, a polysilicon film PL1 is framed on the main surface of semiconductor substrate SS by CVD, for example. Polysilicon film PL1 has a thickness of about 130 nm, for example.

Then, a photoresist film is formed on polysilicon film PL1 and patterned, to form a resist pattern film RP1. Portions of polysilicon film PL1 that are positioned above a portion which will be an emitter region, and positioned above a portion which will be a collector region are exposed to the outside through resist pattern film RP1. Then, $BF^{2+}$ is implanted at 10 keV and $2\times10^{15}$ $cm^{-2}$ into the portions of polysilicon film PL1 that are exposed through resist pattern film RP1. Resist pattern film RP1 is then removed.

Figure 22:
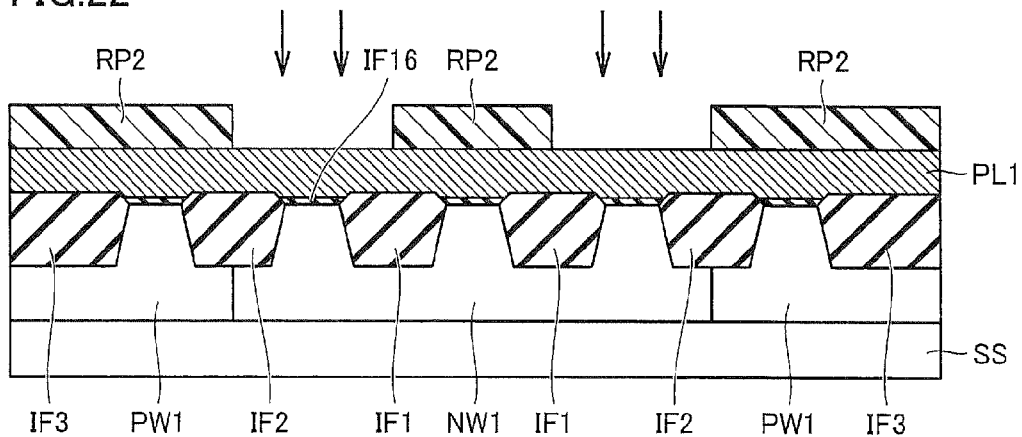
FIG. 22 is a cross-sectional view showing a manufacturing step subsequent to the manufacturing step shown in FIG. 21.
Figure 23:
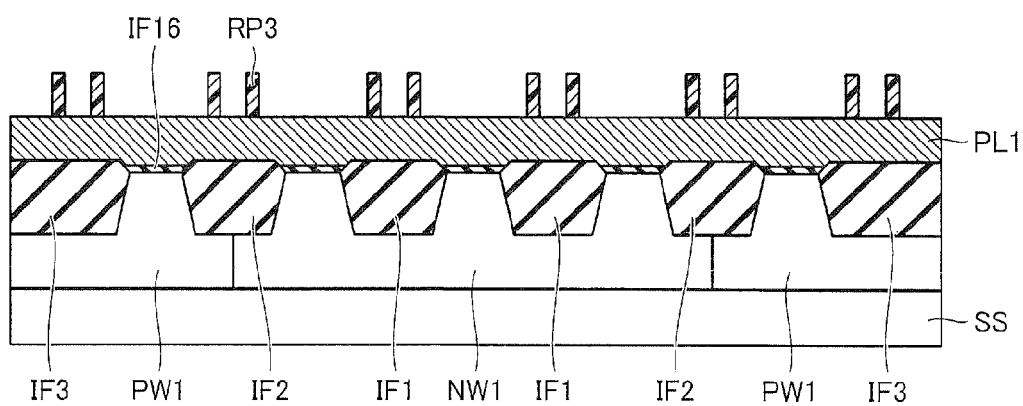
FIG. 23 is a cross-sectional view showing a manufacturing step subsequent to the manufacturing step shown in FIG. 22.
Figure 24:
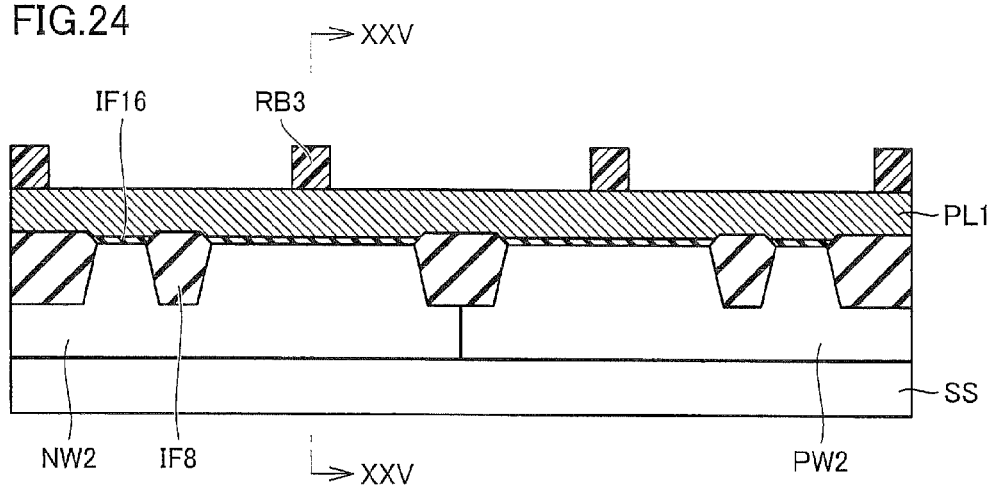
FIG. 24 is a cross-sectional view showing a manufacturing step subsequent to the manufacturing step shown in FIG. 22.
Figure 25:
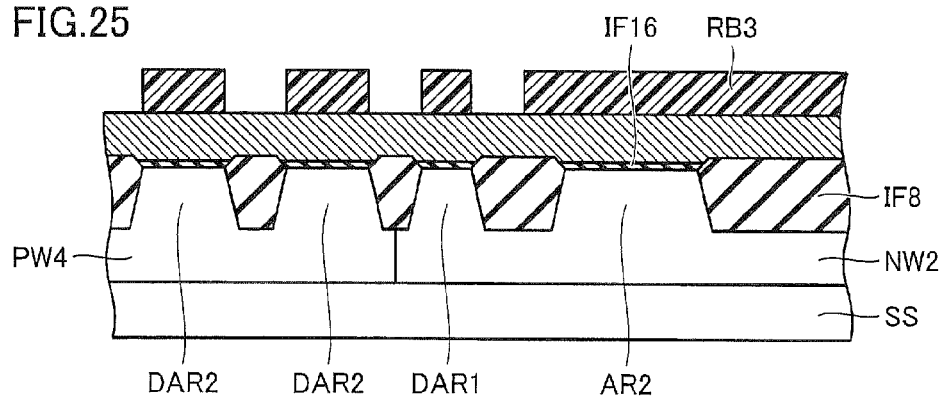
FIG. 25 is a cross-sectional view showing a manufacturing step subsequent to the manufacturing step shown in FIG. 22.
Figure 26:
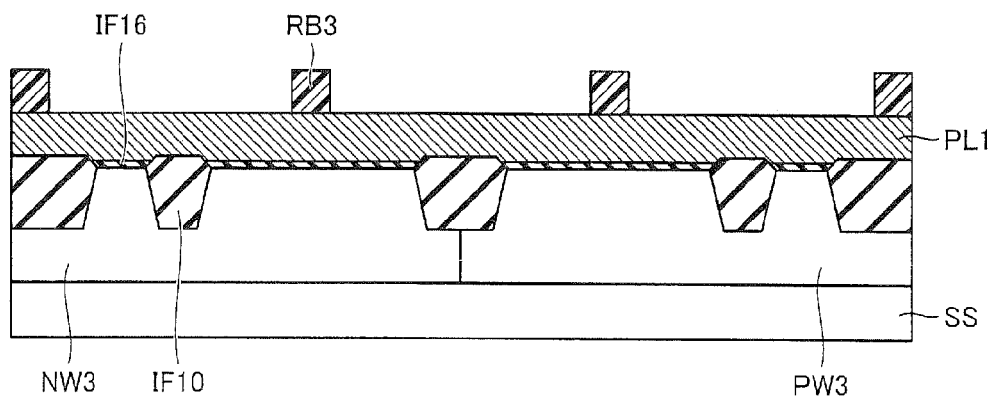
FIG. 26 is a cross-sectional view showing a manufacturing step subsequent to the manufacturing step shown in FIG. 22.
Figure 27:
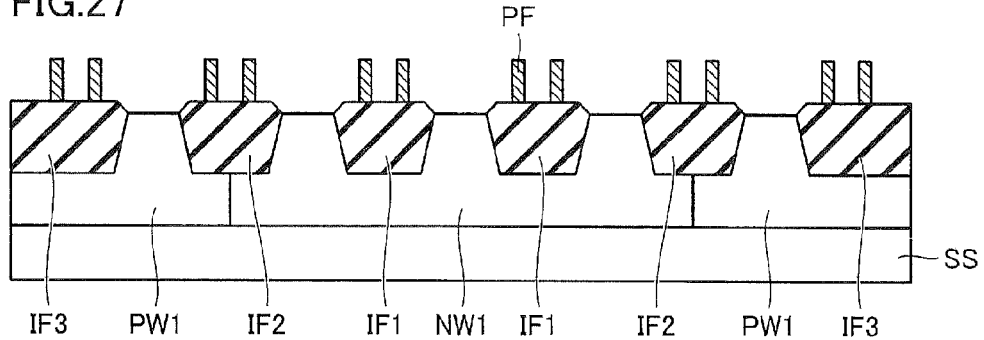
FIG. 27 is a cross-sectional view showing a manufacturing step subsequent to the manufacturing step shown in FIG. 23.

Next, as shown in FIG. 22, a resist pattern film RP2 is formed on the upper surface of polysilicon film PL1. Portions of polysilicon film PL1 that are positioned above a portion which will be a base region are exposed through resist pattern film RP2. Then, $As^+$ ions are implanted at 20 keV and $2\times10^{15}$ $cm^{-2}$ into the portions of the upper surface of polysilicon film PL1 that are exposed through resist pattern film RP2.

Next, as shown in FIGS. 23 to 26, a resist pattern film RP3 is formed on the upper surface of polysilicon film PL1.

Next, as shown in FIGS. 27 to 30, polysilicon film PL1 is patterned to form a plurality of polysilicon films PF on the upper surfaces of isolation insulating films IF1 to IF3.

Figure 28:
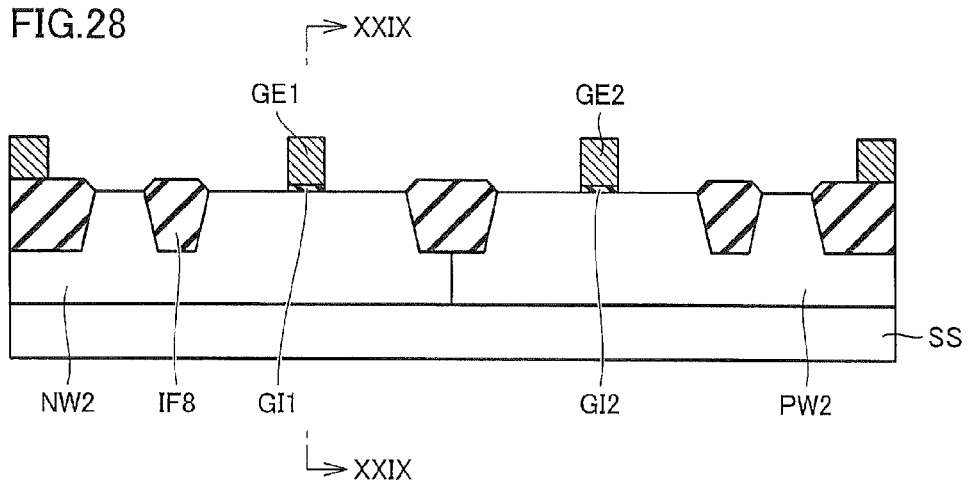
FIG. 28 is a cross-sectional view showing a manufacturing step subsequent to the manufacturing step shown in FIG. 24.

Here, as shown in FIG. 28, gate electrode GE1 and gate electrode GE2 are formed. The patterning of polysilicon film PL1 removes a part of oxidized insulating film IF16, and gate insulating films GI1, GI2 remain under gate electrode GE1 and gate electrode GE2, respectively.

Figure 29:
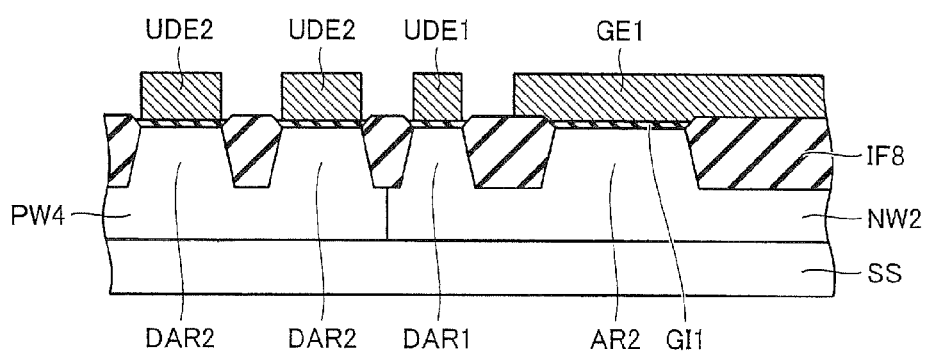
FIG. 29 is a cross-sectional view showing a manufacturing step subsequent to the manufacturing step shown in FIG. 25.

As shown in FIG. 29, the silicon oxide film remains on the upper surface of first dummy active region DART, and unit dummy electrode UDE1 is formed on this silicon oxide film. Likewise, the silicon oxide film remains on the upper surface of second dummy active region DAR2, and unit dummy electrode UDE2 is formed on the upper surface of this silicon oxide film.

Figure 30:
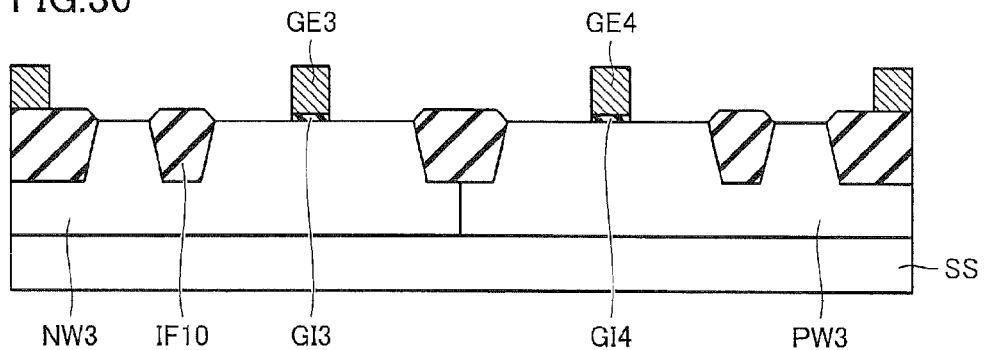
FIG. 30 is a cross-sectional view showing a manufacturing step subsequent to the manufacturing step shown in FIG. 26.

Then, as shown in FIG. 30, gate insulating film GI3 remains on the upper surface of N well NW3, and gate electrode GE3 is formed on the upper surface of gate insulating film GI3. Gate insulating film GI4 remains on the upper surface of P well PW3, and gate electrode GE4 is formed on the upper surface of gate insulating film GI4.

Figure 31:
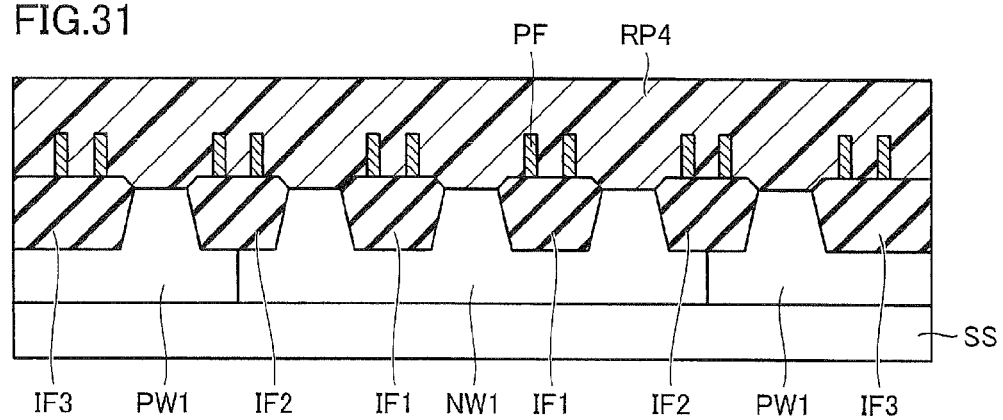
FIG. 31 is a cross-sectional view showing a manufacturing step subsequent to the manufacturing step shown in FIG. 27.
Figure 32:
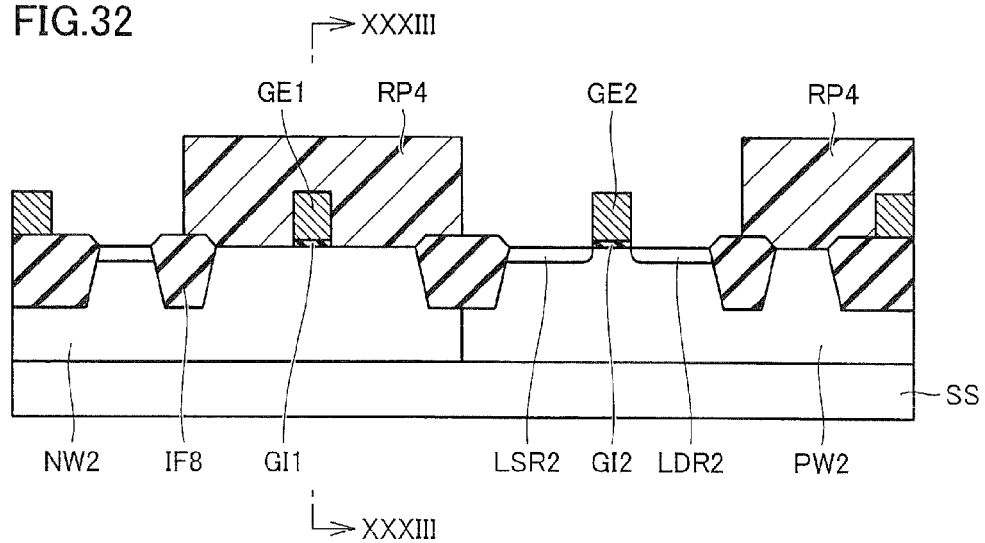
FIG. 32 is a cross-sectional view showing a manufacturing step subsequent to the manufacturing step shown in FIG. 28.
Figure 33:
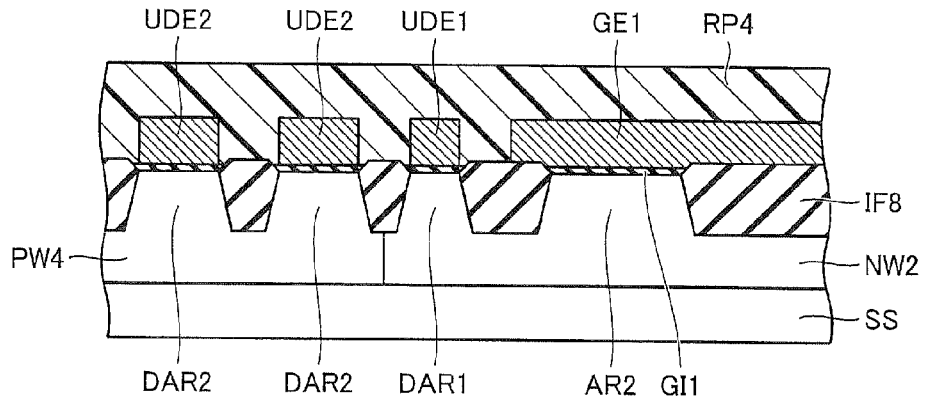
FIG. 33 is a cross-sectional view showing a manufacturing step subsequent to the manufacturing step shown in FIG. 29.
Figure 34:
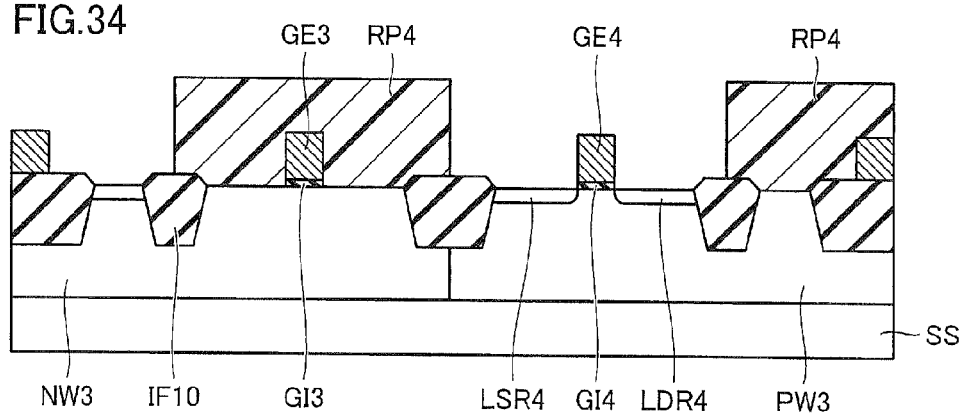
FIG. 34 is a cross-sectional view showing a manufacturing step subsequent to the manufacturing step shown in FIG. 30.

Next, as shown in FIGS. 31 to 34, a photoresist film is formed on the main surface of semiconductor substrate SS and patterned, to form a resist pattern film RP4. As shown in FIG. 31, resist pattern film RP4 covers a region of the main surface of semiconductor substrate SS where a bipolar transistor is formed, and further covers a region where MOS transistor TR1 and MOS transistor TR3 are formed as shown in FIGS. 32 and 34.

On the other hand, a region of the main surface of semiconductor substrate SS where MOS transistor TR2 and MOS transistor TR4 are formed are exposed through resist pattern film RP4.

Then, an N type impurity is introduced into the main surface of semiconductor substrate SS exposed through resist pattern film RP4, with resist pattern film RP4, gate electrode GE2 and gate electrode GE4 as a mask.

Consequently, as shown in FIG. 32, a low concentration source region LSR2 and a low concentration drain region LDR2 are formed adjacent to gate electrode GE2. Likewise, as shown in FIG. 34, a low concentration source region LSR4 and a low concentration drain region LDR4 are formed adjacent to gate electrode GE4. Resist pattern film RP4 is then removed.

Next, as shown in FIGS. 35 to 38, a photoresist film is formed and patterned, to form a resist pattern film RP5. Resist pattern film RP5 covers regions of the main surface of semiconductor substrate SS where a bipolar transistor is formed, and where MOS transistors TR2, TR4 are formed. Then, a P type impurity is introduced with resist pattern film RP5, gate electrode GE1 and gate electrode GE3 as a mask.

Figure 36:
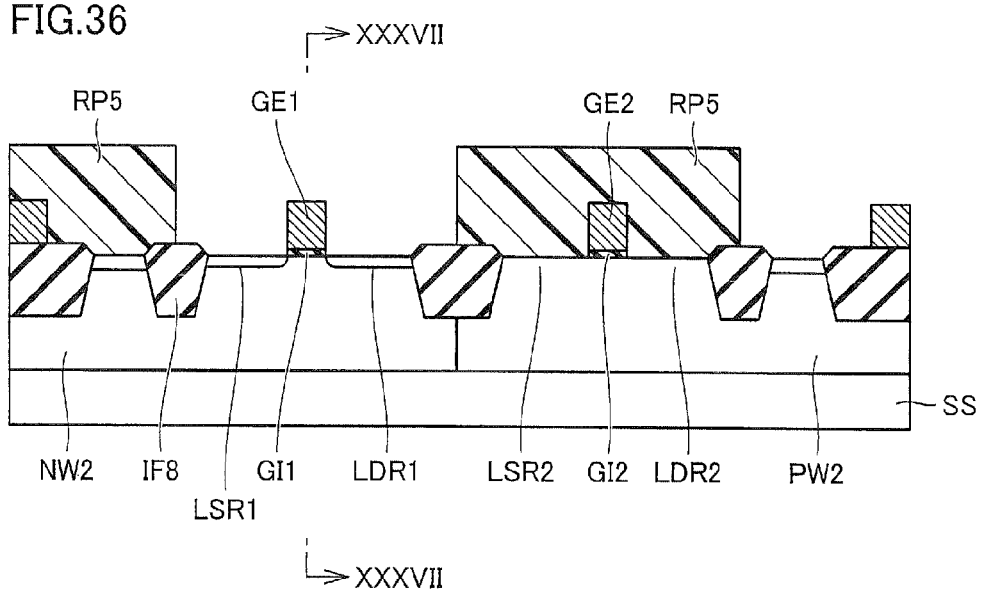
FIG. 36 is a cross-sectional view showing a manufacturing step subsequent to the manufacturing step shown in FIG. 32.
Figure 37:
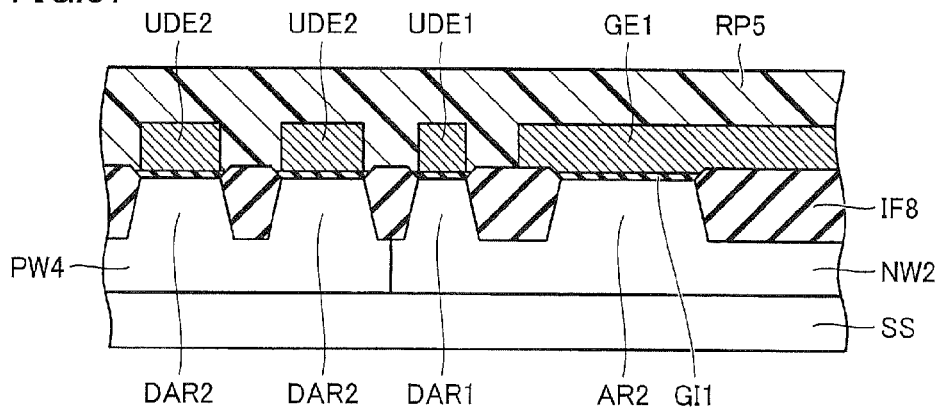
FIG. 37 is a cross-sectional view showing a manufacturing step subsequent to the manufacturing step shown in FIG. 33.
Figure 38:
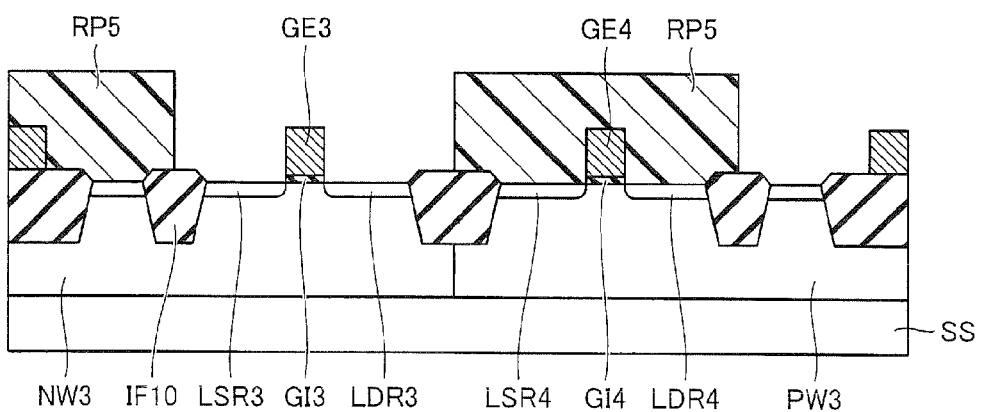
FIG. 38 is a cross-sectional view showing a manufacturing step subsequent to the manufacturing step shown in FIG. 34.

Consequently, as shown in FIG. 36, a low concentration source region LSR1 and a low concentration drain region LDR1 are formed on the main surface of semiconductor substrate SS adjacent to gate electrode GE1. In addition, as shown in FIG. 38, a low concentration source region LSR3 and a low concentration drain region LDR3 are formed on the main surface of semiconductor substrate SS adjacent to gate electrode GE3. Resist pattern film RP5 is then removed.

As such, when forming the low concentration impurity regions of each MOS transistor, portions that will be the emitter region, the base region and the collector region of the unit bipolar transistor have been covered with the resist film. Thus, a variation in characteristics of the unit bipolar transistor can be suppressed. It is not essential to cover the portions that will be the emitter region, the base region and the collector region when forming the low concentration impurity regions.

Next, as shown in FIGS. 39 to 42, an insulating film such as a silicon nitride (SiN) film is deposited by CVD, for example.

Figure 39:
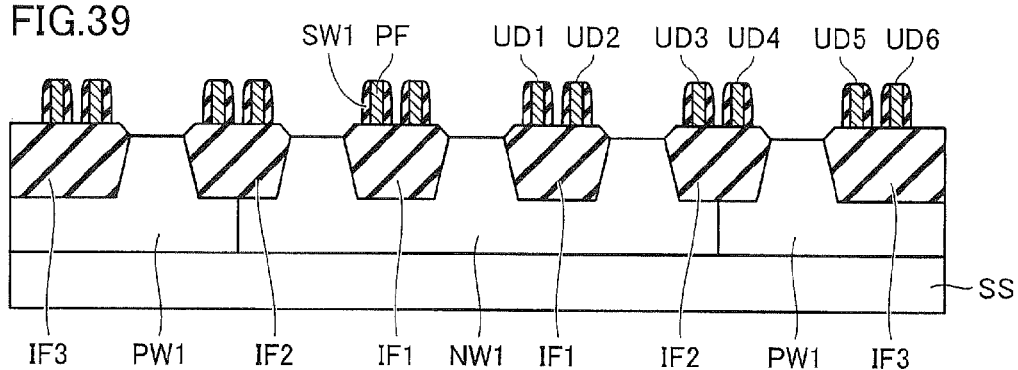
FIG. 39 is a cross-sectional view showing a manufacturing step subsequent to the manufacturing step shown in FIG. 35.

Then, the silicon nitride film is dry etched to form sidewall SW1 on the side surfaces of each polysilicon film PL, as shown in FIG. 39. In this manner, unit bipolar dummy electrodes UD1, UD2 are formed on the upper surface of isolation insulating film IF1, and unit bipolar dummy electrodes UD3, UD4 are formed on the upper surface of isolation insulating film IF2. Unit bipolar dummy electrodes UD5, UD6 are formed on the upper surface of isolation insulating film IF3.

Figure 40:
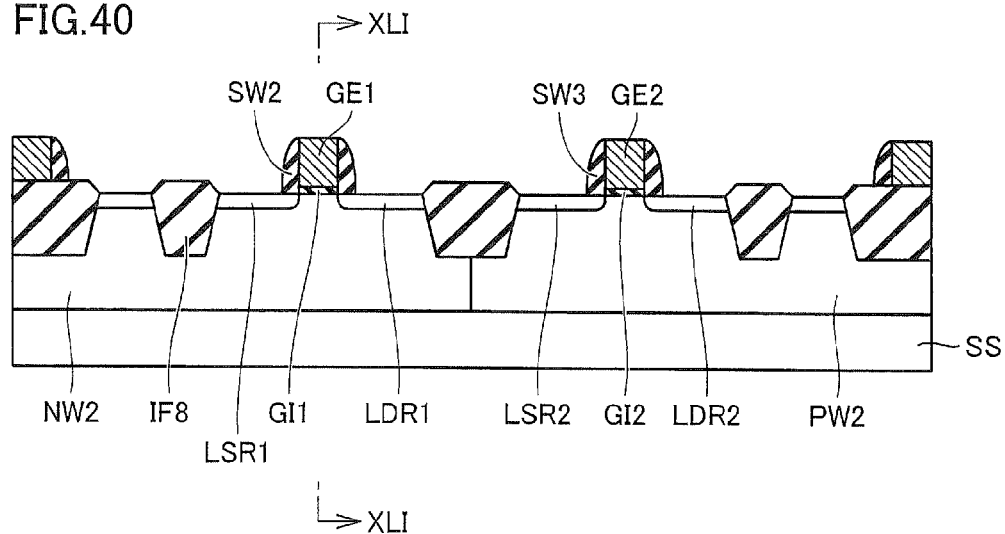
FIG. 40 is a cross-sectional view showing a manufacturing step subsequent to the manufacturing step shown in FIG. 36.
Figure 41:
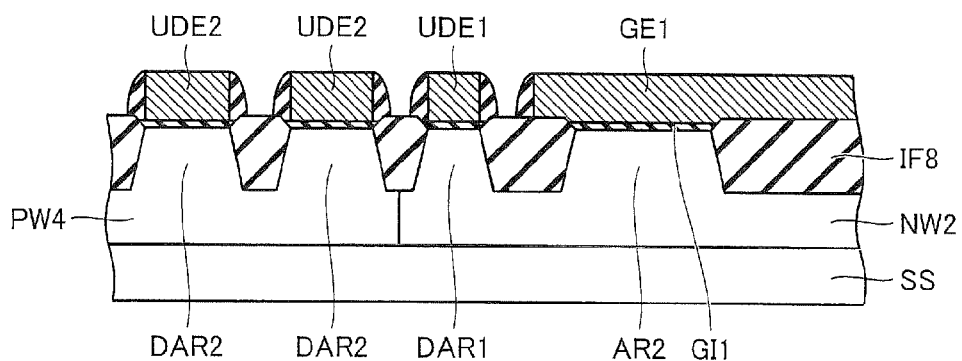
FIG. 41 is a cross-sectional view showing a manufacturing step subsequent to the manufacturing step shown in FIG. 37.
Figure 42:
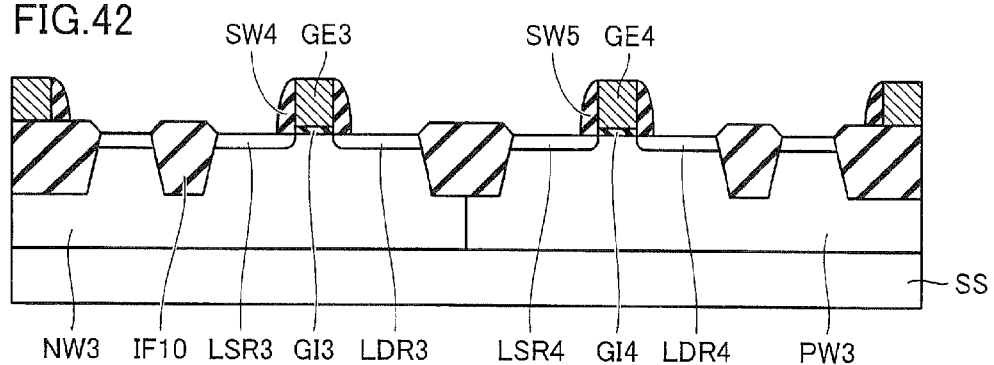
FIG. 42 is a cross-sectional view showing a manufacturing step subsequent to the manufacturing step shown in FIG. 38.
Figure 43:
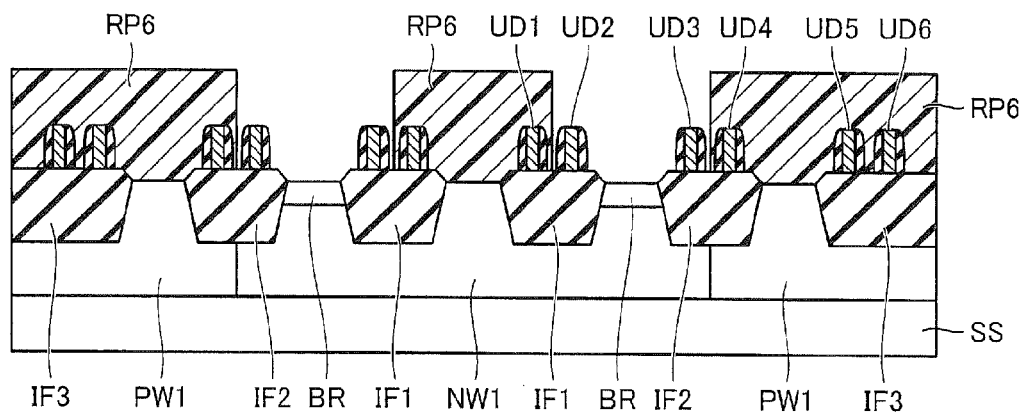
FIG. 43 is a cross-sectional view showing a manufacturing step subsequent to the manufacturing step shown in FIG. 39.

Then, as shown in FIGS. 40 and 42, sidewalls SW2, SW3, SW4, SW5 are formed on the side surfaces of gate electrodes GE1, GE2, GE3, GE4, respectively. Next, in FIGS. 43 to 46, a photoresist film is formed and patterned, to form a resist pattern film RP6.

Portions of the main surface of semiconductor substrate SS where base region BR, MOS transistor TR2 and MOS transistor TR4 are formed are exposed to the outside through resist pattern film RP6.

Then, a P type impurity is introduced into the main surface of semiconductor substrate SS, with resist pattern film RP6, gate electrode GE2, sidewall SW3, gate electrode GE4 and sidewall SW5 as a mask. Specifically, As is implanted at 20 keV and $4\times10^{15}$ cm$^{-2}$ to form base region BR.

Base region BR is formed on the main surface of semiconductor substrate SS between isolation insulating film IF1 and isolation insulating film IF2.

Here, as shown in FIG. 6, the plurality of unit bipolar dummy electrodes UD1 to UD6 are formed on the upper surfaces of isolation insulating films IF1 to IF3.

The plurality of unit bipolar dummy electrodes UD2 are formed on the upper surface of isolation insulating films IF1 along the outer peripheral edge portion of isolation insulating film IF1. Unit bipolar dummy electrodes UD2 are spaced from one another, with a gap between adjacent unit bipolar dummy electrodes UD2.

The plurality of unit bipolar dummy electrodes UD3 are spaced from one another on the upper surface of isolation insulating films IF2 along the inner peripheral edge portion of isolation insulating film IF2. There is a gap between adjacent unit bipolar dummy electrodes UD3.

Thus, when forming base region BR, the dopant can pass between unit bipolar dummy electrodes UD2 and between unit bipolar dummy electrodes UD3, to reach the main surface positioned between isolation insulating film IF1 and isolation insulating film IF2.

Accordingly, a variation in impurity concentration with the position can be suppressed in base region BR to be formed.

Figure 44:
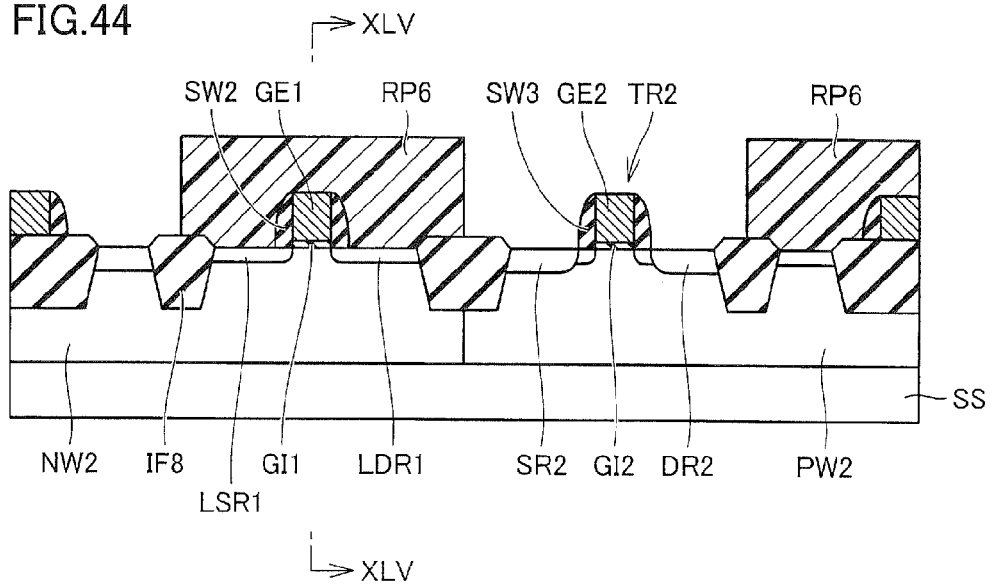
FIG. 44 is a cross-sectional view showing a manufacturing step subsequent to the manufacturing step shown in FIG. 40.
Figure 45:
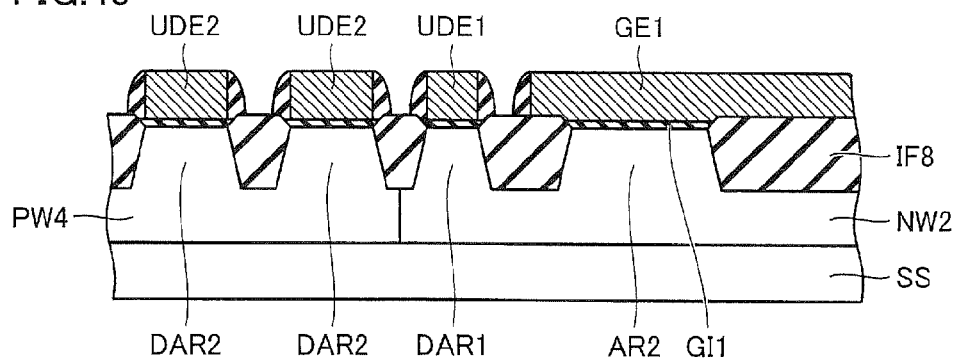
FIG. 45 is a cross-sectional view showing a manufacturing step subsequent to the manufacturing step shown in FIG. 41.

As shown in FIG. 44, an N type high concentration impurity region is formed on opposing sides of gate electrode GE2. As a result, source region SR2 and drain region DR2 are formed on the main surface of semiconductor substrate SS adjacent to gate electrode GE2. Each of source region SR2 and drain region DR2 includes the high concentration impurity region formed in this step, and the already formed low concentration impurity region. MOS transistor TR2 is thus formed.

Figure 46:
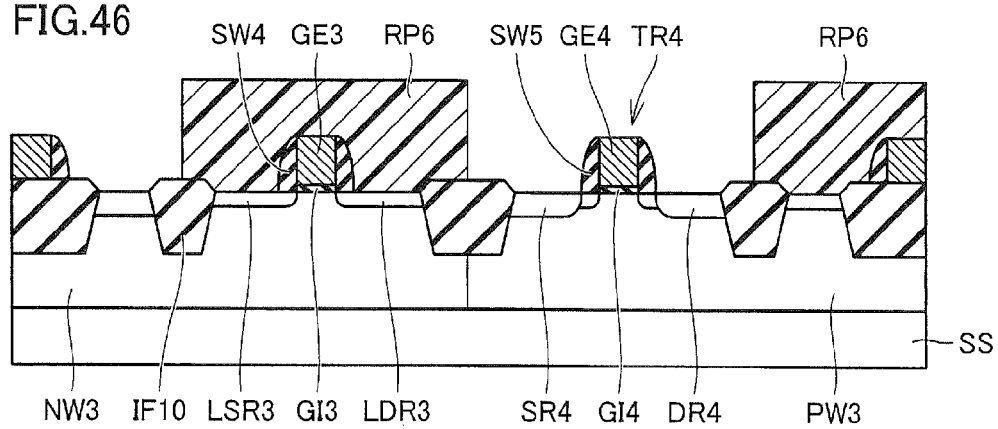
FIG. 46 is a cross-sectional view showing a manufacturing step subsequent to the manufacturing step shown in FIG. 42.

Then, as shown in FIG. 46, source region SR4 and drain region DR4 are formed on the main surface of semiconductor substrate SS adjacent to gate electrode GE4. Subsequently, resist pattern film RP6 is removed.

Next, as shown in FIGS. 47 to 50, a photoresist film is formed on the main surface of semiconductor substrate SS and patterned, to form a resist pattern film RP7. Portions of the main surface of semiconductor substrate SS where collector region CR, emitter region ER, MOS transistor TR1 and MOS transistor TR3 are formed are exposed to the outside through resist pattern film RP7.

Then, a P type impurity is introduced into the main surface of semiconductor substrate SS, with resist pattern film RP7, gate electrode GE1, sidewall SW2, gate electrode GE3 and sidewall SW4 as a mask.

Figure 47:
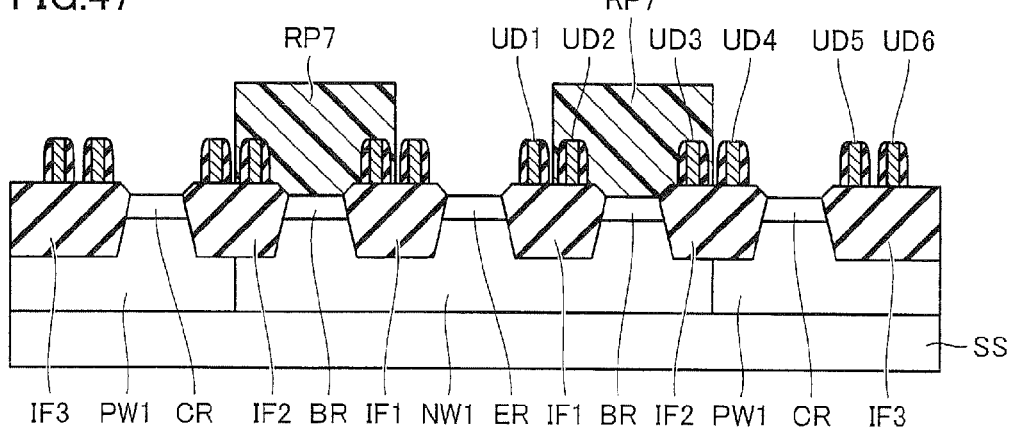
FIG. 47 is a cross-sectional view showing a manufacturing step subsequent to the manufacturing step shown in FIG. 43.

Consequently, as shown in FIG. 47, collector region CR and emitter region ER are formed, to form unit bipolar transistor UB.

Here, as shown in FIG. 6, the plurality of unit bipolar dummy electrodes UD1 are formed on the upper surface of isolation insulating film IF1 along the direction in which isolation insulating film IF1 extends. There is a gap between adjacent unit bipolar dummy electrodes UD1.

Thus, when implanting an impurity into a region of the main surface that is surrounded by isolation insulating film IF1, the dopant can pass between unit bipolar dummy electrodes UD1. The implant is thus uniformly implanted into the portion of the main surface of semiconductor substrate SS that is surrounded by isolation insulating film IF1. Accordingly, a variation in impurity concentration with the position can be suppressed in the emitter region.

Collector region CR is formed on the main surface of semiconductor substrate SS between isolation insulating film IF2 and isolation insulating film IF3.

The plurality of unit bipolar dummy electrodes UD4 are spaced from one another on the upper surface of isolation insulating film IF2. The plurality of unit bipolar dummy electrodes UD4 are spaced from one another along the outer peripheral edge portion of isolation insulating film IF2.

The plurality of unit bipolar dummy electrodes UD5 are provided on the upper surface of isolation insulating films IF3 along the inner peripheral edge portion of isolation insulating film IF3. There is a gap between adjacent unit bipolar dummy electrodes UD5.

Thus, when an impurity enters the main surface between isolation insulating film IF3 and isolation insulating film IF2, the dopant can pass through the gap between unit bipolar dummy electrodes UD4 and the gap between unit bipolar dummy electrodes UD5.

The dopant is thus uniformly implanted into the main surface between isolation insulating film IF3 and isolation insulating film IF2. Accordingly, a variation in impurity concentration with the position can be suppressed in collector region CR.

Figure 48:
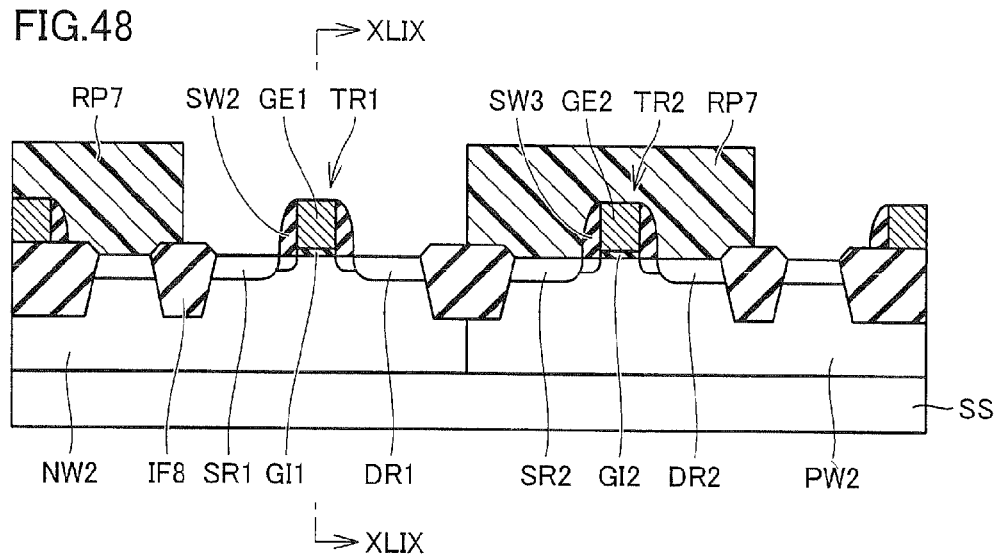
FIG. 48 is a cross-sectional view showing a manufacturing step subsequent to the manufacturing step shown in FIG. 44.
Figure 49:
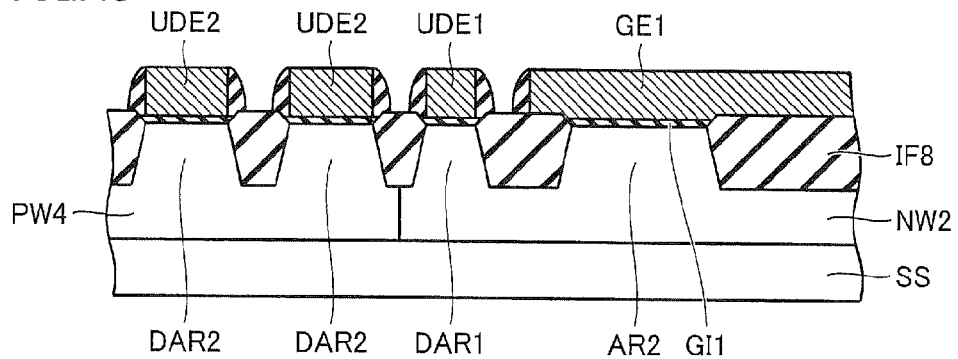
FIG. 49 is a cross-sectional view showing a manufacturing step subsequent to the manufacturing step shown in FIG. 45.

As shown in FIG. 48, a high concentration impurity region is formed on opposing sides of gate electrode GEL Source region SR1 and drain region DR1 each including the high concentration impurity region and the already formed low concentration impurity region are formed. MOS transistor TR1 is thus formed.

Figure 50:
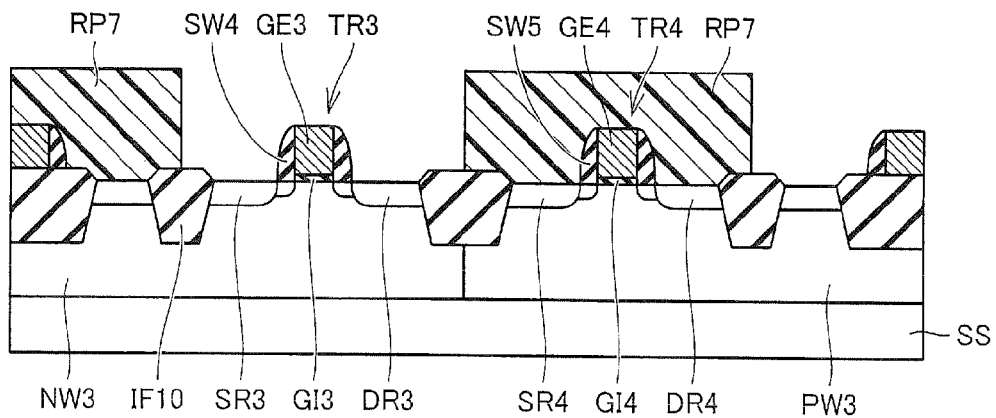
FIG. 50 is a cross-sectional view showing a manufacturing step subsequent to the manufacturing step shown in FIG. 46.
Figure 51:
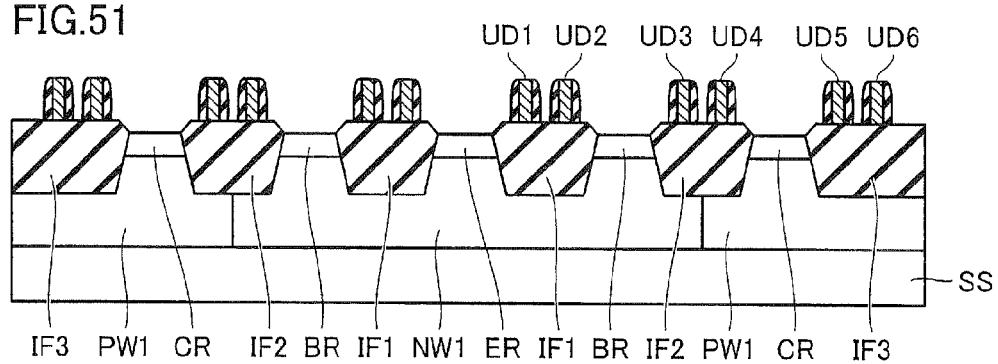
FIG. 51 is a cross-sectional view showing a manufacturing step subsequent to the manufacturing step shown in FIG. 47.
Figure 52:
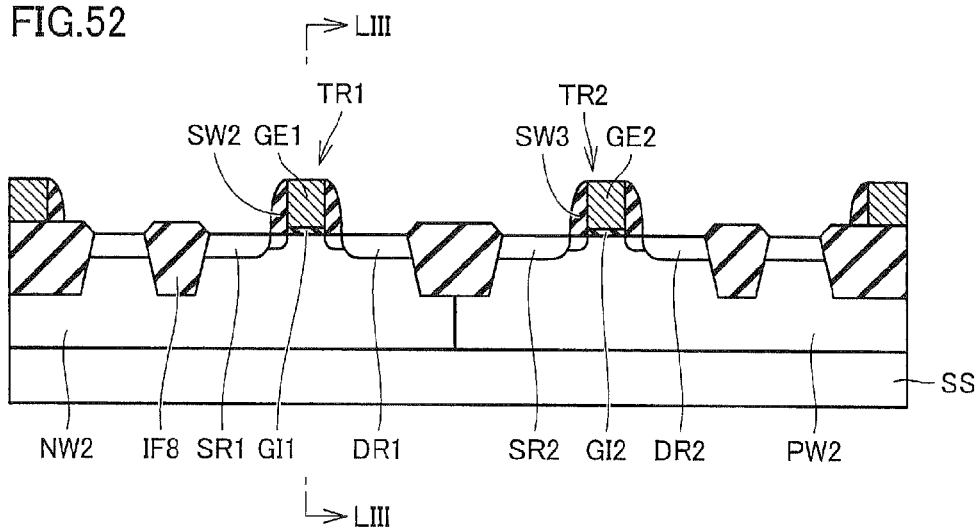
FIG. 52 is a cross-sectional view showing a manufacturing step subsequent to the manufacturing step shown in FIG. 48.
Figure 53:
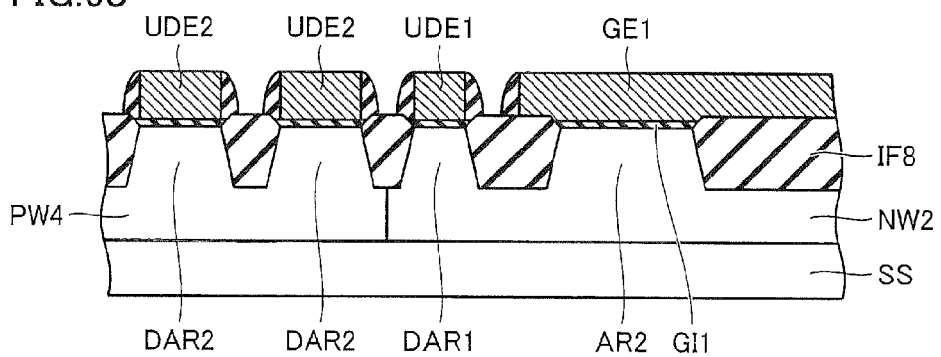
FIG. 53 is a cross-sectional view showing a manufacturing step subsequent to the manufacturing step shown in FIG. 49.
Figure 54:
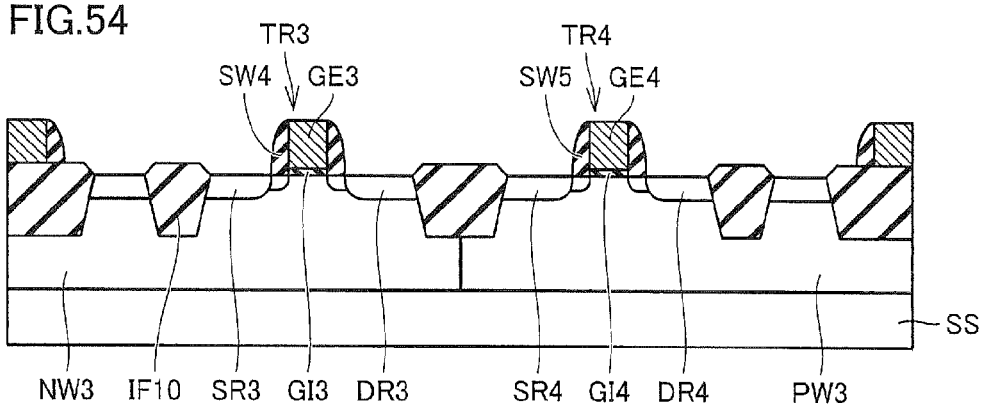
FIG. 54 is a cross-sectional view showing a manufacturing step subsequent to the manufacturing step shown in FIG. 50.

Then, as shown in FIG. 50, a high concentration impurity region is formed on opposing sides of gate electrode GE3.

Consequently, source region SR3 and drain region DR3 each including the high concentration impurity region and the already formed low concentration impurity region are formed. MOS transistor TR3 is thus formed.

Next, as shown in FIGS. 51 to 54, resist pattern film RP7 is removed to expose unit bipolar transistor UB, MOS transistor TR1, MOS transistor TR2, MOS transistor TR3 and MOS transistor TR4.

Next, as shown in FIGS. 55 to 58, a protection film IF11 such as a silicon oxide film is deposited on the main surface of semiconductor substrate SS by CVD, for example.

As a result of diligent studies by the present inventor, it has been found that a silicon oxide film deposited on the main surface of a semiconductor substrate by CVD varies in thickness between when a pattern such as a polysilicon film is formed on the main surface of the semiconductor substrate and when the pattern is not formed.

A wafer having a pattern formed of a polysilicon film and a wafer not having a pattern formed of a polysilicon film were prepared, and a silicon oxide film was formed on the wafers under the same conditions. As a result, it was found that the silicon oxide film formed on the wafer having the pattern formed of a polysilicon film had a larger thickness.

The pattern formed of a polysilicon film includes unit patterns spaced apart from one another. The unit patterns are formed in a rectangular shape when viewed two-dimensionally from above. The length of a long side portion of each of the unit patterns is set to about 1.0 µm, and the length of a short side portion is set to about 0.1 µm. The space between the adjacent unit patterns in the direction of the long side of the unit patterns is set to about 1.0 µm, and the space between the adjacent unit patterns in the short side direction is set to about 0.5 µm to 1.3 µm. Each of the unit patterns has a thickness of about 130 nm.

As shown in Table 1 below, when a silicon oxide film of 35 nm was formed on the upper surface of the wafer not having the pattern formed of a polysilicon film, a silicon oxide film of about 32 nm was formed on the wafer having the pattern formed of a polysilicon film to cover the pattern formed of a polysilicon film.

TABLE 1

|  | CVD SiO$_2$ thickness |
|---|---|
| Wafer not having pattern formed of polysilicon film | 35 nm |
| Wafer having pattern formed of polysilicon film | 32 nm |

In the method of manufacturing semiconductor device 1 according to this embodiment, when forming the protection film, unit bipolar dummy electrodes UD1 to UD6 having a height similar to that of gate electrodes GE1 to GE4 have been formed.

Figure 55:
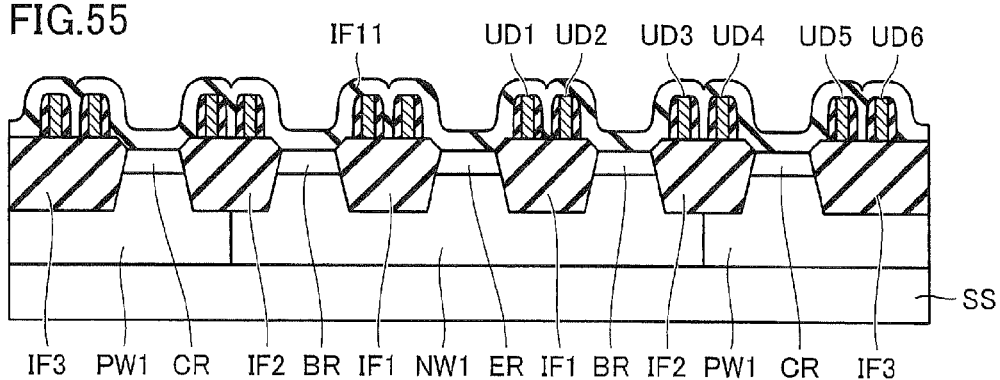
FIG. 55 is a cross-sectional view showing a manufacturing step subsequent to the manufacturing step shown in FIG. 51.
Figure 56:
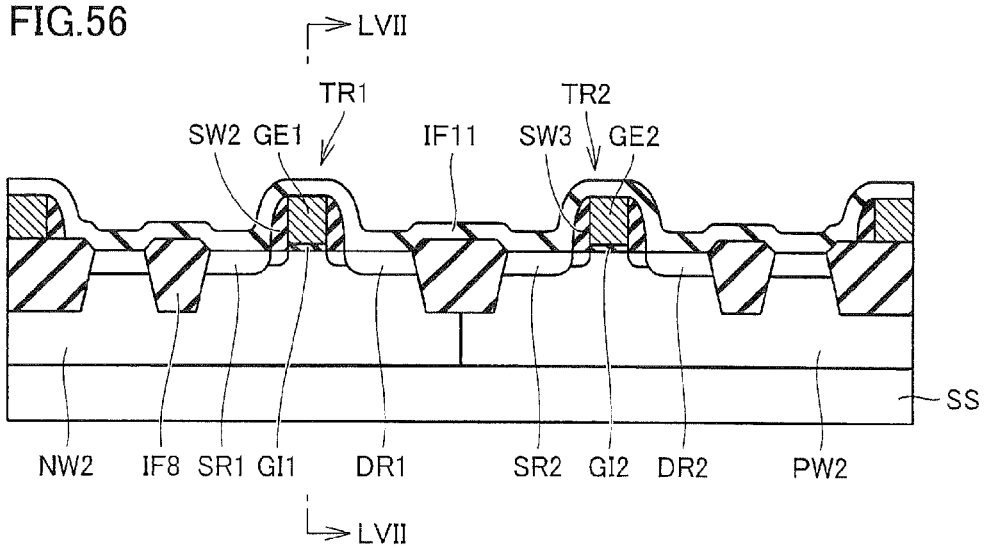
FIG. 56 is a cross-sectional view showing a manufacturing step subsequent to the manufacturing step shown in FIG. 52.
Figure 58:
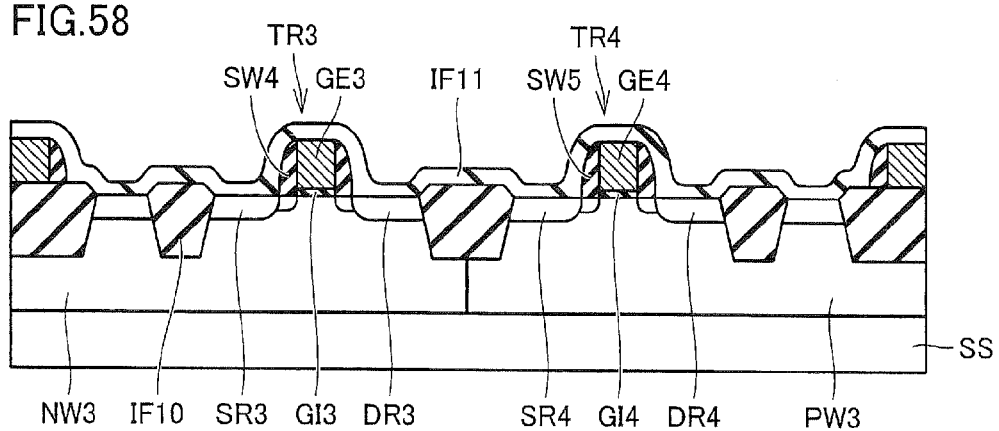
FIG. 58 is a cross-sectional view showing a manufacturing step subsequent to the manufacturing step shown in FIG. 54.

Thus, a variation in thickness between protection film IF11 covering unit bipolar transistor UB as shown in FIG. 55 and protection film IF11 covering MOS transistors TR1 to TR4 as shown in FIGS. 56 and 58 can be suppressed.

Particularly, in the method of manufacturing semiconductor device 1 according to the first embodiment, unit bipolar dummy electrode UD1 is arranged closer to emitter region ER relative to a central portion in a width direction of isolation insulating film IF1. By arranging unit bipolar dummy electrode UD1 very close to emitter region ER in this manner, an increase in thickness of protection film IF11 formed on the upper surface of emitter region ER can be suppressed.

Likewise, unit bipolar dummy electrode UD2 is arranged closer to base region BR relative to the central portion in the width direction of isolation insulating film IF1, and unit bipolar dummy electrode UD3 is arranged closer to base region BR relative to a central portion in a width direction of isolation insulating film IF2. Unit bipolar dummy electrode UD4 is arranged closer to collector region CR relative to the central portion in the width direction of isolation insulating film IF2, and unit bipolar dummy electrode UD5 is arranged closer to collector region CR relative to a central portion in a width direction of isolation insulating film IF3.

Thus, an increase in thickness of protection film IF11 formed on the upper surfaces of base region BR and collector region CR can be suppressed.

Figure 57:
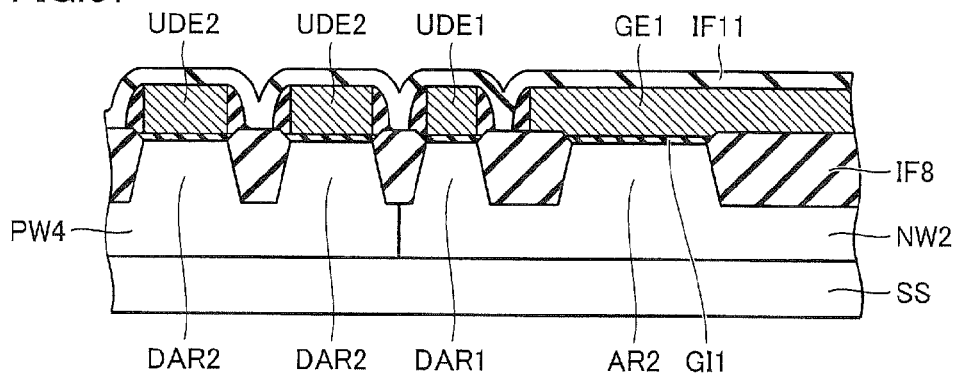
FIG. 57 is a cross-sectional view showing a manufacturing step subsequent to the manufacturing step shown in FIG. 53.

Furthermore, since the area of an upper surface (plane area) of each of unit bipolar dummy electrodes UD1 to UD5 is larger than the area (plane area) of each of unit dummy electrodes UDE1, UDE2 shown in FIG. 57, an increase in thickness of protection film IF11 deposited on the upper surfaces of emitter region ER, base region BR and collector region CR can be further suppressed.

Although a unit bipolar dummy electrode is formed on the upper surfaces of all of isolation insulating film IF1, isolation insulating film IF2 and isolation insulating film IF3 by way of example in this embodiment, a unit bipolar dummy electrode may be formed on at least one of isolation insulating films IF1 to IF3.

Here, as shown in FIG. 4, unit bipolar transistors UB are formed in an array. In the example shown in FIG. 4, seven unit bipolar transistors UB are aligned in each of the row direction and the column direction. The centrally positioned one of unit bipolar transistors UB arranged in an array is provided in a position farthest from the outer periphery of PN junction PNP bipolar transistor 38.

For this reason, protection film IF11 may be deposited with a large thickness on the upper surface of this centrally positioned unit bipolar transistor UB.

In semiconductor device 1 according to the first embodiment, therefore, dummy unit bipolar transistor DUB is provided in the central portion of the plurality of unit bipolar transistors UB arranged in an array.

Both of the plurality of unit bipolar transistors UB1 forming PN junction PNP bipolar transistor 38 and the plurality of unit bipolar transistors UB2 forming PN junction PNP bipolar transistor 39 are arranged with dummy unit bipolar transistor DUB as a center, with the centroid of PN junction PNP bipolar transistor 38 matching the centroid of PN junction PNP bipolar transistor 39.

Here, the case is considered where noise from dummy unit bipolar transistor DUB is transmitted through the substrate to PN junction PNP bipolar transistor 38 and PN junction PNP bipolar transistor 39 during driving operation.

The effect of the noise from dummy unit bipolar transistor DUB is inversely proportional to the distance, and is proportional to the areas of PN junction PNP bipolar transistors 38, 39. Thus, the effect of the noise from dummy unit bipolar transistor DUB on PN junction PNP bipolar transistor 38 and the effect of the noise from dummy unit bipolar transistor DUB on PN junction PNP bipolar transistor 39 is represented by the area ratio of PN junction PNP bipolar transistor 38 and PN junction PNP bipolar transistor 39.

Since the noise received by PN junction PNP bipolar transistors 38, 39 from dummy unit bipolar transistor DUB is represented by the area ratio as described above, a ratio of a current 141 passing through current source MOS transistor 35 and PN junction PNP bipolar transistor 38 and a current 142 passing through current source MOS transistor 36 and resistor 41 is maintained to be equal to the area ratio of PN junction PNP bipolar transistor 38 and PN junction PNP bipolar transistor 39.

In FIG. 57, when forming protection film IF11, the plurality of unit dummy electrodes UDE1, UDE2 have been formed around gate electrode GE1. Unit dummy electrodes UDE1, UDE2 are formed to surround the peripheries of MOS transistors TR1, TR2, as shown in FIG. 9.

As such, when depositing protection film IF11, the plurality of unit dummy electrodes UDE1, UDE2 have been formed around MOS transistors TR1, TR2. Thus, when protection film IF11 is deposited, a variation in position of the upper surface between protection film IF11 deposited on MOS transistors TR1, TR2 and protection film IF11 deposited around MOS transistors TR1, TR2 can be suppressed. Therefore, unevenness in the upper surface of protection film IF11 can be suppressed, and the upper surface can be flattened.

As shown in FIG. 9, on the main surface, unit dummy electrodes UDE1 having a small area are formed adjacent to MOS transistors TR1, TR2, and unit dummy electrodes UDE2 having a large upper surface area are formed opposite to MOS transistors TR1, TR2 relative to unit dummy electrodes UDE1.

By arranging unite dummy electrodes UDE1 having a small upper surface area around MOS transistors TR1, TR2, unit dummy electrodes UDE1 E1 can be arranged in accordance with the shapes of MOS transistors TR1, TR2 and the like, as compared to an example where unit dummy electrodes UDE2 having a large upper surface area are arranged around MOS transistors TR1, TR2. As a result, unevenness of protection film IF11 can be suppressed in peripheral edge portions of MOS transistors TR1, TR2.

Figure 59:
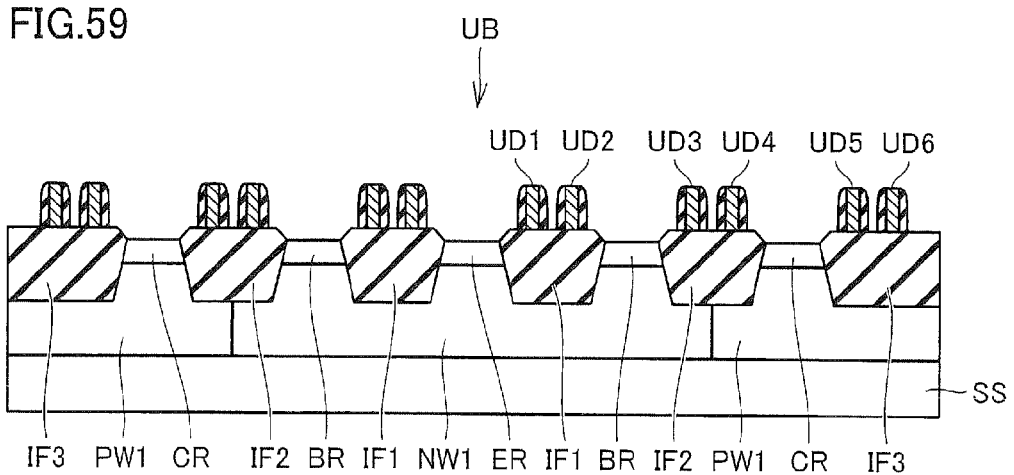
FIG. 59 is a cross-sectional view showing a manufacturing step subsequent to the manufacturing step shown in FIG. 55.
Figure 60:
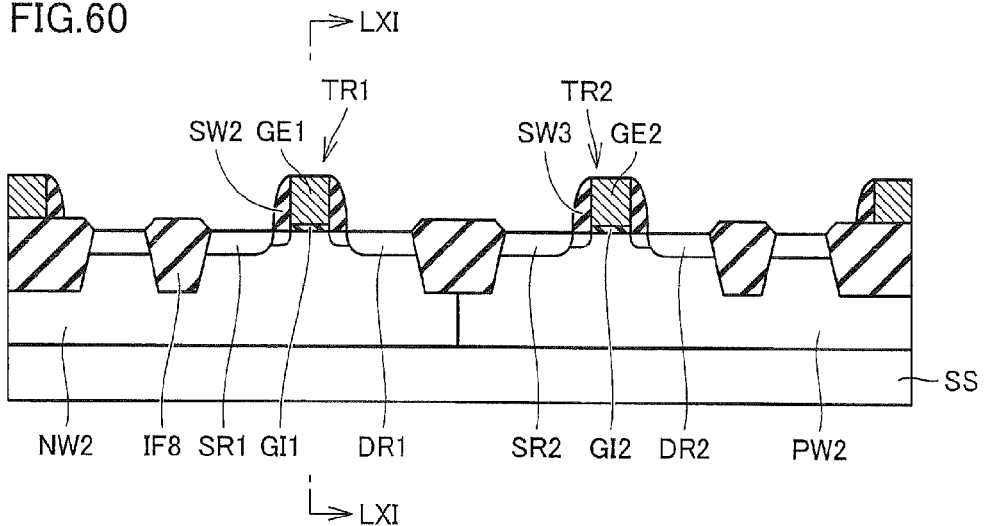
FIG. 60 is a cross-sectional view showing a manufacturing step subsequent to the manufacturing step shown in FIG. 56.
Figure 61:
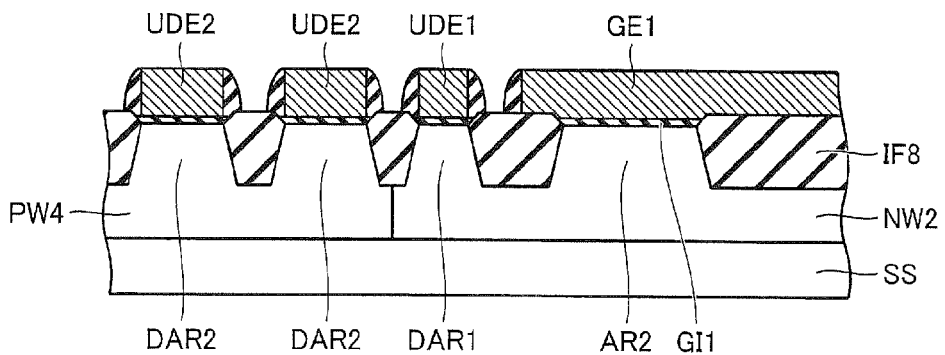
FIG. 61 is a cross-sectional view showing a manufacturing step subsequent to the manufacturing step shown in FIG. 57.

Next, as shown in FIGS. 59 to 62, protection film IF11 is dry etched. This exposes emitter region ER, base region BR and collector region CR of unit bipolar transistor UB through protection film IF11, as shown in FIG. 59, MOS transistor TR1 and MOS transistor TR2 shown in FIG. 60 are also exposed through protection film IF11. Furthermore, unit dummy electrode UDE1 and unit dummy electrodes UDE2 shown in FIG. 61 are also exposed through protection film IF11.

Figure 62:
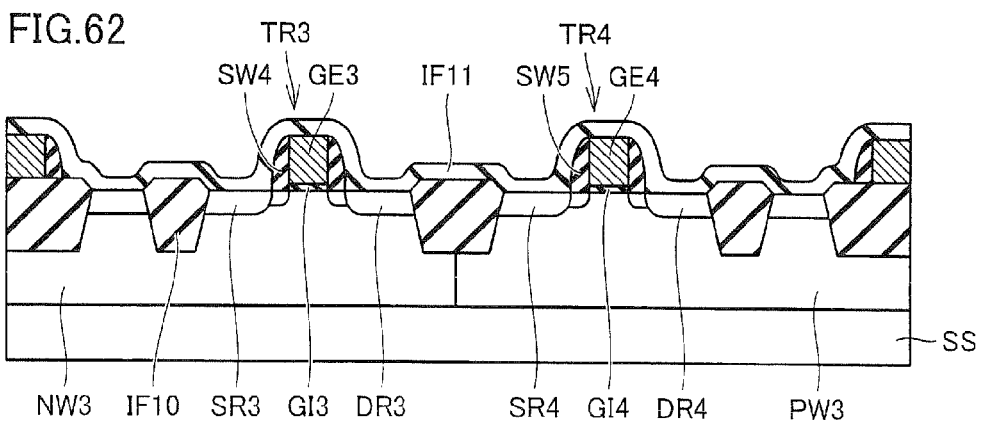
FIG. 62 is a cross-sectional view showing a manufacturing step subsequent to the manufacturing step shown in FIG. 58.

On the other hand, as shown in FIG. 62, MOS transistor TR3 and MOS transistor TR4 are covered with protection film IF11.

Here, as described above, a great variation in thickness between protection film IF11 covering unit bipolar transistor UB and protection film IF11 covering MOS transistors TR1 to TR4 is suppressed.

Thus, when protection film IF11 covering MOS transistor TR1 and MOS transistor TR2 is removed, protection film IF11 formed on unit bipolar transistor UB is also removed, as shown in FIGS. 59 and 60.

If unit bipolar dummy electrodes UD1 to UD6 are not formed, protection film IF11 covering unit bipolar transistor UB has a thickness larger than that of protection film IF11 covering MOS transistors TR1, TR2.

For this reason, even after protection film IF11 on MOS transistors TR1, TR2 is removed, protection film IF11 remains on unit bipolar transistor UB.

As such, according to the method of manufacturing semiconductor device 1 of this embodiment, protection film IF 11 can be prevented from remaining on unit bipolar transistor UB.

Figure 63:
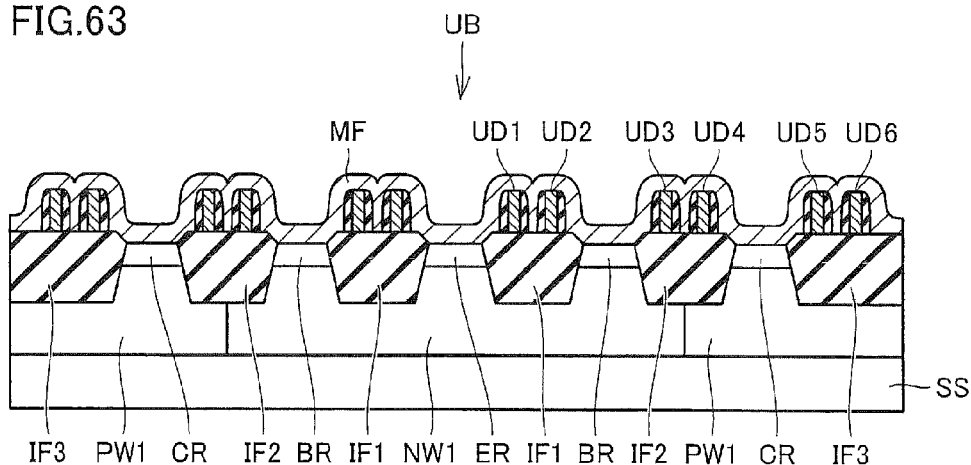
FIG. 63 is a cross-sectional view showing a manufacturing step subsequent to the manufacturing step shown in FIG. 59.
Figure 64:
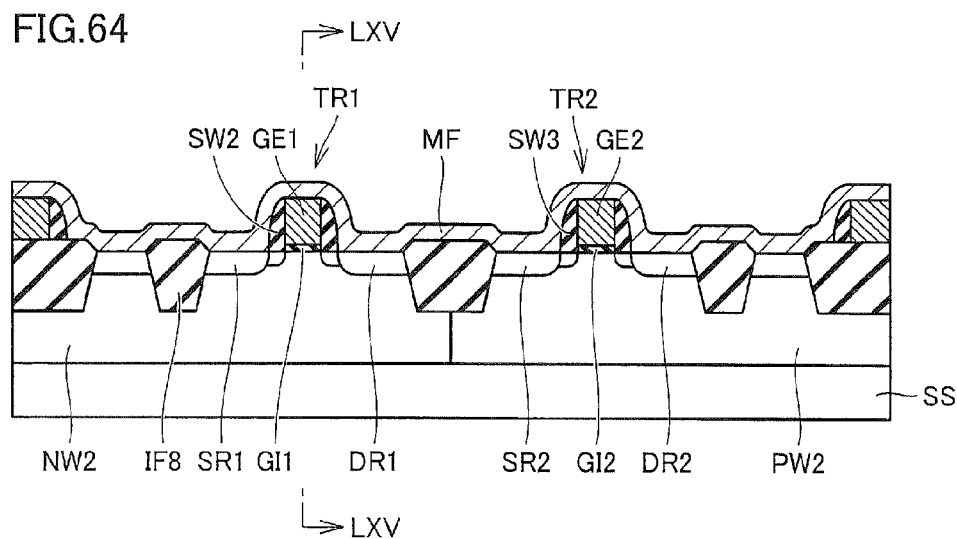
FIG. 64 is a cross-sectional view showing a manufacturing step subsequent to the manufacturing step shown in FIG. 60.
Figure 65:
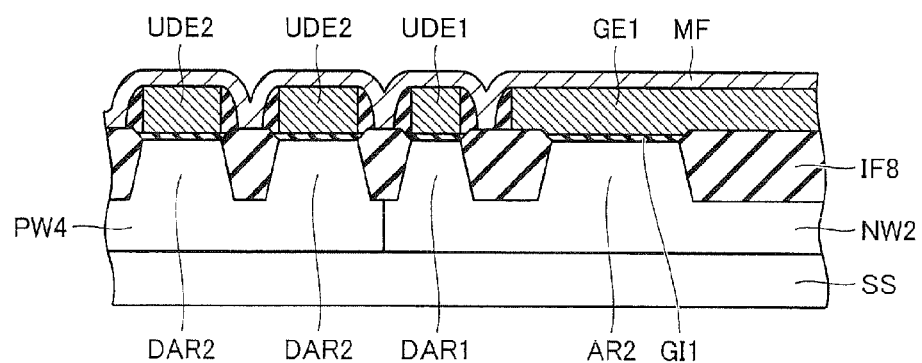
FIG. 65 is a cross-sectional view showing a manufacturing step subsequent to the manufacturing step shown in FIG. 61.

Next, as shown in FIGS. 63 to 66, a metal film MF such as cobalt or nickel is formed. As shown in FIGS. 63 and 64, metal film MF is formed to cover unit bipolar transistor UB, MOS transistor TR1 and MOS transistor TR2 exposed through protection film IF11.

Figure 66:
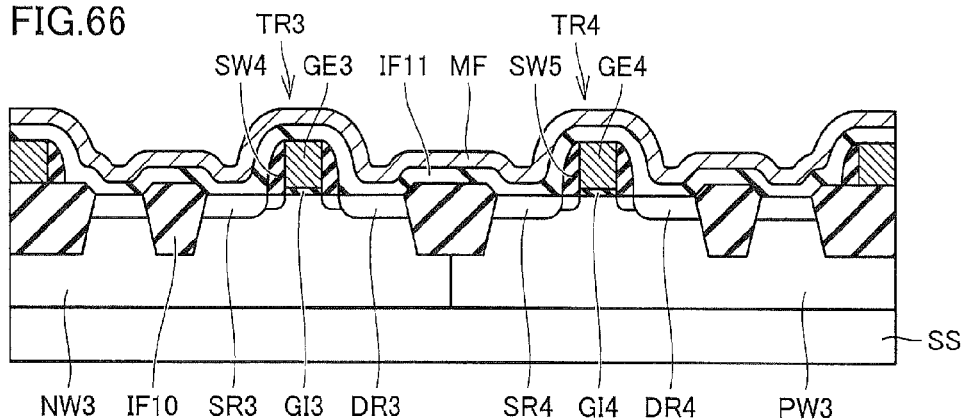
FIG. 66 is a cross-sectional view showing a manufacturing step subsequent to the manufacturing step shown in FIG. 62.

On the other hand, as shown in FIG. 66, MOS transistor TR3 and MOS transistor TR4 are covered with protection film IF11, and metal film MF is deposited on the upper surface of protection film IF11.

Figure 67:
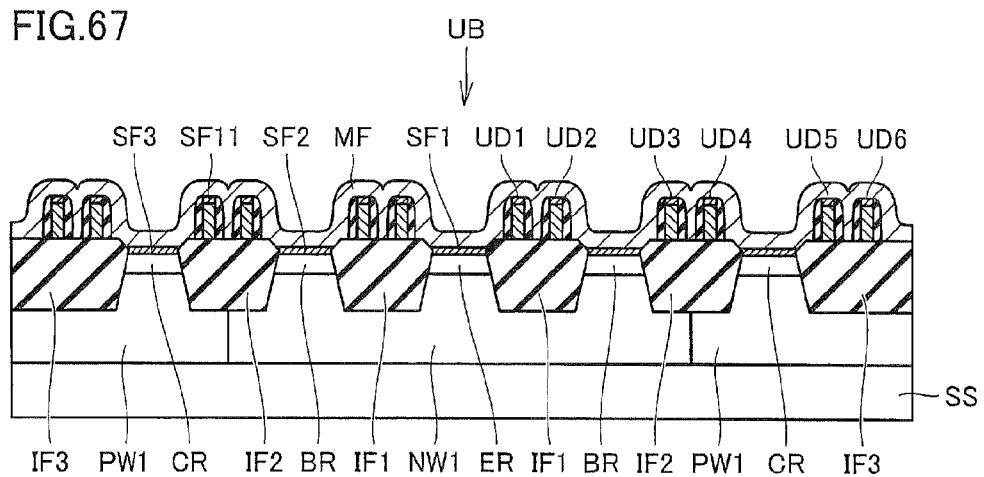
FIG. 67 is a cross-sectional view showing a manufacturing step subsequent to the manufacturing step shown in FIG. 63.

Next, as shown in FIGS. 67 to 70, a silicide film is formed by heat treatment. Specifically, as shown in FIG. 67, silicide film SF11 is formed on the upper surface of polysilicon film PF of unit bipolar dummy electrodes UD1 to UD6.

In addition, silicide film SF1 is formed on the upper surface of emitter region ER, and silicide film SF2 is formed on the upper surface of base region BR. Silicide film SF3 is formed on the upper surface of collector region CR.

Figure 68:
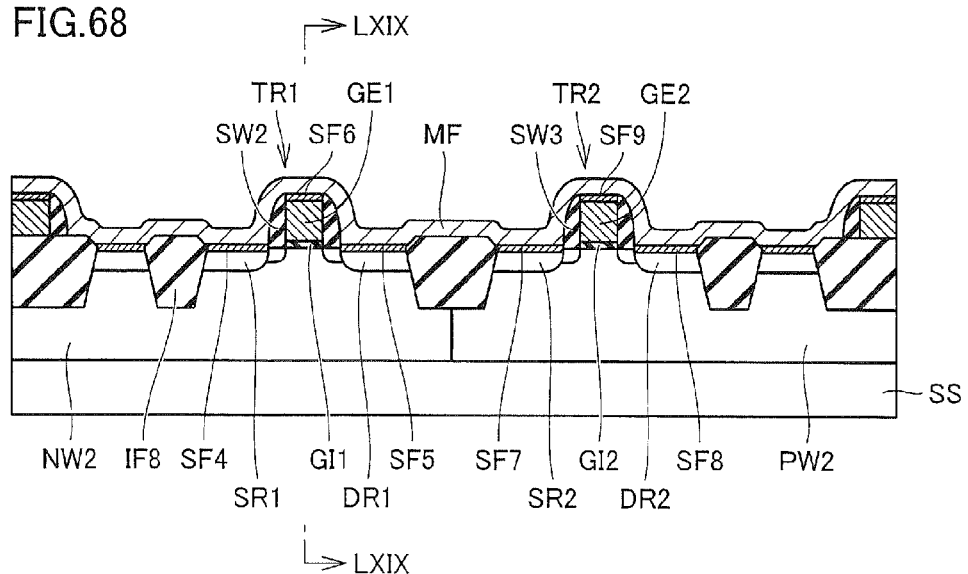
FIG. 68 is a cross-sectional view showing a manufacturing step subsequent to the manufacturing step shown in FIG. 64.

As shown in FIG. 68, silicide film SF4 is formed on the upper surface of source region SR1 of MOS transistor TR1, and silicide film SF5 is formed on the upper surface of drain region DR1. Silicide film SF6 is formed on the upper surface of gate electrode GE1 of MOS transistor TR1.

Silicide film SF7 is formed on the upper surface of source region SR2 of MOS transistor TR2, and silicide film SF8 is farmed on the upper surface of drain region DR2. Silicide film SF9 is formed on the upper surface of gate electrode GE2.

Figure 69:
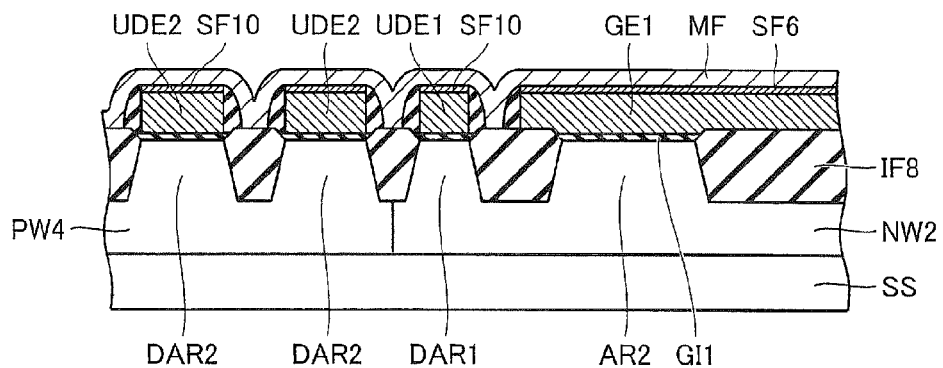
FIG. 69 is a cross-sectional view showing a manufacturing step subsequent to the manufacturing step shown in FIG. 65.

As shown in FIG. 69, silicide film SF10 is formed on the upper surfaces of unit dummy electrode UDE1 and unit dummy electrode UDE2.

Figure 70:
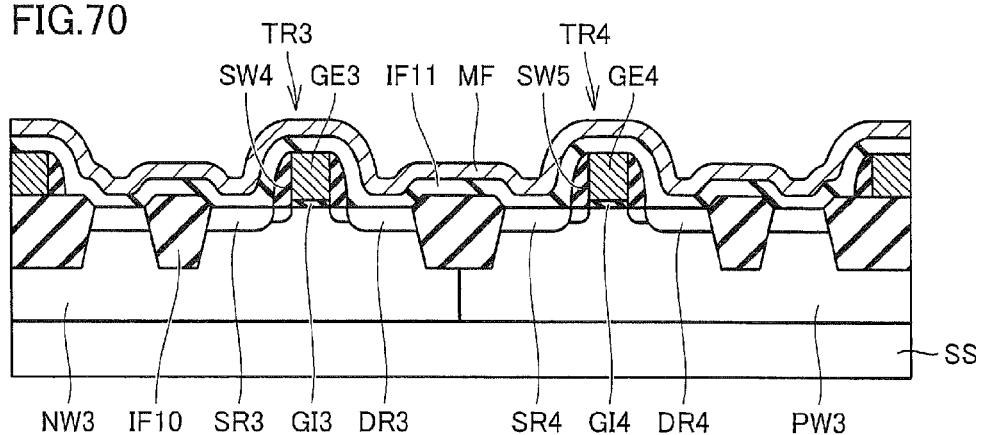
FIG. 70 is a cross-sectional view showing a manufacturing step subsequent to the manufacturing step shown in FIG. 66.

On the other hand, as shown in FIG. 70, MOS transistor TR3 and MOS transistor TR4 are covered with protection film IF11. Thus, a silicide film is not formed on the source regions, the drain regions and the gate electrodes of MOS transistors TR3, TR4.

Next, as shown in FIGS. 71 to 74, metal film MF and protection film IF11 are removed to expose unit bipolar transistor UB, MOS transistor TR1 to MOS transistor TR4, and unit bipolar dummy electrodes UD1 to UD6.

Next, as shown in FIGS. 7, 10, 11 and 12, insulating film IF4, interlayer insulating film IF5 and insulating film IF6 are successively deposited. Then, insulating film IF4, interlayer insulating film IF5 and insulating film IF6 are patterned to form a plurality of contact holes. Then, connection members C including a barrier metal and a plug are formed. Then, a metal film such as copper is formed and patterned to form the upper layer wires. Then, insulating film IF7 is deposited. Semiconductor device 1 according to the first embodiment can be thus fabricated.

As such, silicide films SF1, SF2, SF3 each having a prescribed thickness are formed on the upper surfaces of emitter region ER, base region BR and collector region CR of unit bipolar transistor UB, respectively.

Figure 71:
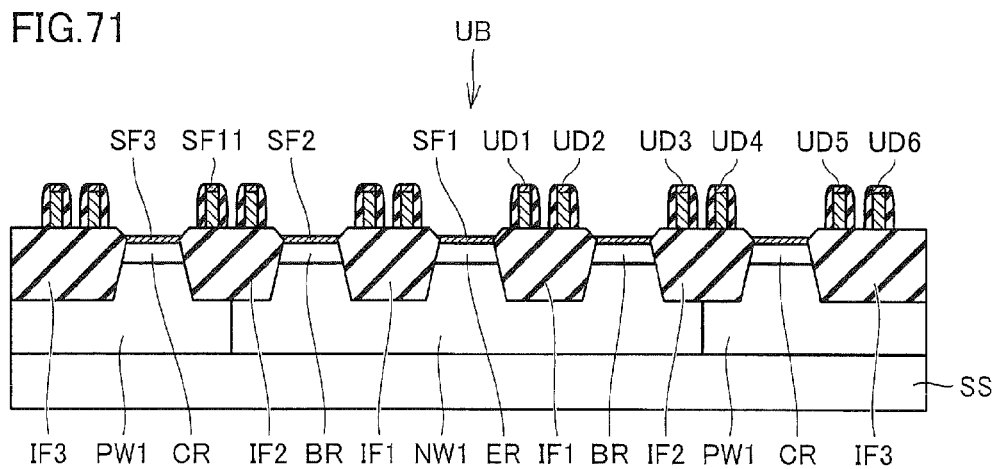
FIG. 71 is a cross-sectional view showing a manufacturing step subsequent to the manufacturing step shown in FIG. 67.
Figure 72:
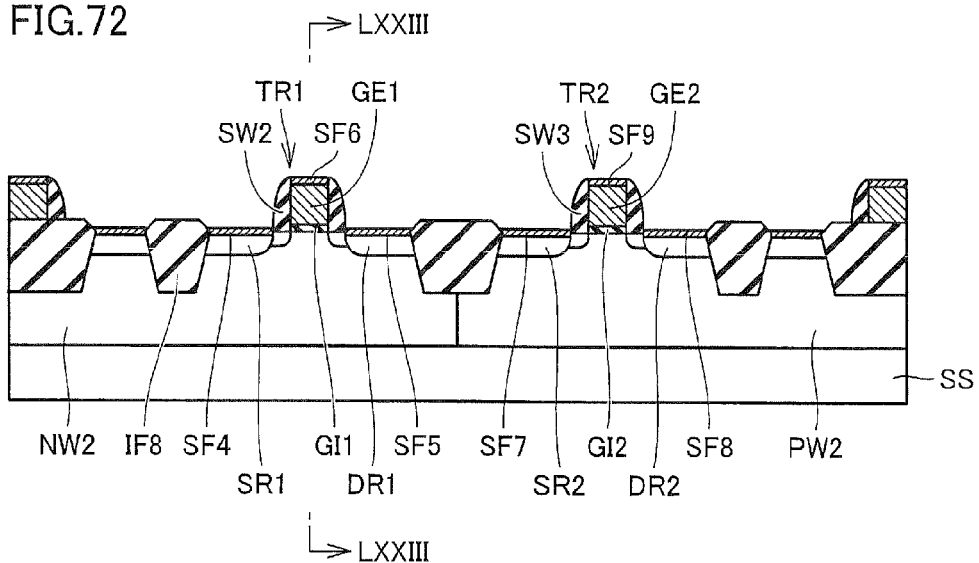
FIG. 72 is a cross-sectional view showing a manufacturing step subsequent to the manufacturing step shown in FIG. 68.
Figure 73:
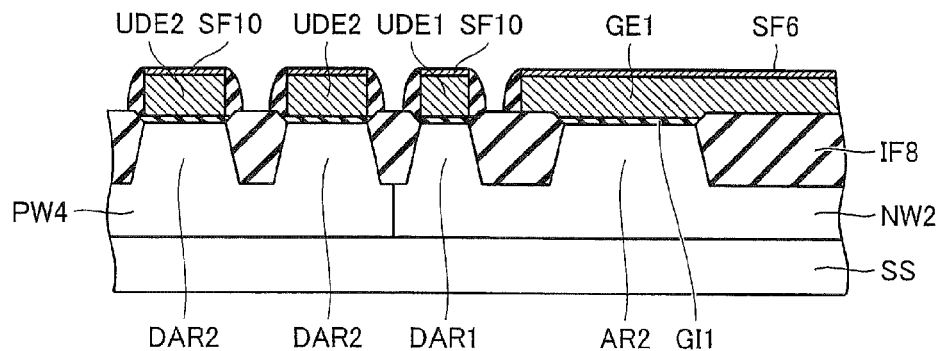
FIG. 73 is a cross-sectional view showing a manufacturing step subsequent to the manufacturing step shown in FIG. 69.

As such, according to the method of manufacturing semiconductor device 1 of the first embodiment, as shown in FIGS. 55 and 56, a variation in thickness between protection film IF11 formed on bipolar dummy electrode BD and protection film IF11 formed on the upper surfaces of MOS transistors TR1, TR2 can be reduced. Thus, protection film IF11 can be prevented from remaining on the upper surface of emitter region ER and the like when protection film IF11 positioned on base region BR is removed, as shown in FIG. 59. Consequently, as shown in FIG. 71, a variation in thickness among silicide films SF1, SF2, SF3 formed on the upper surfaces of emitter region ER, base region BR and collector region CR can be suppressed.

FIGS. 75 to 89 are cross-sectional views showing a method of manufacturing a semiconductor device without forming unit bipolar dummy electrodes UD1 to UD6 in a comparative example. The manufacturing steps shown in FIGS. 75, 76 and 77 correspond to the manufacturing steps shown in FIGS. 55, 56 and 58 in the first embodiment, respectively.

Figure 75:
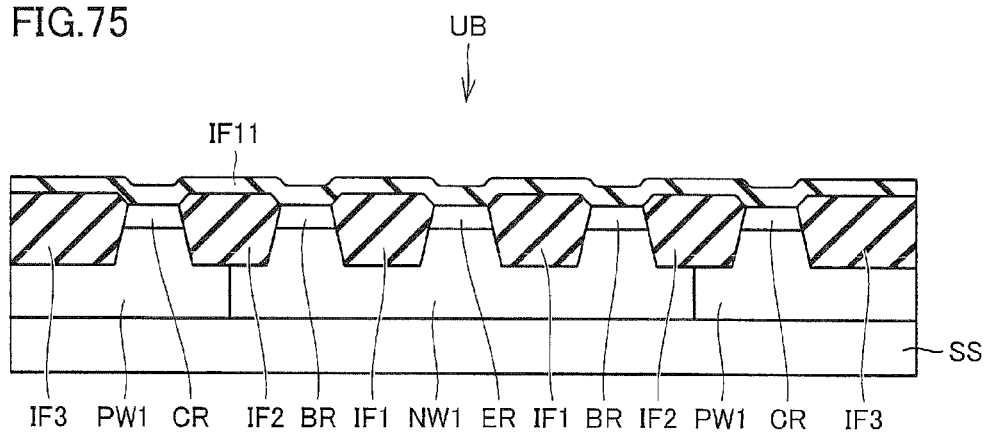
FIG. 75 is a cross-sectional view illustrating a manufacturing method in a comparative example, which shows a region where the unit bipolar transistor is formed.
Figure 76:
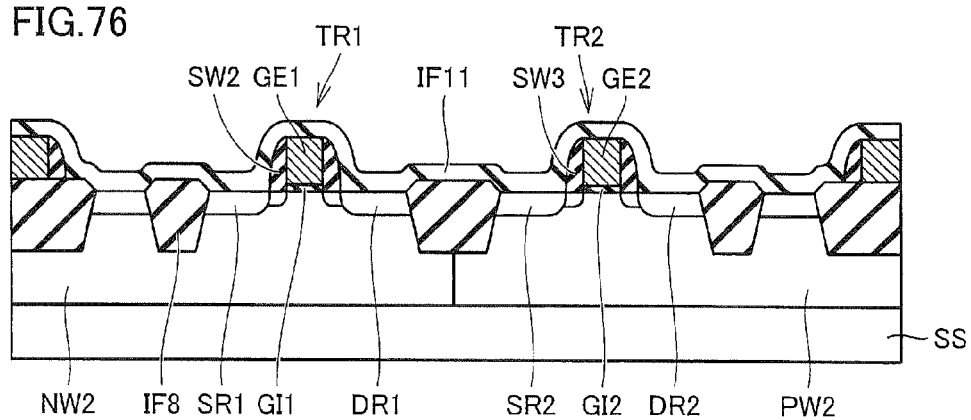
FIG. 76 is a cross-sectional view illustrating the manufacturing method in the comparative example, which shows a region where MOS transistor TR1, MOS transistor TR2 are formed.
Figure 77:
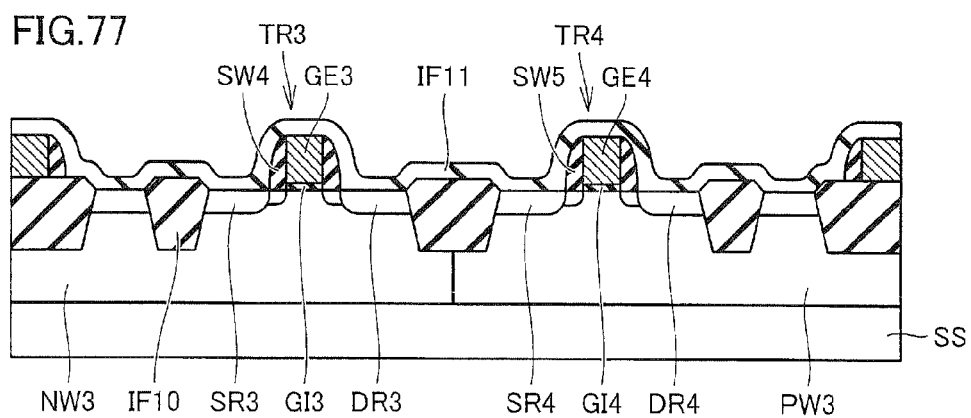
FIG. 77 is a cross-sectional view illustrating the manufacturing method in the comparative example, which shows the region where the unit bipolar transistor is formed.

As shown in FIG. 75, in the method of manufacturing a semiconductor device according to the comparative example, unlike the method of manufacturing semiconductor device 1 according to the first embodiment, unit bipolar dummy electrodes UD1 to UD6 are not formed on the upper surfaces of isolation insulating films IF1 to IF3 of unit bipolar transistor UB. As shown in FIGS. 75 to 77, protection film IF11 is formed to cover unit bipolar transistor UB not having unit bipolar dummy electrodes UD1 to UD6, and MOS transistors TR1, TR2, TR3, TR4.

In this comparative example, protection film IF11 is formed to cover the region where gate electrodes GE1 to GE4 are formed, and the region where a member projecting from the main surface of semiconductor substrate SS such as a gate electrode is not formed.

As shown in Table 1 as well, protection film IF11 is formed with a larger thickness in a region where a member projecting from semiconductor substrate SS is not formed, than in a region where a member projecting from semiconductor substrate SS is formed.

Thus, protection film IF11 formed on unit bipolar transistor UB has a thickness larger than that of protection film IF11 formed on MOS transistors TR1 to TR4.

Figure 78:
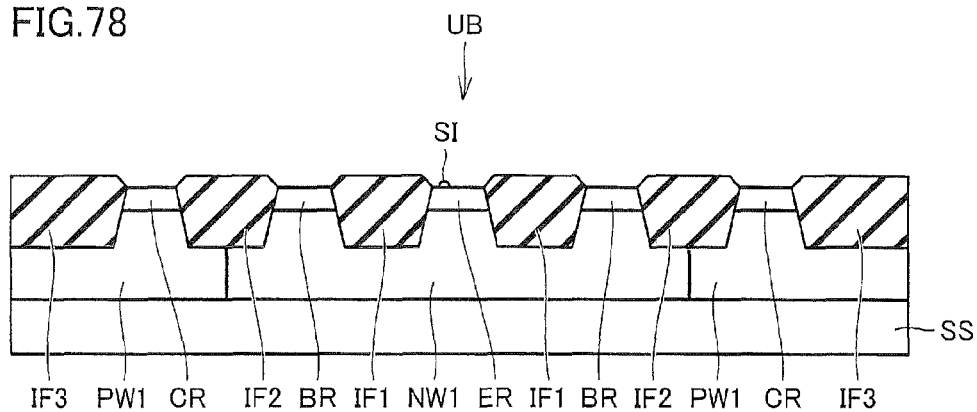
FIG. 78 is a cross-sectional view illustrating the manufacturing method in the comparative example, which shows a manufacturing step subsequent to the manufacturing step shown in FIG. 76.
Figure 79:
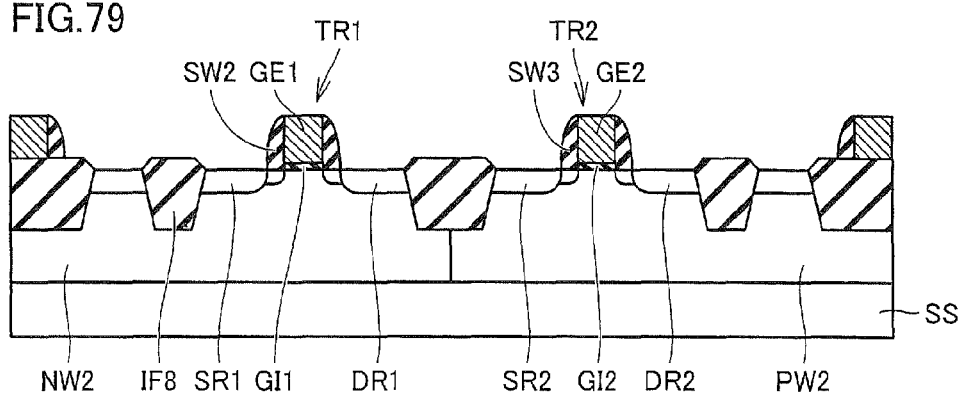
FIG. 79 is a cross-sectional view illustrating the manufacturing method in the comparative example, which shows a manufacturing step subsequent to the manufacturing step shown in FIG. 77.

Then, as shown in FIGS. 78 and 79, protection film IF11 is patterned to remove portions of protection film IF11 that were covering unit bipolar transistor UB and MOS transistors TR1, TR2.

Here, since protection film IF11 formed on unit bipolar transistor UB has a thickness larger than that of protection film IF11 formed on MOS transistors TR1, TR2, protection film IF11 may partially remain on unit bipolar transistor UB. In the example shown in FIG. 78, a remaining insulating film SI is formed on the upper surface of emitter region ER.

Figure 80:
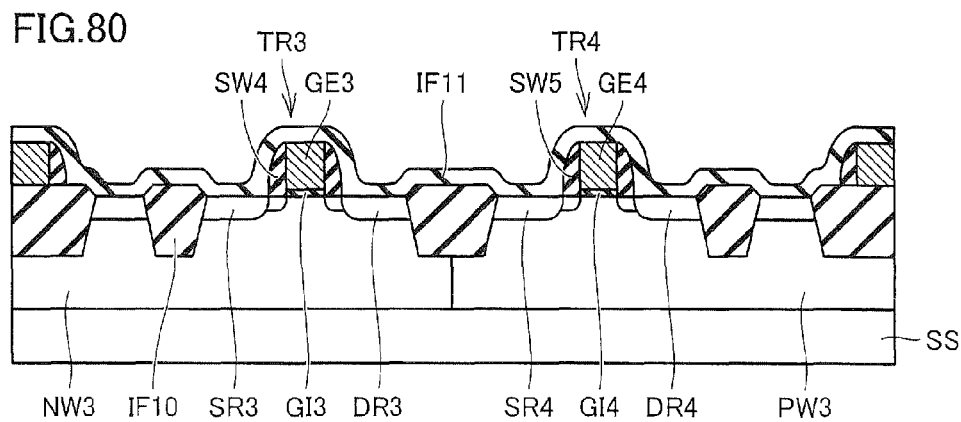
FIG. 80 is a cross-sectional view illustrating the manufacturing method in the comparative example, which shows a manufacturing step subsequent to the manufacturing step shown in FIG. 78.

As shown in FIG. 80, even after protection film IF11 is patterned, MOS transistor TR3 and MOS transistor TR4 are covered with protection film IF11.

Figure 81:
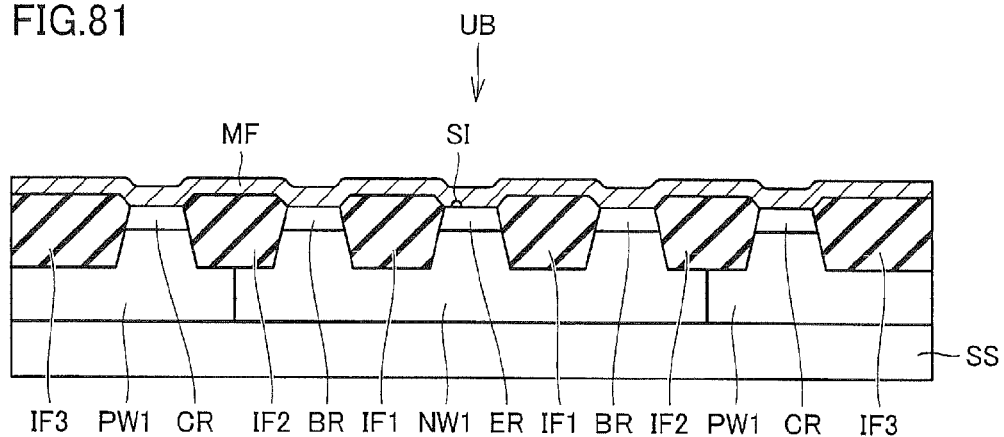
FIG. 81 is a cross-sectional view illustrating the manufacturing method in the comparative example, which shows a manufacturing step subsequent to the manufacturing step shown in FIG. 79.
Figure 82:
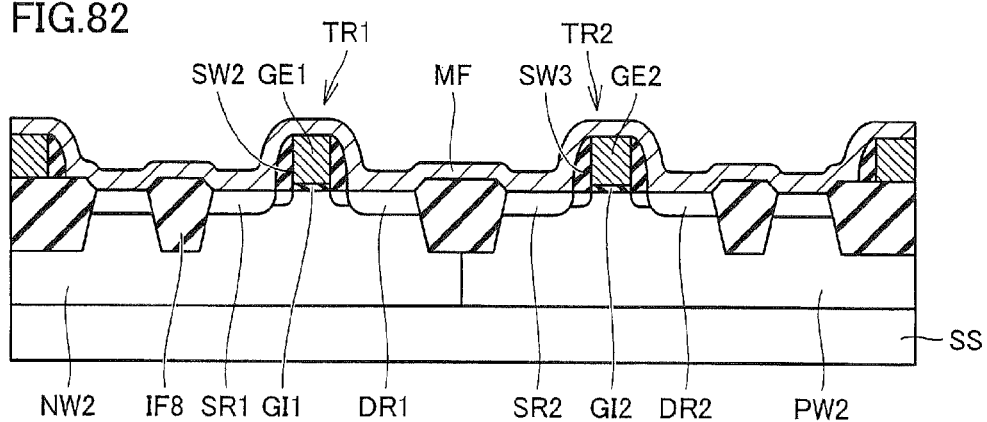
FIG. 82 is a cross-sectional view illustrating the manufacturing method in the comparative example, which shows a manufacturing step subsequent to the manufacturing step shown in FIG. 80.
Figure 83:
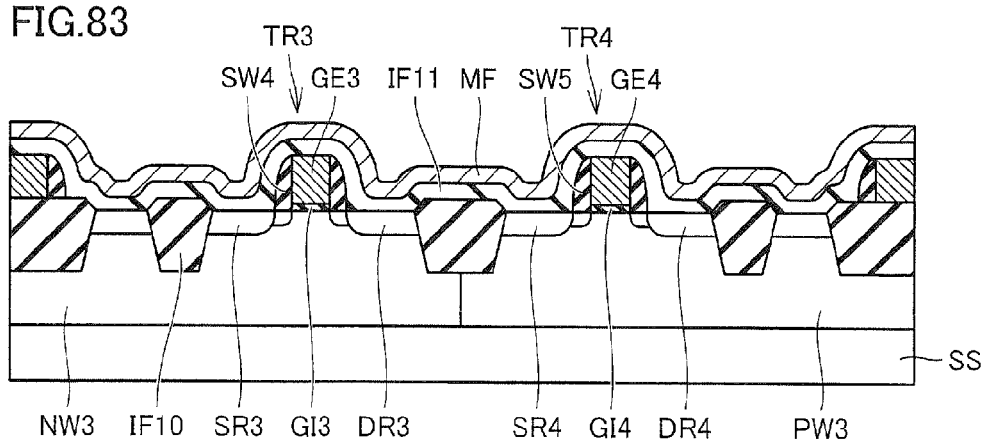
FIG. 83 is a cross-sectional view illustrating the manufacturing method in the comparative example, which shows a manufacturing step subsequent to the manufacturing step shown in FIG. 81.

Next, as shown in FIGS. 81 to 83, metal film MF is formed on the main surface of semiconductor substrate SS to cover unit bipolar transistor UB and MOS transistors TR1, TR2. As shown in FIG. 83, when forming metal film MF, protection film IF11 has been formed on semiconductor substrate SS to cover MOS transistors TR3, TR4. Thus, in the portions of semiconductor substrate SS where MOS transistors TR3, TR4 have been formed, metal film MF is deposited on the upper surface of protection film IF11.

Figure 84:
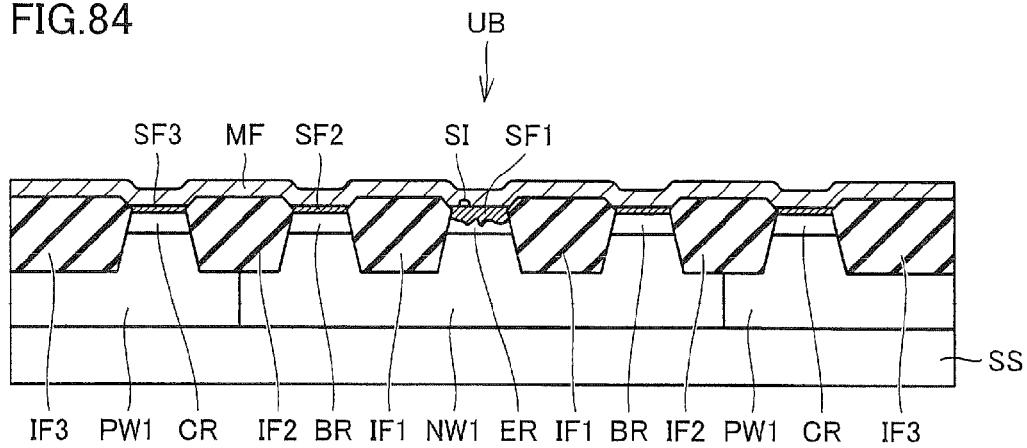
FIG. 84 is a cross-sectional view illustrating the manufacturing method in the comparative example, which shows a manufacturing step subsequent to the manufacturing step shown in FIG. 82.

Next, as shown in FIG. 84, metal film MF is heated to form silicide film SF1, silicide film SF2 and silicide film SF3 on the upper surfaces of emitter region ER, base region BR and collector region CR, respectively. Here, since remaining insulating film SI has been formed on the upper surface of emitter region ER, metal film MF positioned on the upper surface of emitter region ER and on emitter region ER varies in temperature. As a result, as shown in FIG. 84, silicide film SF1 formed on emitter region ER varies in thickness.

Figure 85:
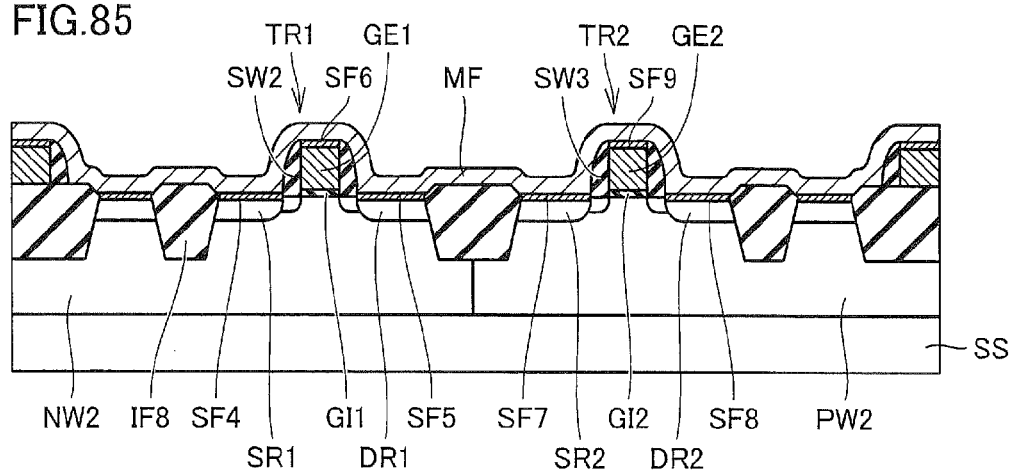
FIG. 85 is a cross-sectional view illustrating the manufacturing method in the comparative example, which shows a manufacturing step subsequent to the manufacturing step shown in FIG. 83.
Figure 86:
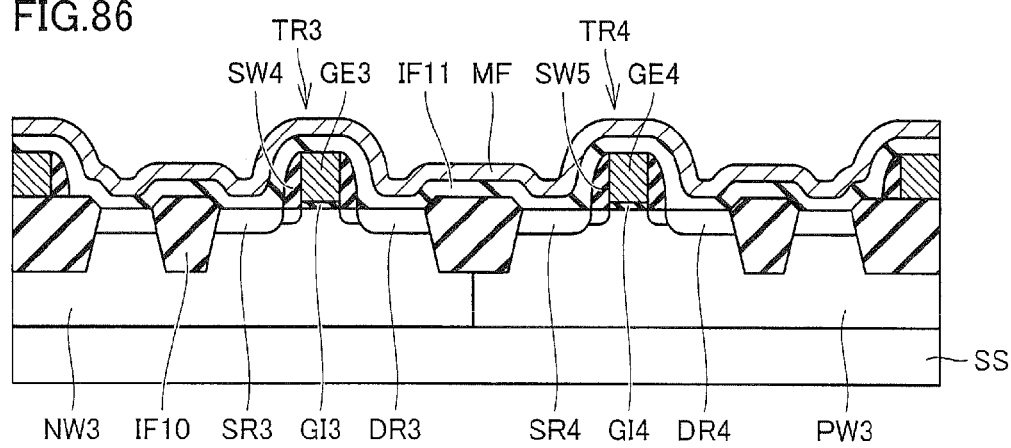
FIG. 86 is a cross-sectional view illustrating the manufacturing method in the comparative example, which shows a manufacturing step subsequent to the manufacturing step shown in FIG. 84.
Figure 87:
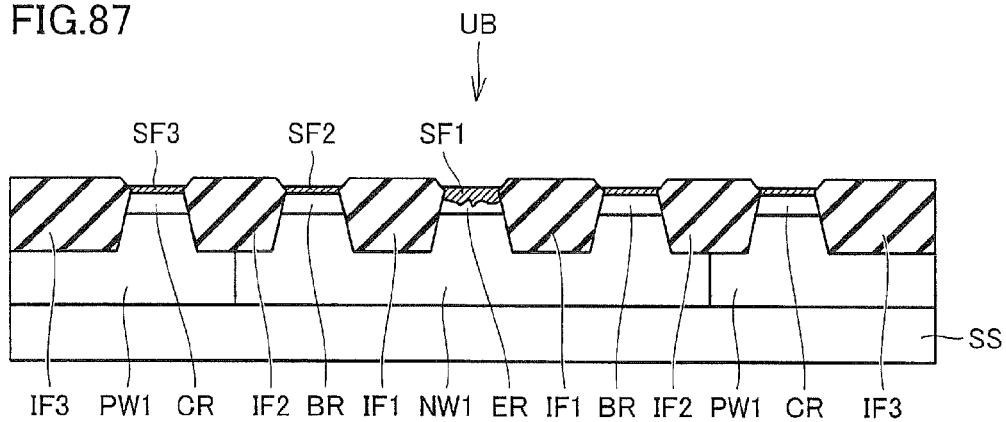
FIG. 87 is a cross-sectional view illustrating the manufacturing method in the comparative example, which shows a manufacturing step subsequent to the manufacturing step shown in FIG. 85.
Figure 88:
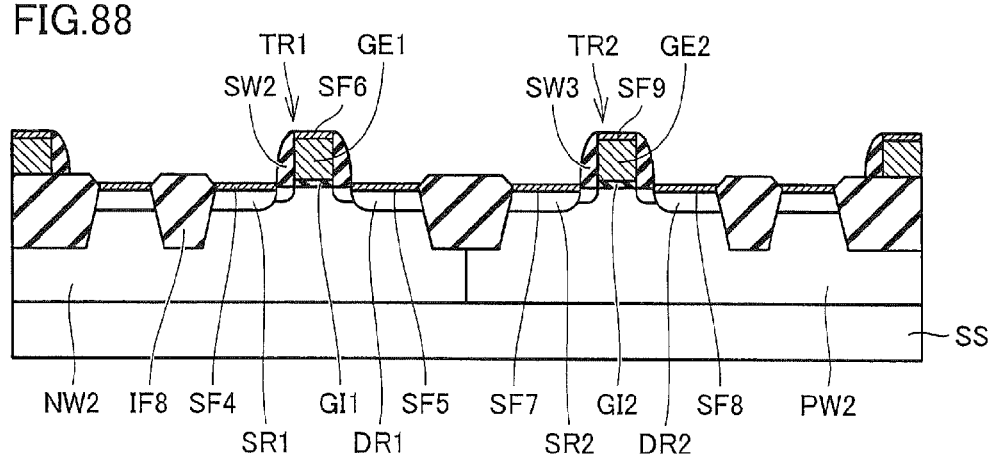
FIG. 88 is a cross-sectional view illustrating the manufacturing method in the comparative example, which shows a manufacturing step subsequent to the manufacturing step shown in FIG. 86.
Figure 89:
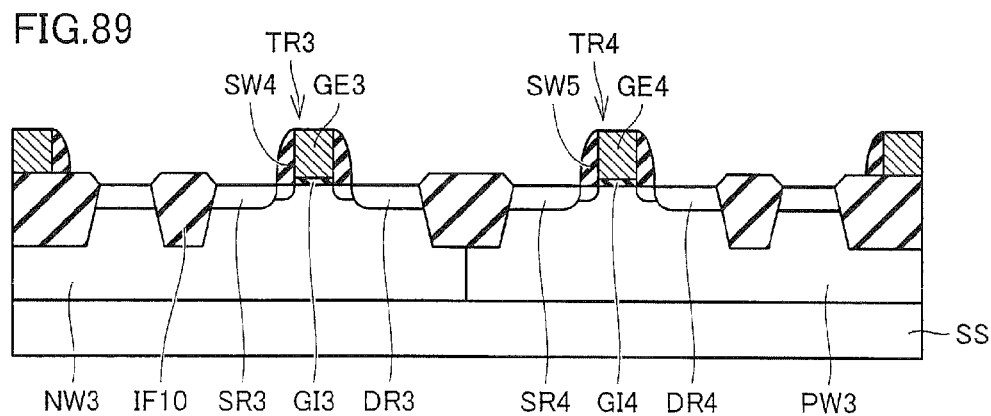
FIG. 89 is a cross-sectional view illustrating the manufacturing method in the comparative example, which shows a manufacturing step subsequent to the manufacturing step shown in FIG. 87.

As shown in FIG. 85, metal film MF is heated to form silicide film SF4 on the upper surface of source region SR1, silicide film SF6 on the upper surface of gate electrode GE1, and silicide film SF5 on the upper surface of drain region DR1. Silicide film SF7 is formed on the upper surface of source region SR2, silicide film SF9 is formed on the upper surface of gate electrode GE2, and silicide film SF8 is formed on the upper surface of drain region DR2. As shown in FIG. 86, MOS transistors TR3, TR4 are covered with protection film IF11. Thus, a silicide film is not formed on the upper surfaces of gate electrode GE3, GE4, source regions SR3, SR4, and drain regions DR3, DR4 of MOS transistors TR3, TR4, respectively. Then, as shown in FIGS. 87 to 89, metal film MF and protection film IF11 are removed.

Figure 90:
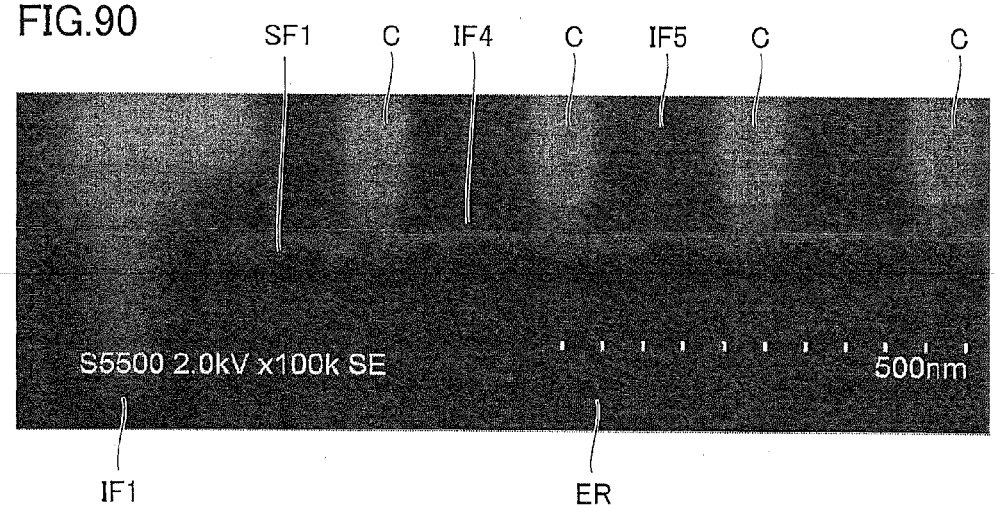
FIG. 90 is a SEM (scanning electron microscope sem) picture showing emitter region ER of unit bipolar transistor UB in a semiconductor device fabricated with the manufacturing method in the comparative example.

FIG. 90 is a cross-sectional view of the semiconductor device formed through the manufacturing steps shown in FIGS. 75 to 89, and is particularly a SEM picture showing emitter region ER of unit bipolar transistor UB. FIG. 158 is a schematic diagram schematically showing the SEM picture shown in FIG. 90. In the SEM picture shown in FIG. 90, silicide film SF1 is formed on the upper surface of emitter region ER, with the plurality of connection members C connected to silicide film SF1.

As shown in FIG. 90, silicide film SF1 formed on emitter region ER is widely diffused in emitter region ER. Furthermore, silicide film SF1 greatly varies in thickness with the position, and thus has a non-uniform thickness.

The reason that silicide film SF1 is widely diffused in emitter region ER and has a non-uniform thickness is because remaining insulating film SI is formed on emitter region ER.

Since protection film IF11 is formed with a large thickness on unit bipolar transistor UB, remaining insulating film SI may be formed not only on emitter region ER, but also on base region BR and collector region CR.

If remaining insulating film SI is formed on the upper surfaces of base region BR and collector region CR, silicide film SF2 formed on base region BR and silicide film SF3 formed on collector region CR are widely diffused in base region BR and collector region CR, and have a non-uniform thickness.

As such, according to the method of manufacturing semiconductor device 1 of the first embodiment, silicide films SF1, SF2, SF3 formed on unit bipolar transistor UB can have a desired uniform thickness, as compared to the method of manufacturing a semiconductor device in the comparative example.

Figure 91:
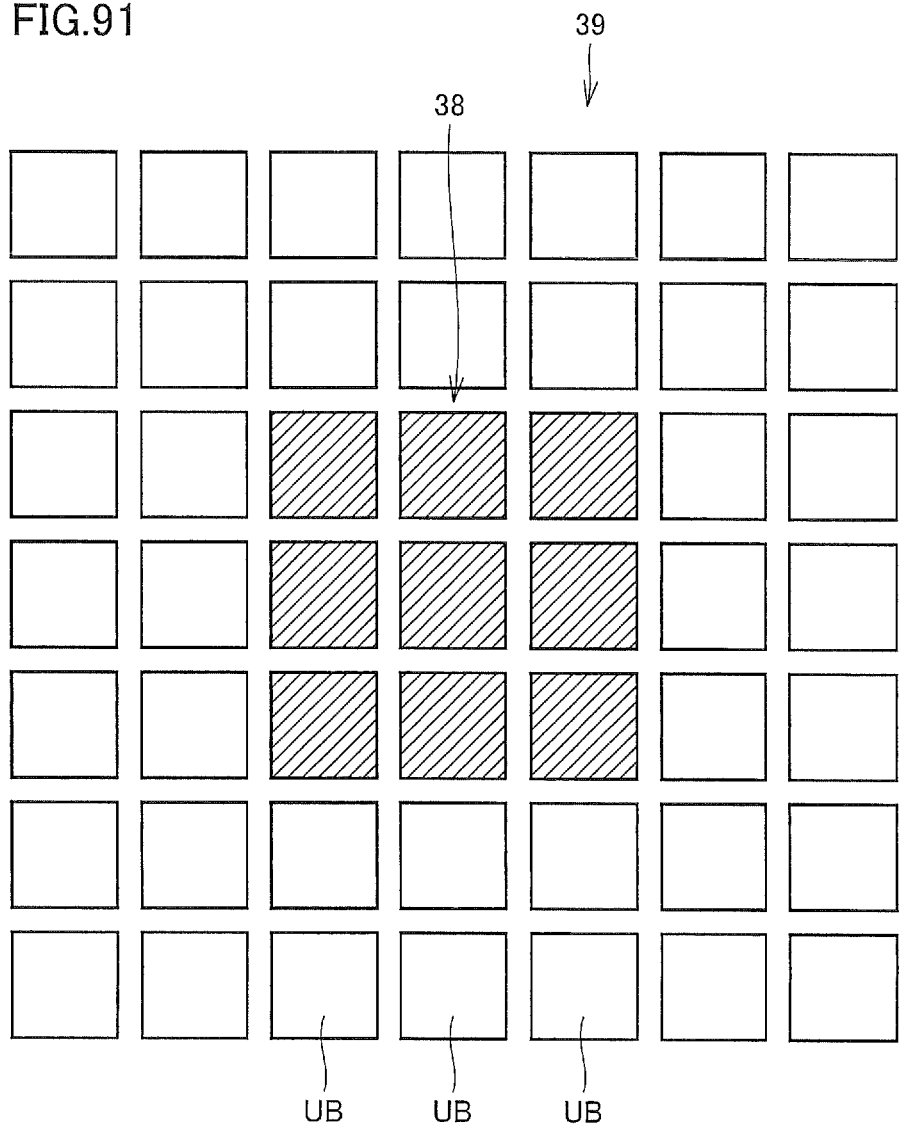
FIG. 91 is a plan view of the case where a unit bipolar transistor positioned in a central portion is utilized as a unit bipolar transistor UB2.

Since silicide films SF1, SF2, SF3 can have a desired uniform thickness according to the method of manufacturing semiconductor device 1 of the first embodiment, the centrally positioned one of unit bipolar transistors UB arranged in an array may be utilized as unit bipolar transistor UB1, instead of being utilized as dummy unit bipolar transistor DUB as shown in FIG. 4. FIG. 91 is a plan view of the case where the centrally positioned one of the unit bipolar transistors is utilized as unit bipolar transistor UB2. It has been found that the non-uniformity of the thickness of silicide film SF1 as shown in FIG. 90 is particularly noticeable in emitter region ER with regard to centrally positioned unit bipolar transistor UB1. Therefore, dummy gate electrode UD according to the first embodiment may be used only for centrally positioned unit bipolar transistor UB1. In order to obtain good device characteristics, dummy unit bipolar transistors DUB may be arranged around PNP bipolar transistor 39.

Second Embodiment

Referring to FIGS. 92 to 97, semiconductor device 1 according to a second embodiment and a method of manufacturing the semiconductor device will be described. In FIGS. 92 to 97, the same reference signs are used to indicate elements the same as or corresponding to those shown in FIGS. 1 to 92, and descriptions thereof may not be repeated.

Figure 92:
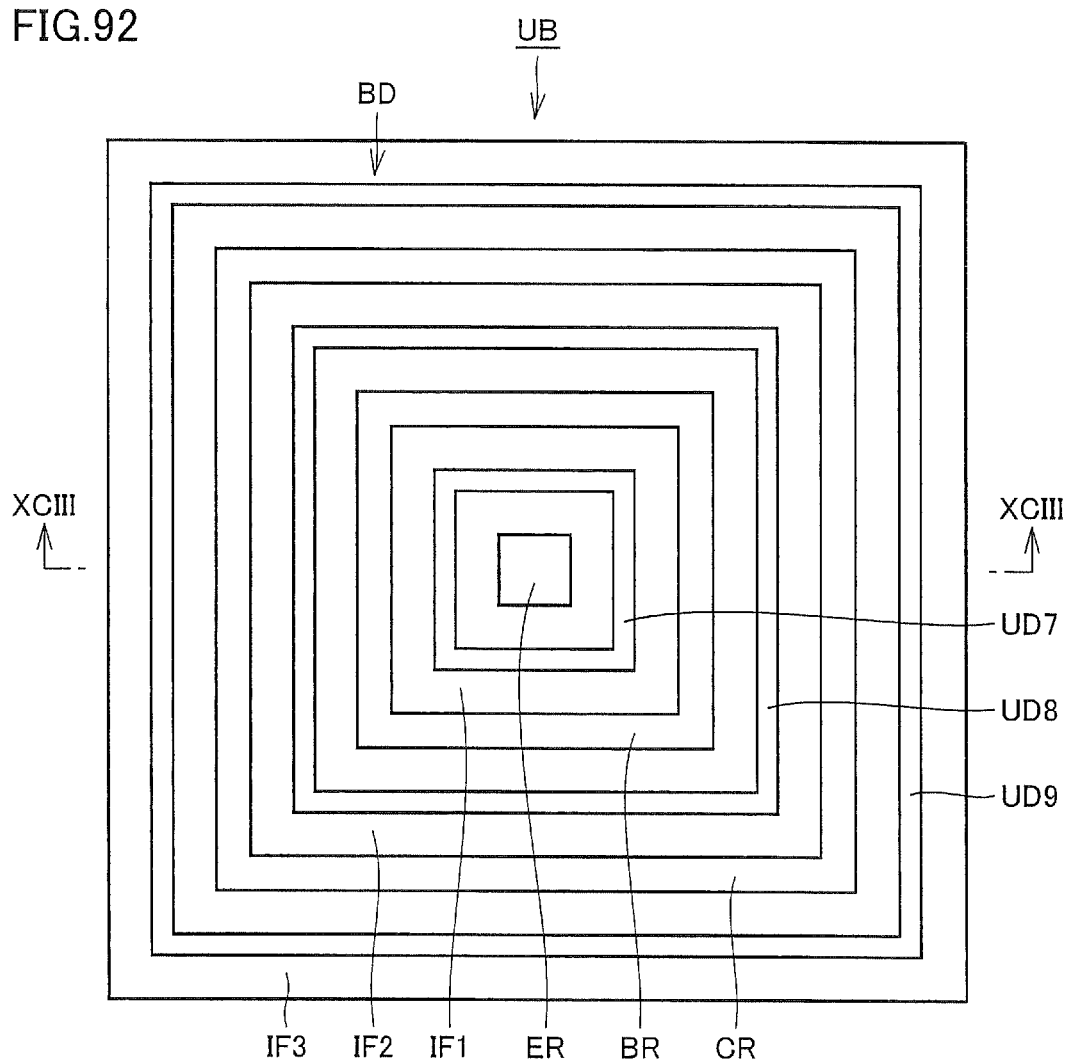
FIG. 92 is a plan view of unit bipolar transistor UB provided in semiconductor device 1 according to a second embodiment.

FIG. 92 is a plan view of unit bipolar transistor UB provided in semiconductor device 1 according to the second embodiment.

As shown in FIG. 92, on the main surface of the semiconductor substrate, emitter region ER, isolation insulating film IF1 surrounding the periphery of emitter region ER, and base region BR surrounding the periphery of isolation insulating film IF1 are formed. In addition, isolation insulating film IF2 surrounding the periphery of base region BR, collector region CR surrounding the periphery of isolation insulating film IF2, and isolation insulating film IF3 surrounding the periphery of collector region CR are formed.

A unit bipolar dummy electrode UD7 having an annular shape is formed on the upper surface of isolation insulating film IF1, and a unit bipolar dummy electrode UD8 having an annular shape is formed on the upper surface of isolation insulating film IF2. A unit bipolar dummy electrode UD9 is formed on the upper surface of isolation insulating film IF3.

Figure 93:
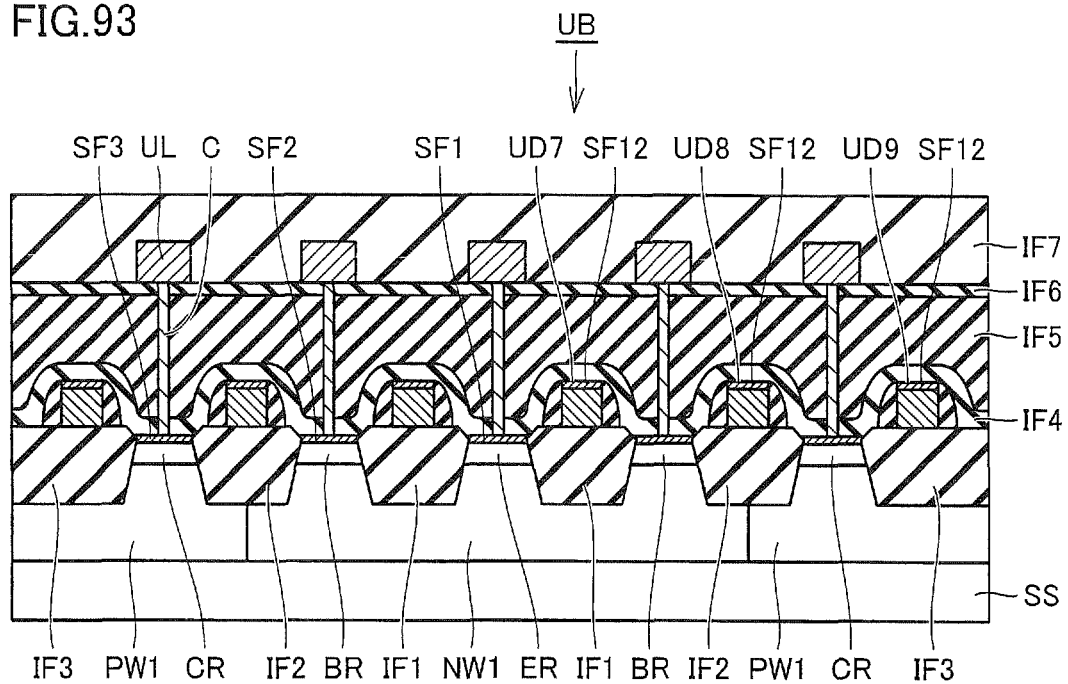
FIG. 93 is a cross-sectional view taken along the line XCIII-SCIII shown in FIG. 92.

FIG. 93 is a cross-sectional view taken along the line XCIII-SCIII shown in FIG. 92. As shown in FIG. 93, a silicide film SF12 such as cobalt silicide or nickel silicide is formed on the upper surfaces of unit bipolar dummy electrodes UD7 to UD9.

Figure 94:
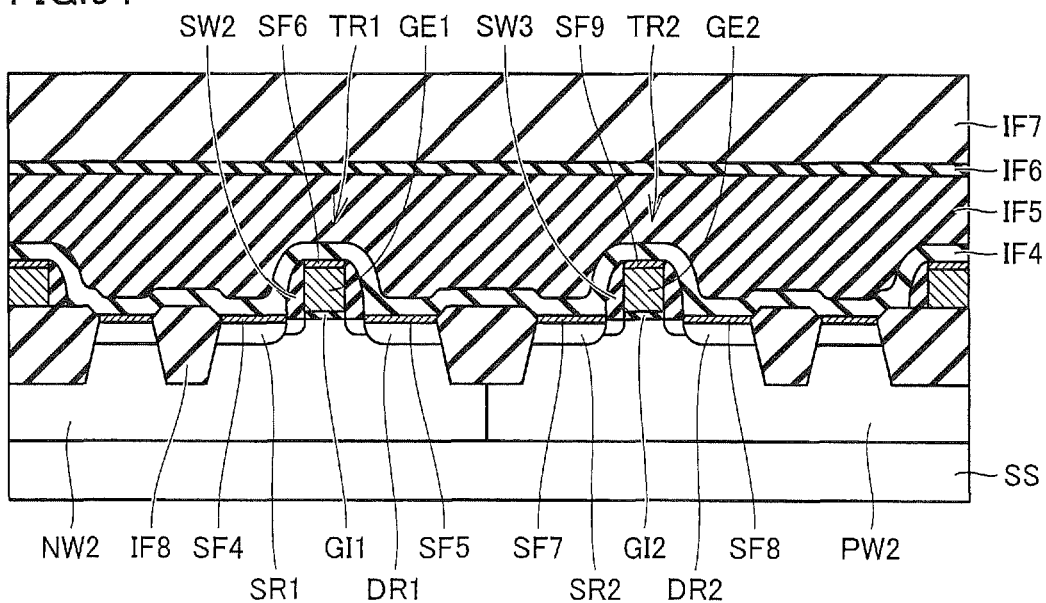
FIG. 94 is a cross-sectional view showing MOS transistors TR1, TR2.
Figure 95:
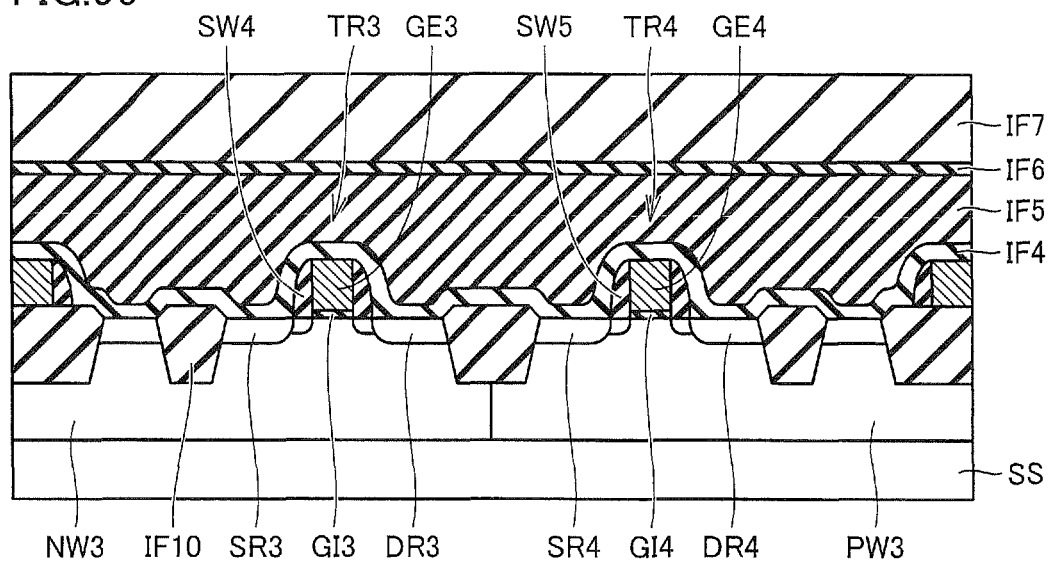
FIG. 95 is a cross-sectional view showing MOS transistors TR3, TR4.

As shown in FIG. 94, in semiconductor device 1 according to the second embodiment as well, MOS transistors TR1, TR2 having the silicide films are arranged in system control logic 8, RAM 3 and the CPU, while MOS transistor TR3 and MOS transistor TR4 shown in FIG. 95 are formed in peripheral circuit unit 12, input/output circuit 9 and power supply circuit 34.

As such, in semiconductor device 1 according to the second embodiment as well, in the step of depositing protection film IF11 as shown in FIGS. 55 to 58, unit bipolar dummy electrodes UD7, UD8, UD9 have been formed on the upper surfaces of isolation insulating films IF1, IF2, IF3, respectively. Thus, a variation in thickness between protection film IF11 formed on unit bipolar transistor UB, protection film IF11 formed on the upper surfaces of MOS transistors TR1, TR2, and protection film IF11 formed on the upper surfaces of MOS transistors TR3, TR4 can be suppressed.

Particularly, in the method of manufacturing semiconductor device 1 according to the second embodiment, unit bipolar dummy electrodes UD7, UD8, UD9 are formed in an annular shape, as shown in FIG. 92. Thus, an increase in thickness of protection film IF 11 formed on the upper surfaces of emitter region ER, base region BR and collector region CR can be suppressed.

Figure 96:
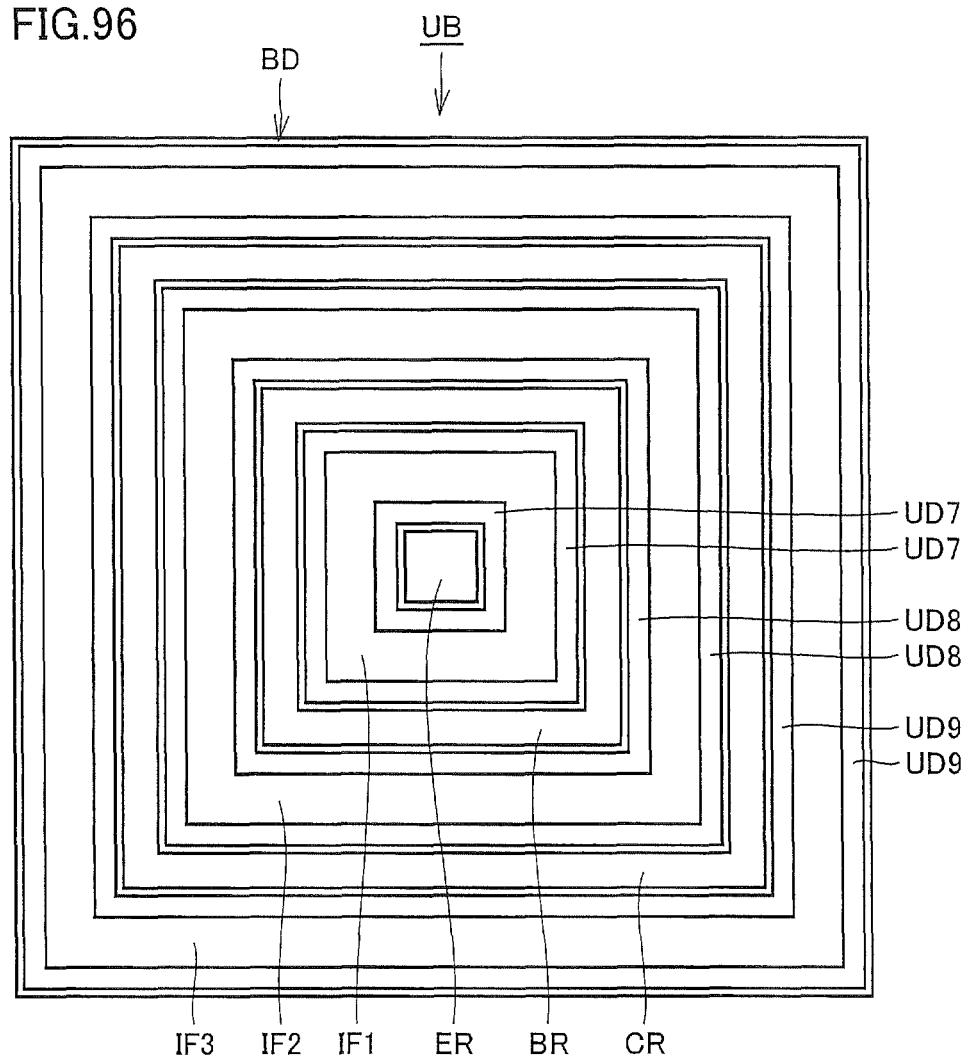
FIG. 96 is a plan view showing a first modification of a bipolar dummy electrode BD.

FIG. 96 is a plan view showing a first modification of bipolar dummy electrode BD. In the example shown in FIG. 96, a plurality of unit bipolar dummy electrodes UD7 having an annular shape are formed on the upper surface of isolation insulating film IF1. A plurality of unit bipolar dummy electrodes UD8 having an annular shape are formed on the upper surface of isolation insulating film IF2, and a plurality of unit bipolar dummy electrodes UD9 having an annular shape are formed on the upper surface of isolation insulating film IF3.

Figure 97:
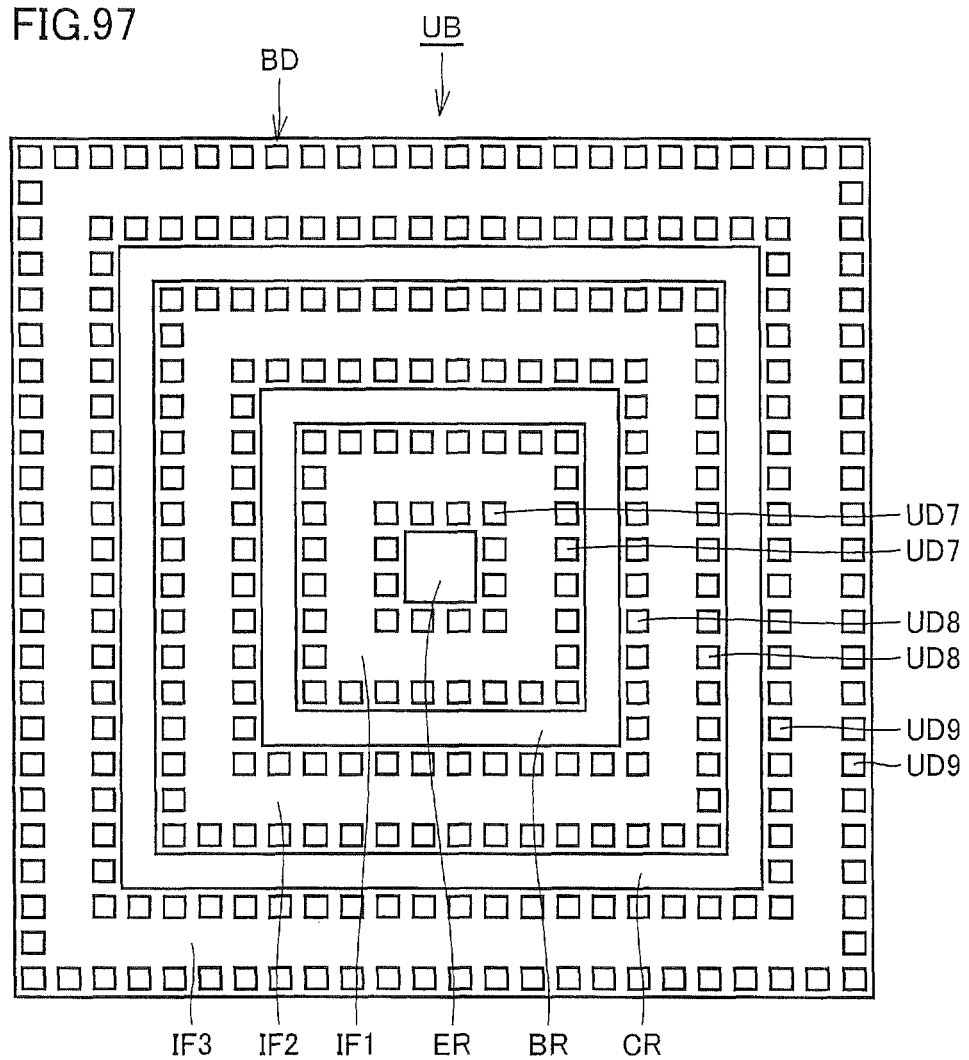
FIG. 97 is a plan view showing a second modification of bipolar dummy electrode BD.

FIG. 97 is a plan view showing a second modification of bipolar dummy electrode BD. In the example shown in FIG. 97, a plurality of unit bipolar dummy electrodes UD7 are formed on the upper surface of isolation insulating film IF1. A plurality of unit bipolar dummy electrodes UD8 are formed on the upper surface of isolation insulating film IF2. A plurality of unit bipolar dummy electrodes UD9 are formed on the upper surface of isolation insulating film IF3.

Third Embodiment

Referring to FIGS. 98 to 136, semiconductor device 1 according to a third embodiment will be described. In FIGS. 98 to 136, the same reference signs are used to indicate elements the same as or corresponding to those shown in FIGS. 1 to 97, and descriptions thereof may not be repeated.

In the third embodiment, an example where a gate last process is employed to the gate electrodes of the MOS transistors will be described.

Figure 98:
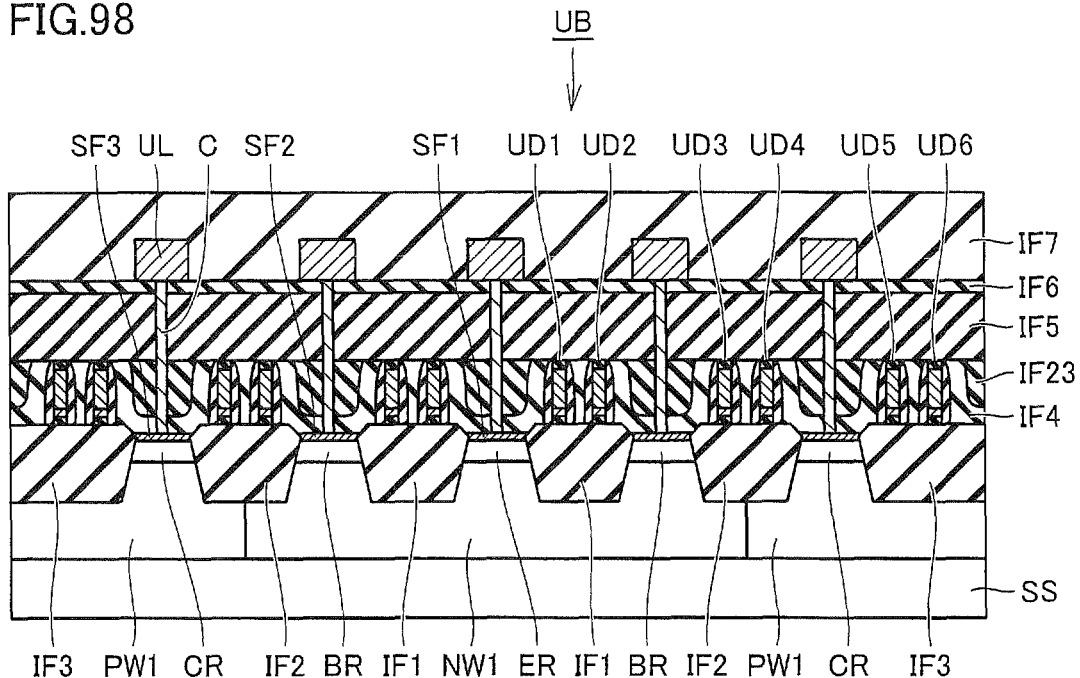
FIG. 98 is a cross-sectional view of unit bipolar transistor UB in semiconductor device 1 according to a third embodiment.
Figure 99:
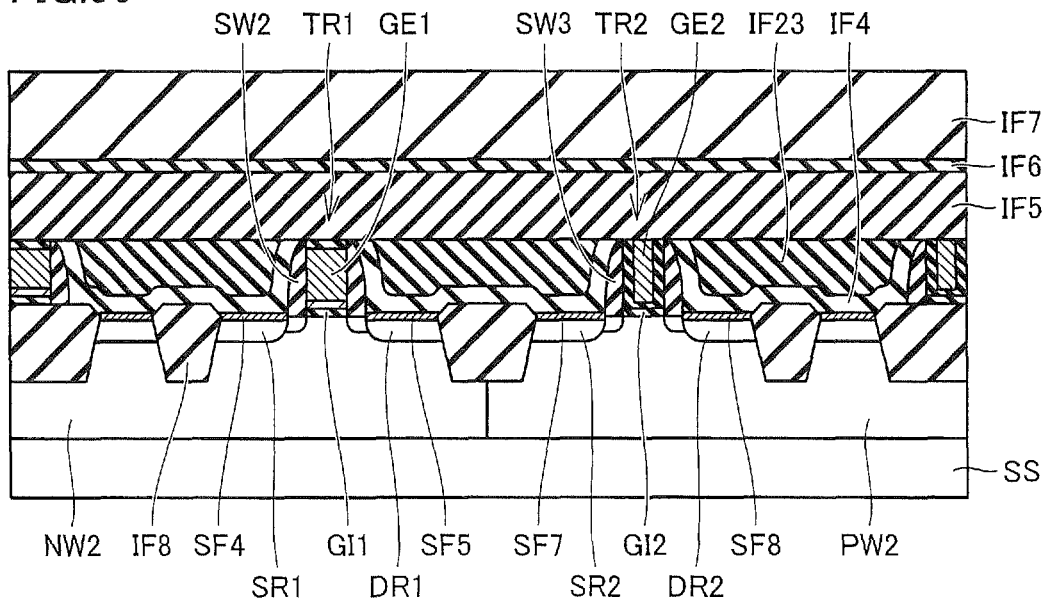
FIG. 99 is a cross-sectional view showing MOS transistor TR1 and MOS transistor TR2.
Figure 100:
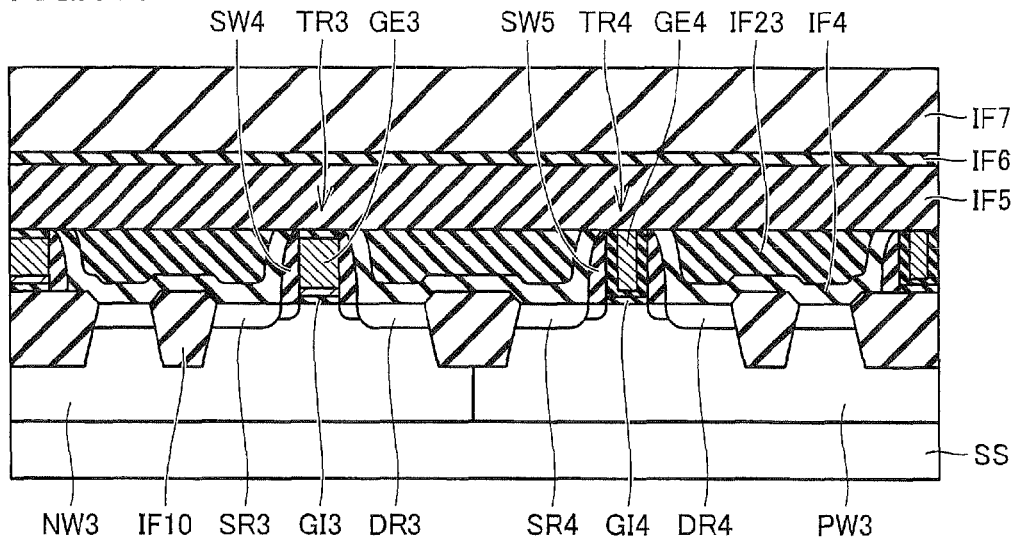
FIG. 100 is a cross-sectional view showing MOS transistor TR3 and MOS transistor TR4.

FIG. 98 is a cross-sectional view of unit bipolar transistor UB in semiconductor device 1 according to the third embodiment. FIG. 99 is a cross-sectional view showing MOS transistor TR1 and MOS transistor TR2. FIG. 100 is a cross-sectional view showing MOS transistor TR3 and MOS transistor TR4.

As shown in FIG. 98, in the semiconductor device according to the third embodiment as well, as with the first and second embodiments, unit bipolar dummy electrodes UD1, UD2 are formed on the upper surface of isolation insulating film IF1 of unit bipolar transistor UB, unit bipolar dummy electrodes UD3, UD4 are formed on the upper surface of isolation insulating film IF2, and unit bipolar dummy electrodes UD5, UD6 are formed on the upper surface of isolation insulating film IF3.

In the third embodiment as well, unit bipolar transistor UB includes silicide film SF1 formed on the upper surface of emitter region ER, silicide film SF2 formed on the upper surface of base region BR, and silicide film SF3 formed on the upper surface of collector region CR.

Connection members C are connected to silicide films SF1 to SF3 to reduce contact resistance.

MOS transistor TR1 and MOS transistor TR2 shown in FIG. 99 are provided in CPU 2 and RAM 3 shown in FIG. 1, for example. In the semiconductor device according to the third embodiment as well, MOS transistor TR1 includes silicide film SF4 formed on the upper surface of source region SR1, and silicide film SF5 formed on the upper surface of drain region DR1. Likewise, MOS transistor TR2 includes silicide film SF7 formed on the upper surface of source region SR2, and silicide film SF8 formed on the upper surface of drain region DR2.

As such, resistance is reduced in source regions SR1, SR2 and drain regions DR1, DR2 of MOS transistors TR1, TR2, respectively.

On the other hand, a silicide film is not formed on the upper surface of gate electrode GE1 of MOS transistor TR1 and the upper surface of gate electrode GE2 of MOS transistor TR2.

FIG. 100 is a cross-sectional view showing MOS transistor TR3 and MOS transistor TR4. As shown in FIG. 100, a silicide film is not formed on MOS transistor TR3 and MOS transistor TR4.

Figure 101:
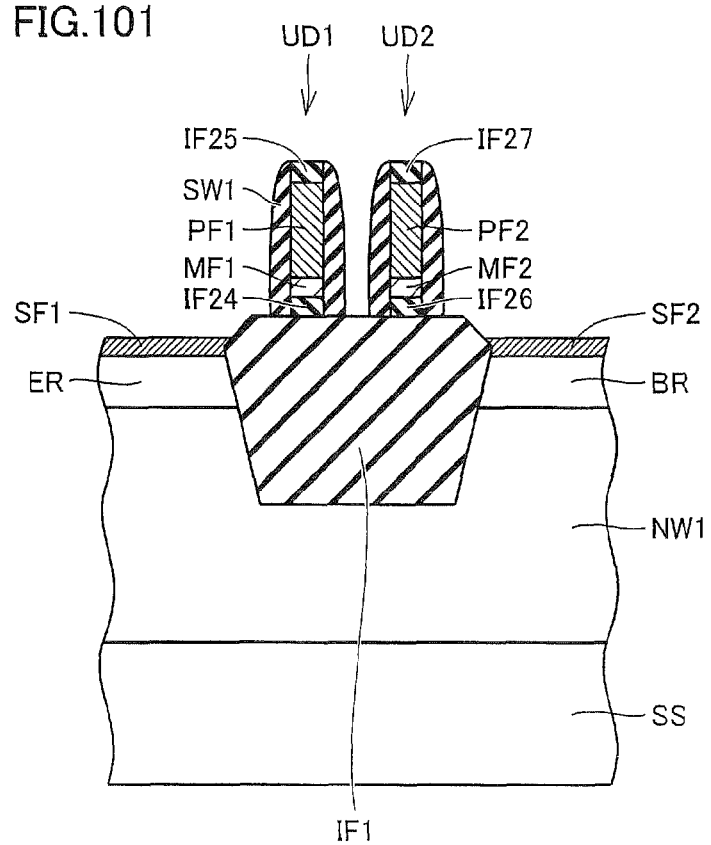
FIG. 101 is a cross-sectional view showing unit bipolar dummy electrodes UD1, UD2.
Figure 102:
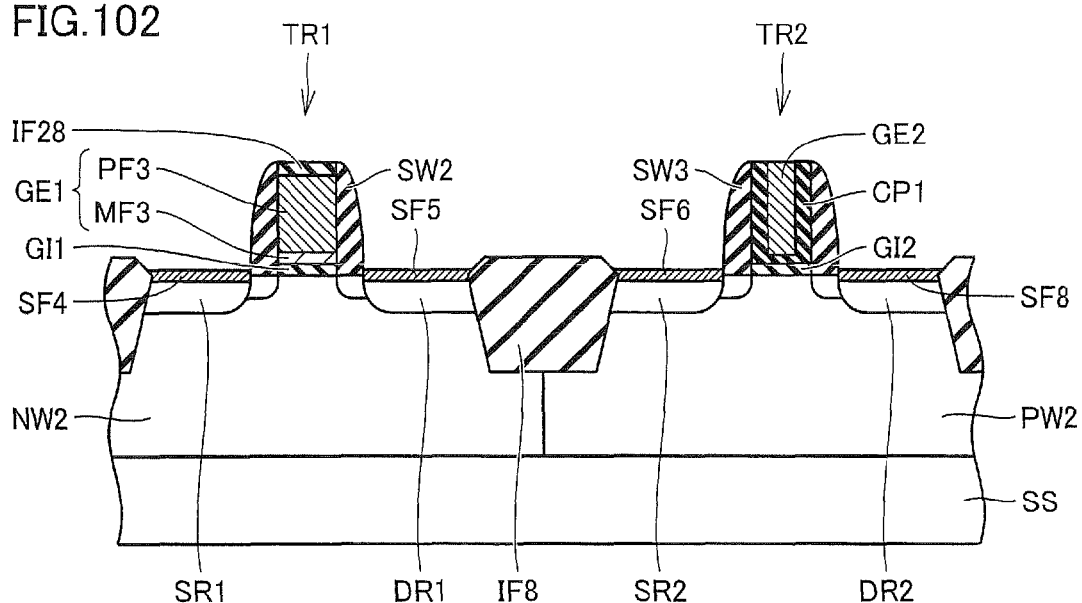
FIG. 102 is a cross-sectional view showing the MOS transistors.
Figure 103:
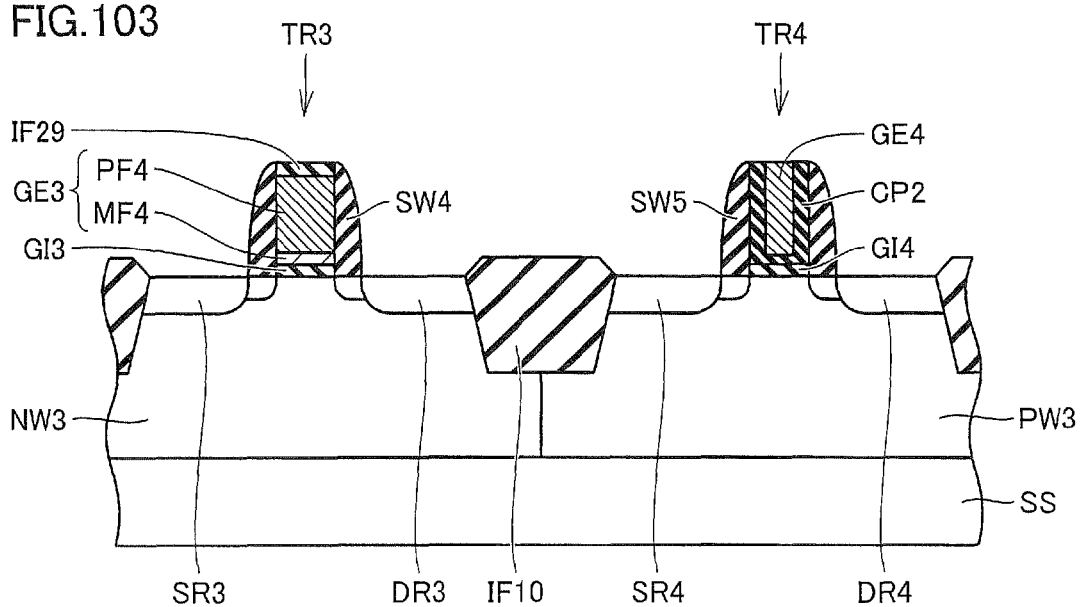
FIG. 103 is a cross-sectional view showing the MOS transistors.

Referring now to FIGS. 101 to 103, the structure of unit bipolar dummy electrodes UD1, UD2 and the structure of MOS transistors TR1 and TR4 will be described in detail.

FIG. 101 is a cross-sectional view showing unit bipolar dummy electrodes UD1, UD2. As shown in FIG. 101, unit bipolar dummy electrode UD1 includes an insulating film IF24 formed on the upper surface of isolation insulating film IF1, a metal film MF1 formed on the upper surface of insulating film IF24, a polysilicon film PF1 formed on the upper surface of metal film MF1, an insulating film IF25 formed on the upper surface of polysilicon film PF1, and sidewall SW1.

Likewise, unit bipolar dummy electrode UD2 includes an insulating film IF26 formed on the upper surface of isolation insulating film IF1, a metal film MF2 formed on the upper surface of insulating film IF26, a polysilicon film PF2 formed on the upper surface of metal film MF2, an insulating film IF27 formed on the upper surface of polysilicon film PF2, and a sidewall.

Insulating films IF24, IF26 are made of a material having a high dielectric constant (High-k) such as nitrided hafnium silicate (HfSiON). Metal film MF 1 and metal film MF2 are made of titanium nitride (TiN), for example. Insulating films IF 25, IF27 are made of silicon nitride (SiN), for example.

The other unit bipolar dummy electrodes UD3 to UD6 shown in FIG. 98 are structured in a manner similar to unit bipolar dummy electrodes UD1, UD2.

As shown in FIG. 102, MOS transistor TR1 includes gate insulating film GI1 formed on the upper surface of N well NW2, gate electrode GE1 formed on the upper surface of gate insulating film GI1, an insulating film IF28 formed on gate electrode GE1, and sidewall SW2.

Gate insulating film GI1 is made of a material having a high dielectric constant (High-k) such as HfSiON. Gate electrode GE1 includes a metal film MF3 formed on gate insulating film GI1, and a polysilicon film PF3 formed on metal film MF3. Metal film MF3 is made of titanium nitride (TiN), for example. Insulating film IF28 is made of silicon nitride (SiN), for example.

MOS transistor TR2 includes gate insulating film GI2 formed on the upper surface of P well PW2, a cap film CP1, gate electrode GE2, and sidewall SW3. Gate insulating film GI2 is made of a material having a high dielectric constant (High-k) such as HfSiON. Sidewall SW3 is formed on opposing sides of gate insulating film GI2, and cap film CP1 is formed on the inner surface of sidewall SW3 and the upper surface of gate insulating film GI2. Cap film CP1 is made of a lanthanum compound (La compound), for example. Gate electrode GE2 is made of polysilicon or a metallic material.

FIG. 103 is a cross-sectional view showing MOS transistors TR3, TR4. As shown in FIG. 103, MOS transistor TR3 includes gate insulating film GI3 formed on the upper surface of N well NW3, gate electrode GE3, an insulating film IF29 formed on the upper surface of gate electrode GE3, and sidewall SW4 formed on the side surfaces of gate electrode GE3.

Gate insulating film GI3 is made of a material having a high dielectric constant (High-k) such as HfSiON. A metal film MF4 is made of titanium nitride (TiN), for example. Insulating film IF29 is made of silicon nitride (SiN), for example.

MOS transistor TR4 includes gate insulating film GI4 formed on the upper surface of P well PW3, sidewall SW5 formed on opposing sides of gate insulating film GI4, a cap film CP2, and gate electrode GE4. Cap film CP2 is formed on the inner surface of sidewall SW5 and the upper surface of gate insulating film GI4. Gate insulating film GI4 is made of a material having a high dielectric constant (High-k) such as HfSiON. Cap film CP2 is made of a lanthanum compound (La compound), for example. Gate electrode GE4 is made of polysilicon or a metallic material.

Figure 104:
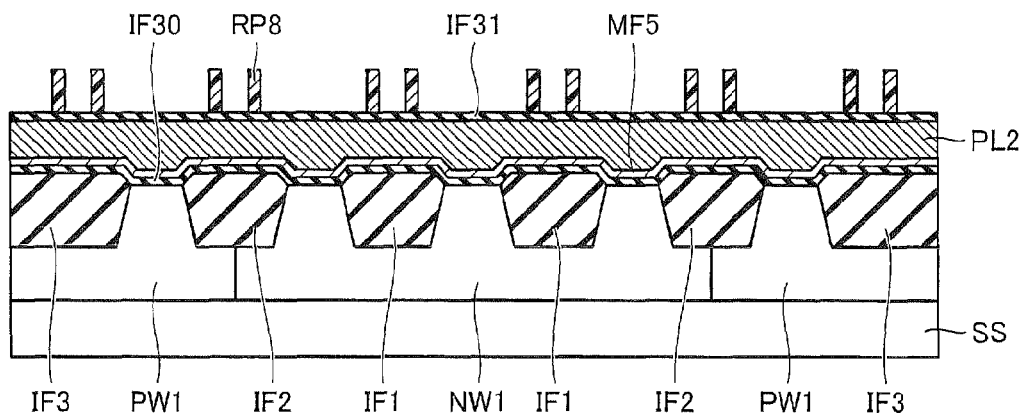
FIG. 104 is a cross-sectional view showing a manufacturing step of semiconductor device 1 according to the third embodiment, which illustrates a portion where the unit bipolar transistor is formed.
Figure 105:
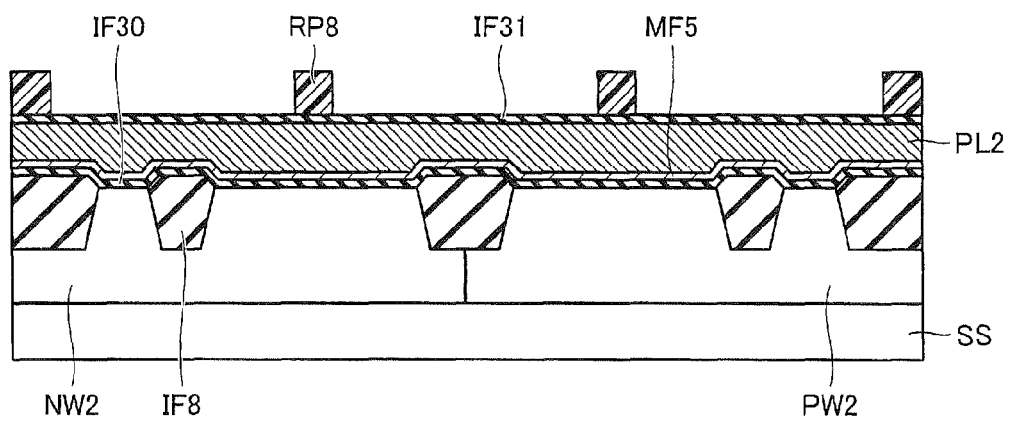
FIG. 105 is a cross-sectional view showing a manufacturing step of semiconductor device 1 according to the third embodiment, which illustrates a portion where the MOS transistors are formed.
Figure 106:
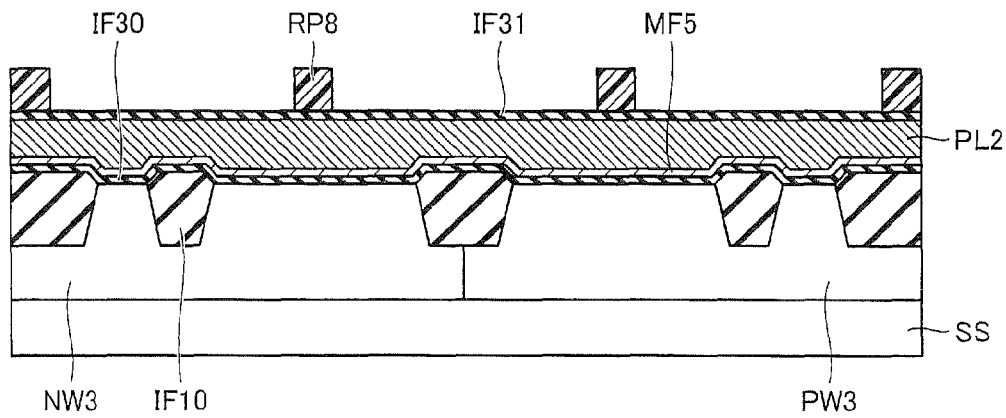
FIG. 106 is a cross-sectional view showing a manufacturing step of semiconductor device 1 according to the third embodiment, which illustrates a portion where the MOS transistors are formed.

Referring to FIGS. 104 to 127, a method of manufacturing semiconductor device 1 according to the third embodiment will be described, FIG. 104 is a cross-sectional view showing a step subsequent to the manufacturing step shown in FIG. 13 described in the first embodiment, which illustrates a region where unit bipolar transistor UB is formed. FIG. 105 is a cross-sectional view showing a region where MOS transistors TR1, TR2 are formed in the manufacturing step shown in FIG. 104. FIG. 106 is a cross-sectional view showing a region where MOS transistors TR3, TR4 are formed in the manufacturing step shown in FIG. 104.

As shown in FIGS. 104 to 106, an insulating film IF30, a metal film MF5, a polysilicon film PL2 and an insulating film IF31 are successively formed on the main surface of semiconductor substrate SS. Insulating film IF30 is made of a material having a high dielectric constant (High-k) such as HfSiON. Metal film MF5 is formed of a titanium nitride film, for example. Insulating film IF31 is formed of a silicon nitride film.

A photoresist film is formed on the upper surface of insulating film IF31 and patterned, to form a resist pattern film RP8.

Figure 107:
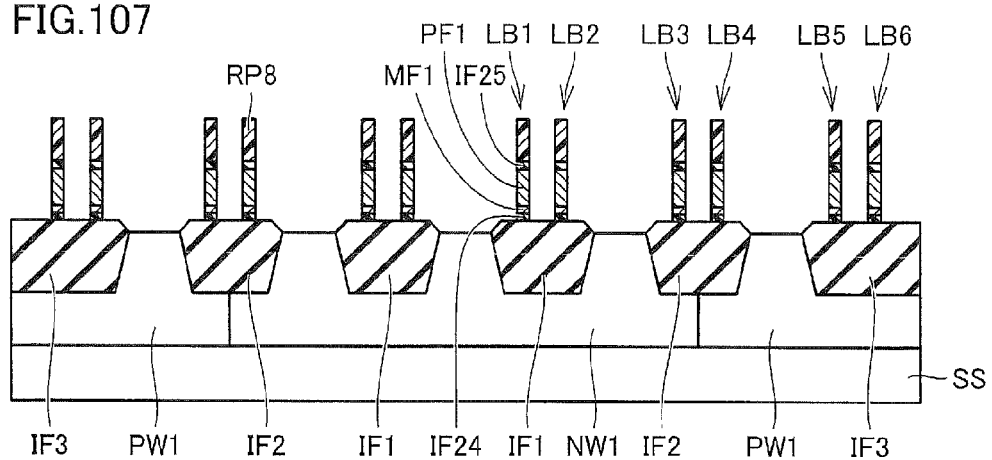
FIG. 107 is a cross-sectional view showing a manufacturing step subsequent to the manufacturing step shown in FIG. 104.
Figure 108:
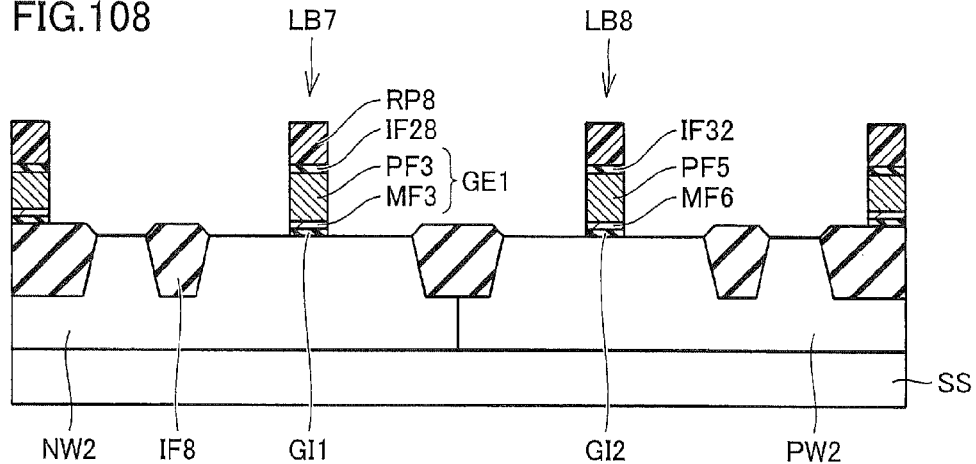
FIG. 108 is a cross-sectional view showing a manufacturing step subsequent to the manufacturing step shown in FIG. 105.
Figure 109:
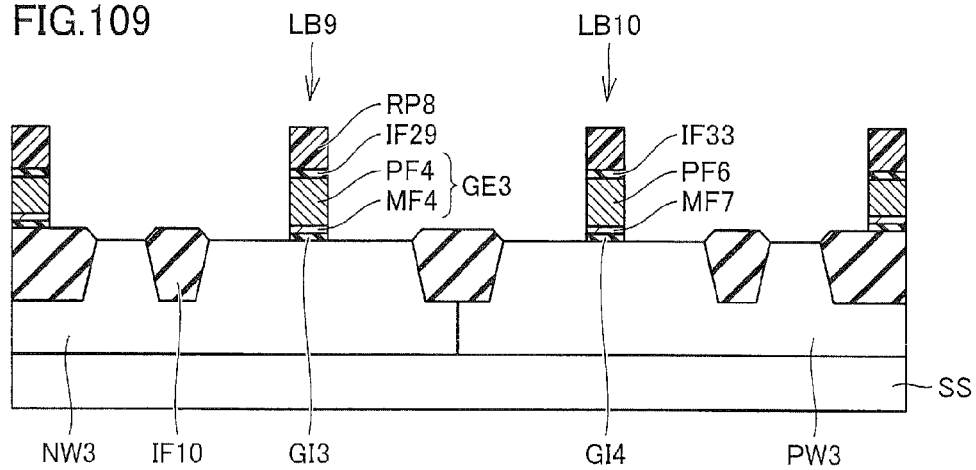
FIG. 109 is a cross-sectional view showing a manufacturing step subsequent to the manufacturing step shown in FIG. 106.

Next, as shown in FIGS. 107 to 109, insulating film IF31, polysilicon film PL2, metal film MF5 and insulating film IF30 are patterned with resist pattern film RP5 as a mask.

In FIG. 107, a laminated body LB1 and a laminated body LB2 spaced apart from each other are formed on the upper surface of isolation insulating film IF1. Likewise, a laminated body LB3 and a laminated body LB4 spaced apart from each other are formed on the upper surface of isolation insulating film IF2, and a laminated body LB5 and a laminated body LB6 are formed on the upper surface of isolation insulating film IF3.

Laminated body LB1 includes insulating film IF24 formed on the upper surface of isolation insulating film IF1, metal film MF1 formed on the upper surface of insulating film IF24, polysilicon film PF1 formed on the upper surface of metal film MF1, and insulating film IF25 formed on the upper surface of polysilicon film PF1. The other laminated bodies LB2 to LB6 are formed in a manner similar to laminated body LB1.

In FIG. 108, a laminated body LB7 is formed on the upper surface of N well NW2. Laminated body LB7 includes gate insulating film GI1, gate electrode GE1 formed on gate insulating film GI1, and insulating film IF28 formed on the upper surface of gate electrode GE1.

A laminated body LB8 is formed on the upper surface of P well PW2. Laminated body LB8 includes gate insulating film GI2, a metal film MF6 formed on the upper surface of gate insulating film GI2, a polysilicon film PF5 formed on the upper surface of metal film MF6, and an insulating film IF32 formed on the upper surface of polysilicon film PF5.

In FIG. 109, a laminated body LB9 is formed on the upper surface of N well NW3. Laminated body LB9 includes gate insulating film GI3, gate electrode GE3 formed on the upper surface of gate insulating film GI3, and insulating film IF29 formed on the upper surface of gate electrode GE3. A laminated body LB10 is formed on the upper surface of P well PW3. Laminated body LB10 includes gate insulating film GI4, a metal film MF7 formed on the upper surface of gate insulating film GI4, a polysilicon film PF6 formed on the upper surface of metal film MF7, and an insulating film IF33 formed on the upper surface of polysilicon film PF6.

Figure 110:
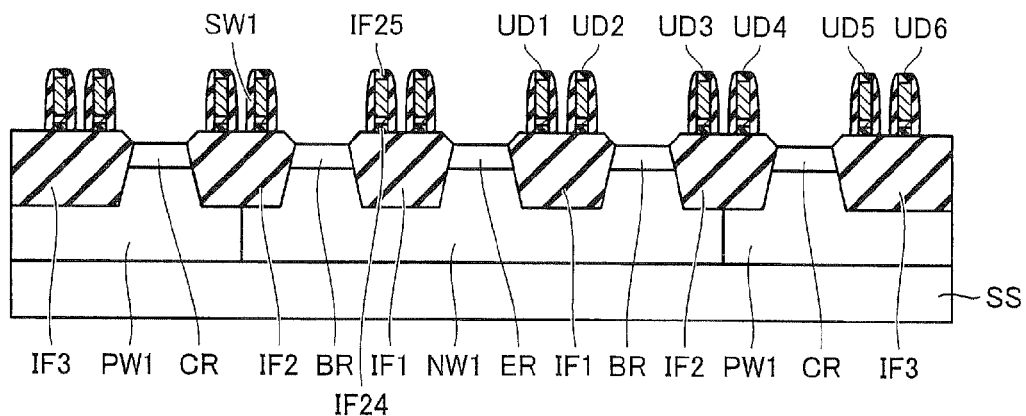
FIG. 110 is a cross-sectional view showing a manufacturing step subsequent to the manufacturing step shown in FIG. 107.
Figure 111:
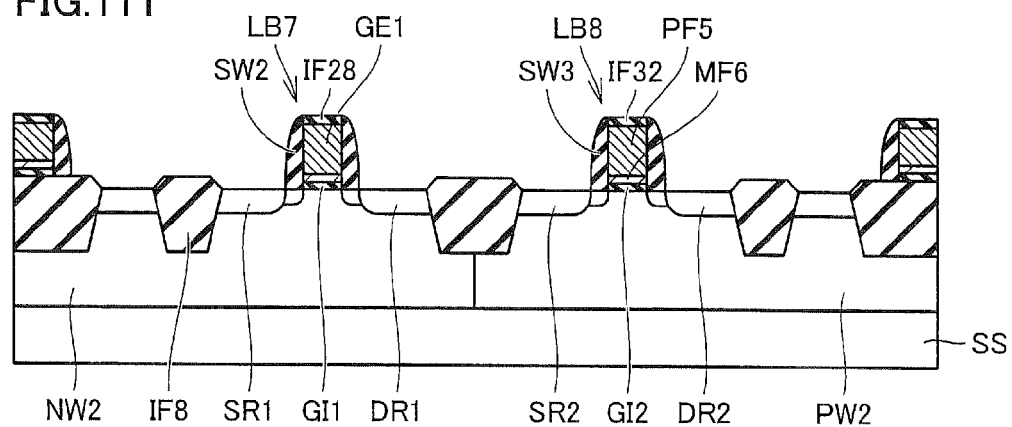
FIG. 111 is a cross-sectional view showing a manufacturing step subsequent to the manufacturing step shown in FIG. 108.
Figure 112:
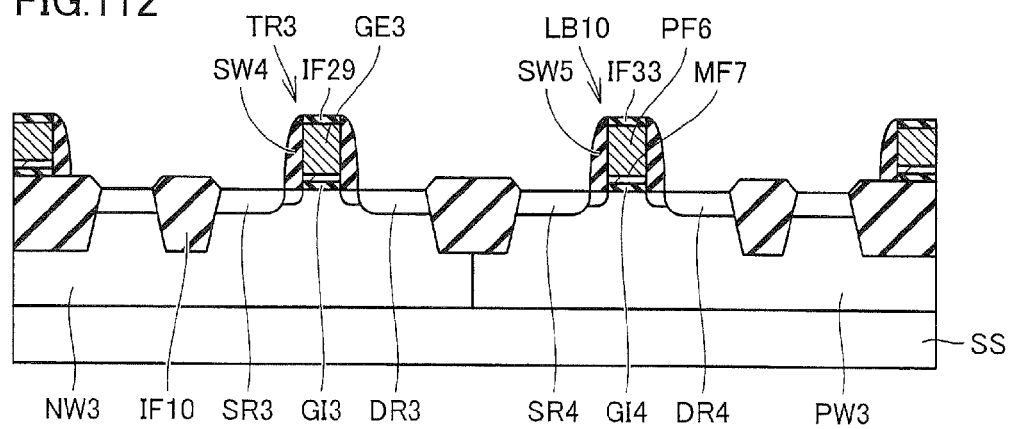
FIG. 112 is a cross-sectional view showing a manufacturing step subsequent to the manufacturing step shown in FIG. 109.

Subsequently, as shown in FIGS. 110 to 112, resist pattern film RP8 is removed. Then, sidewalls are formed on the side surfaces of laminated bodies LB1 to LB10. As a result, unit bipolar dummy electrodes UD1 to UD6 are formed on the upper surfaces of isolation insulating films IF1 to IF3.

Then, impurities are introduced into the main surface of semiconductor substrate SS to form emitter region ER, base region BR, collector region CR, source regions SR1 to SR4, and drain regions DR1 to DR4. In FIG. 112, source region SR3 and drain region DR3 are formed in N well NW3, to fabricate MOS transistor TR3.

Figure 113:
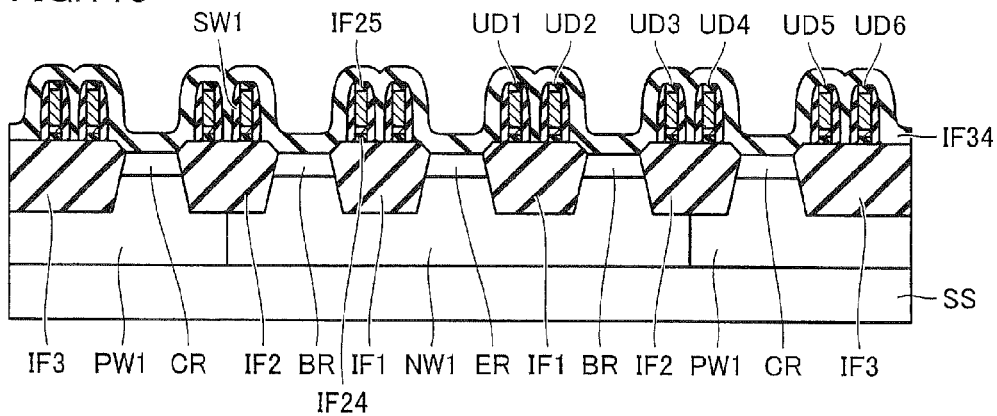
FIG. 113 is a cross-sectional view showing a manufacturing step subsequent to the manufacturing step shown in FIG. 110.
Figure 114:
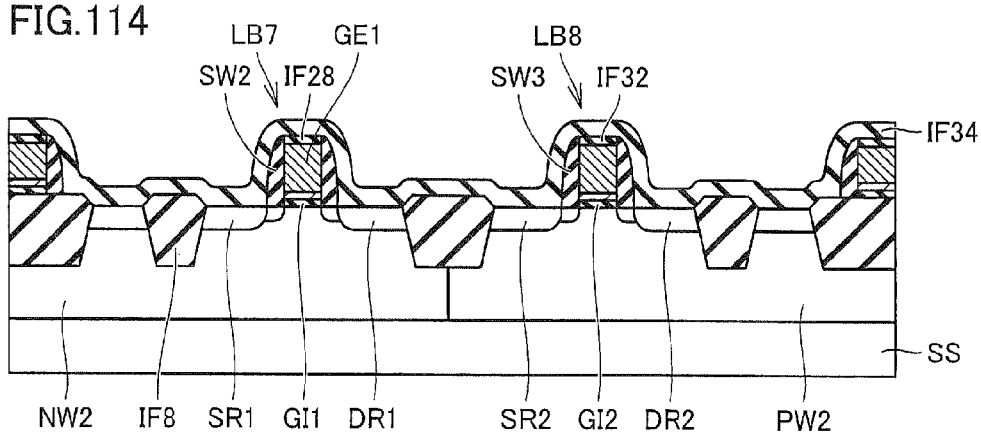
FIG. 114 is a cross-sectional view showing a manufacturing step subsequent to the manufacturing step shown in FIG. 111.
Figure 115:
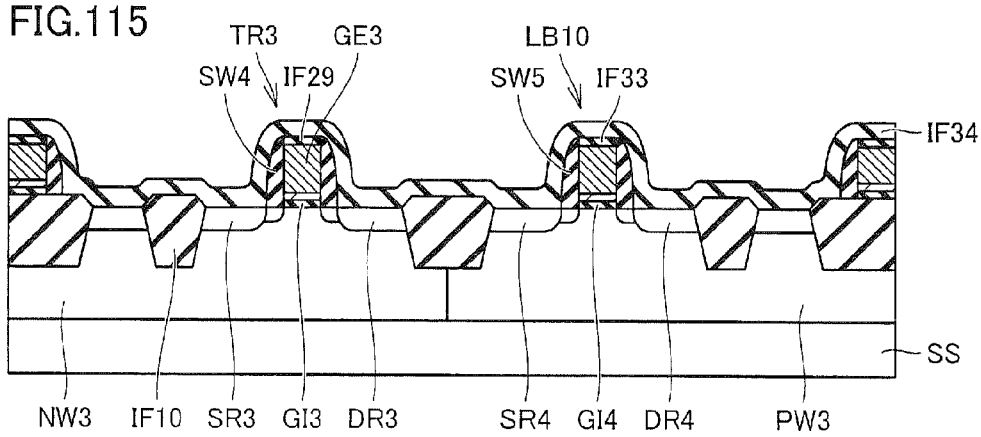
FIG. 115 is a cross-sectional view showing a manufacturing step subsequent to the manufacturing step shown in FIG. 112.

Next, as shown in FIGS. 113 to 115, a protection film IF34 is formed on the main surface of semiconductor substrate SS to cover unit bipolar dummy electrodes UD1 to UD6, laminated bodies LB7, LB8, LB10, and MOS transistor TR3.

When forming protection film IF34, unit bipolar dummy electrodes UD1 to UD6 have been formed. Thus, a variation in thickness between protection film IF34 deposited on the upper surfaces of emitter region ER, base region BR and collector region CR, and protection film IF34 deposited on N well NW2 and P well PW2 can be suppressed.

Figure 116:
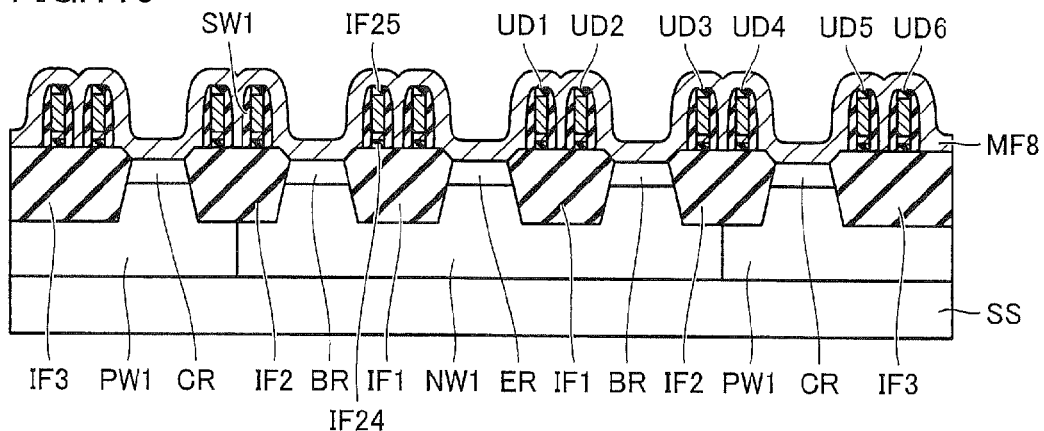
FIG. 116 is a cross-sectional view showing a manufacturing step subsequent to the manufacturing step shown in FIG. 113.
Figure 117:
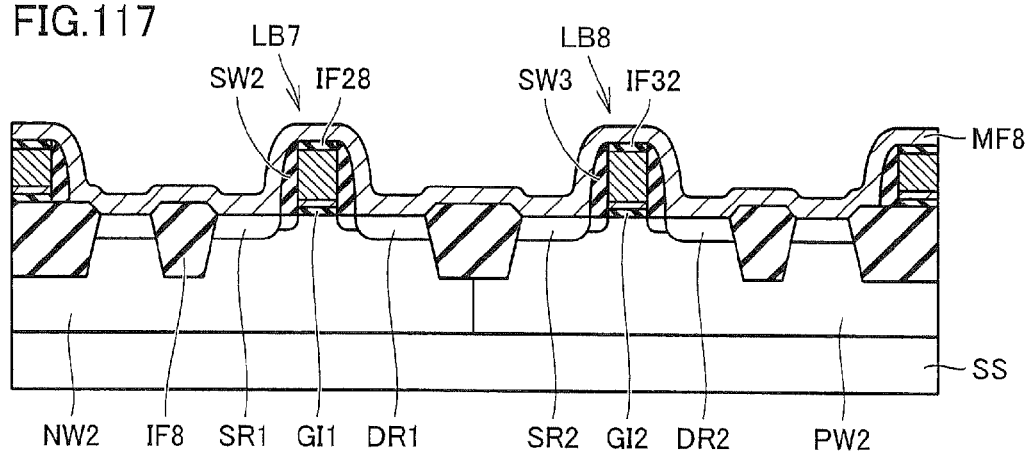
FIG. 117 is a cross-sectional view showing a manufacturing step subsequent to the manufacturing step shown in FIG. 114.
Figure 118:
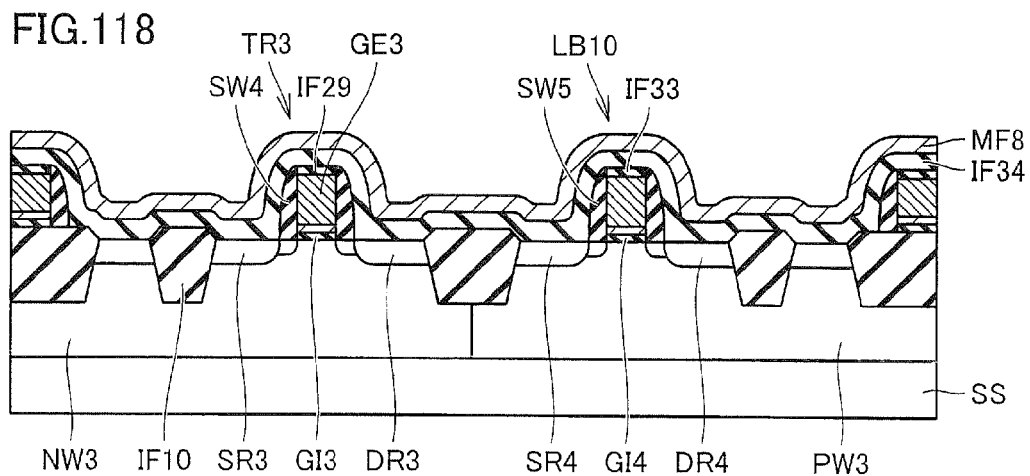
FIG. 118 is a cross-sectional view showing a manufacturing step subsequent to the manufacturing step shown in FIG. 115.

Next, as shown in FIGS. 116 to 118, protection film IF34 is patterned to expose unit bipolar dummy electrodes UD 1 to UD6, laminated body LB7 and laminated body LB8 through protection film IF34. As shown in FIG. 118, MOS transistor TR3 and laminated body LB10 are covered with protection film IF34.

When patterning protection film IF34, a variation in thickness between protection film IF34 positioned on emitter region ER, base region BR and collector region CR and protection film IF34 positioned on source regions SR1, SR2 and drain regions DR1, DR2 is small. Thus, protection film IF34 can be prevented from remaining on emitter region ER, base region BR and collector region CR.

Then, a metal film MF8 is deposited. As shown in FIG. 116, metal film MF8 is deposited on the upper surfaces of emitter region ER, base region BR and collector region CR. As shown in FIG. 117, metal film MF8 is also deposited on the upper surfaces of source regions SR1, SR2 and drain regions DR1, DR2.

As shown in FIG. 118, the upper surfaces of source regions SR3, SR4 and drain regions DR3, DR4 are covered with protection film IF34, and metal film MF8 is deposited on protection film IF34. Next, metal film MF8 is heated to form silicide films on the upper surfaces of emitter region ER, base region BR, collector region CR, source regions SR1, SR2 and drain regions DR1, DR2.

Since the protection film is prevented from partially remaining on the upper surfaces of emitter region ER, base region BR and collector region CR, a silicide film having a uniform thickness can be formed on emitter region ER, base region BR and collector region CR.

Figure 119:
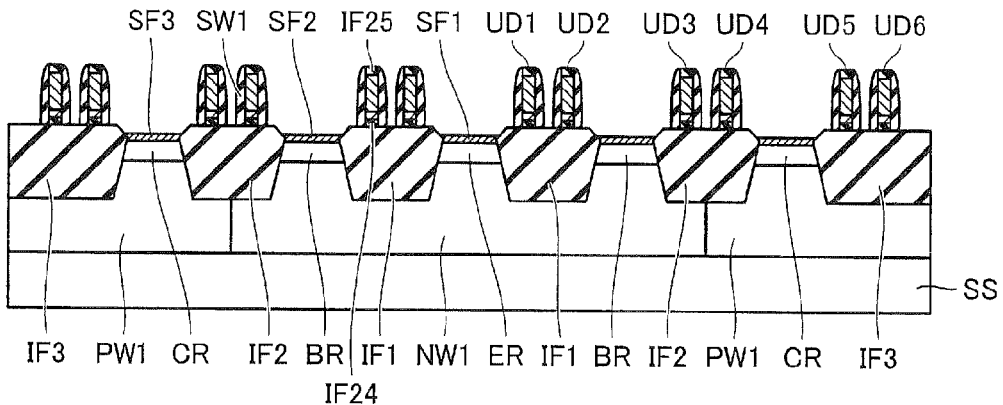
FIG. 119 is a cross-sectional view showing a manufacturing step subsequent to the manufacturing step shown in FIG. 116.
Figure 120:
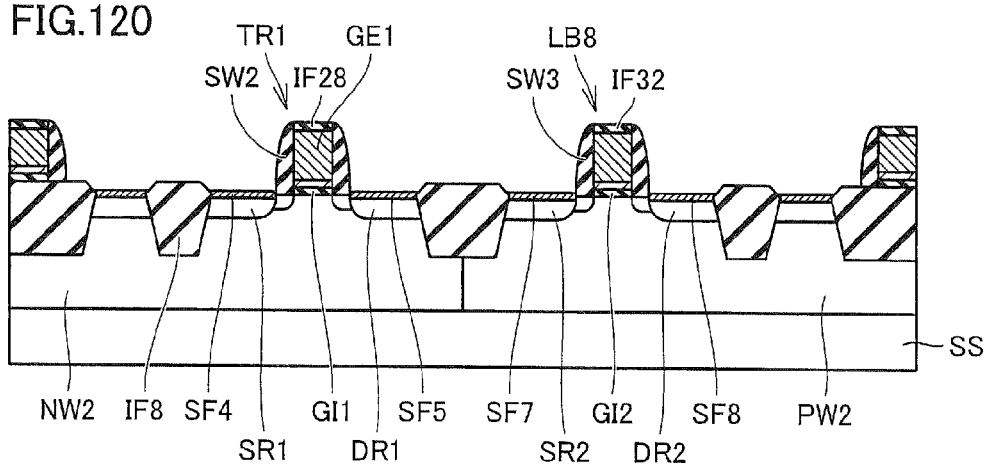
FIG. 120 is a cross-sectional view showing a manufacturing step subsequent to the manufacturing step shown in FIG. 117.
Figure 121:
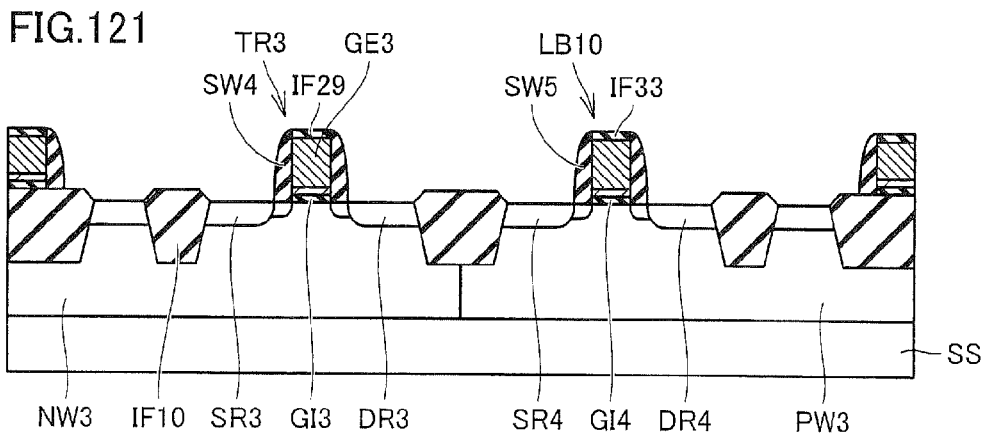
FIG. 121 is a cross-sectional view showing a manufacturing step subsequent to the manufacturing step shown in FIG. 118.

Next, as shown in FIGS. 119 to 121, metal film MF8 and protection film IF34 are removed. As shown in FIG. 119, this exposes silicide film SF1 formed on emitter region ER, silicide film SF2 formed on base region BR, and silicide film SF3 formed on collector region CR.

In the third embodiment, an insulating film is formed on the upper end portion of each of unit bipolar dummy electrodes UD1 to UD6. Thus, a silicide film is not formed on the upper end surface of each of unit bipolar dummy electrodes UD1 to UD6.

As shown in FIG. 120, silicide films SF4, SF7 formed on source regions SR1, SR2, respectively, and silicide films SF5, SF8 formed on drain regions DR1, DR2, respectively, are exposed. Silicide film SF4 is formed on source region SR1 and silicide film SF5 is formed on drain region DR1, to form MOS transistor TR1. Since insulating film IF28 is formed on the upper end portion of gate electrode GE1, a silicide film is not formed on the upper end portion of gate electrode GE1.

Likewise, since the upper end portion of laminated body LB8 is covered with insulating film IF32, a silicide film is not formed on the upper surface of laminated body LB8. As shown in FIG. 121, the upper end surface of gate electrode GE3 is covered with insulating film IF29, and the upper end surface of laminated body LB10 is covered with insulating film IF33. Furthermore, since gate electrode GE3, laminated body LB10, source regions SR3, SR4 and drain regions DR3, DR4 are covered with protection film IF34, a silicide film is not formed on gate electrode GE3, laminated body LB10, source regions SR3, SR4 and drain regions DR3, DR4.

Figure 122:
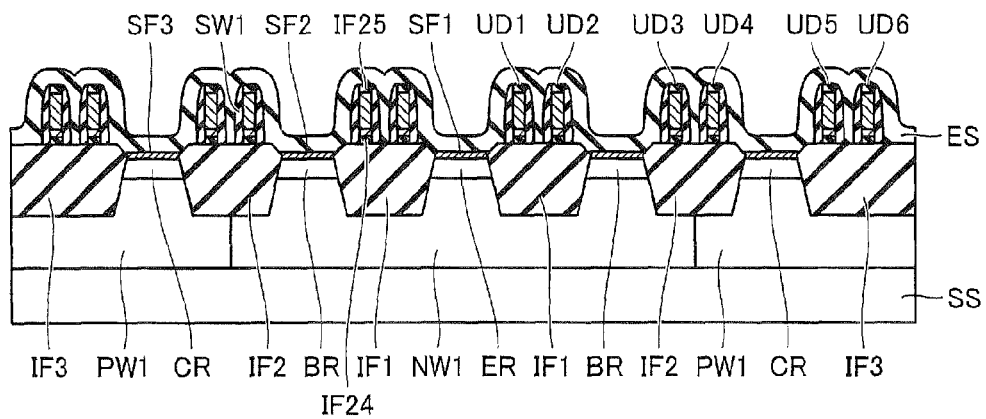
FIG. 122 is a cross-sectional view showing a manufacturing step subsequent to the manufacturing step shown in FIG. 119.
Figure 123:
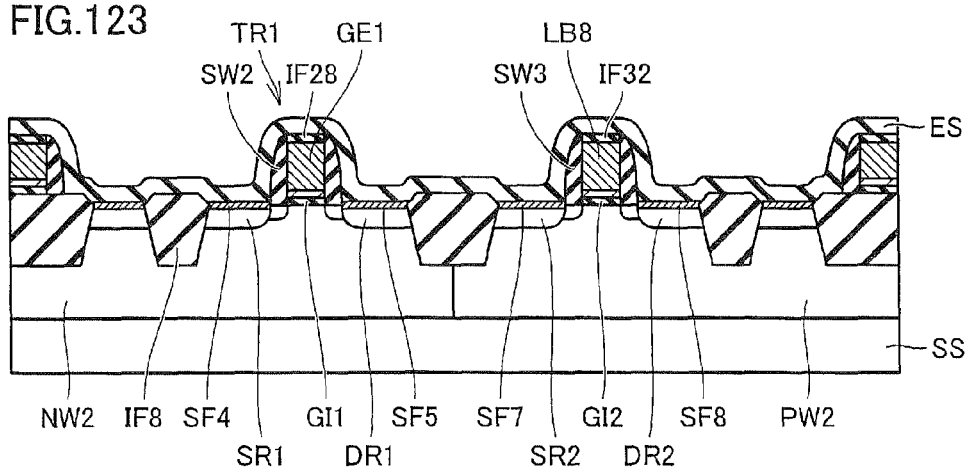
FIG. 123 is a cross-sectional view showing a manufacturing step subsequent to the manufacturing step shown in FIG. 120.
Figure 124:
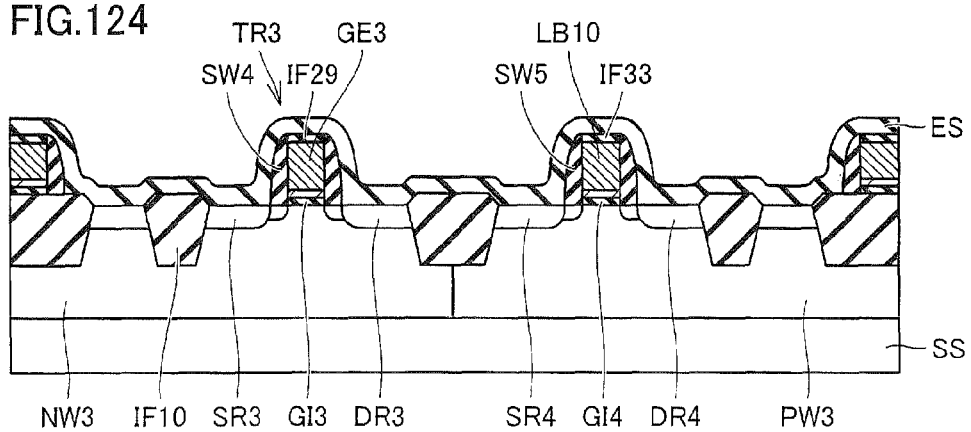
FIG. 124 is a cross-sectional view showing a manufacturing step subsequent to the manufacturing step shown in FIG. 121.

Next, as shown in FIGS. 122 to 124, an etching stopper ES is formed on the main surface of semiconductor substrate SS to cover unit bipolar dummy electrodes UD1 to UD6, MOS transistor TR1, laminated body LB8, MOS transistor TR3 and laminated body LB10.

Figure 125:
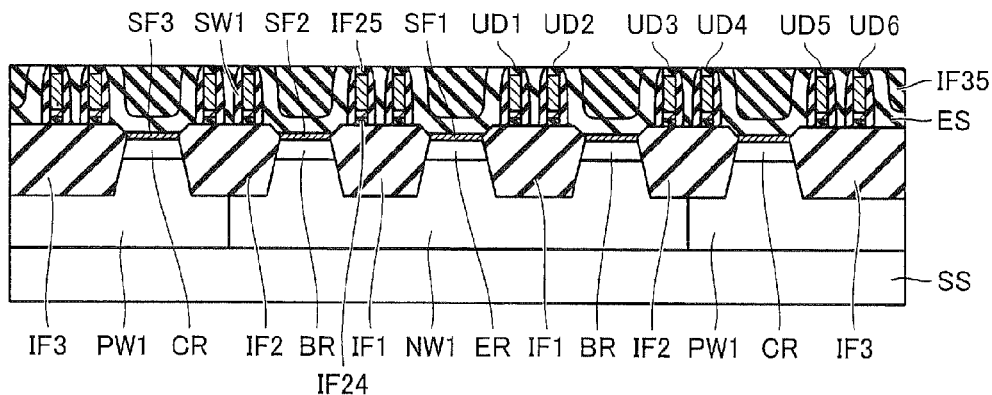
FIG. 125 is a cross-sectional view showing a manufacturing step subsequent to the manufacturing step shown in FIG. 122.
Figure 126:
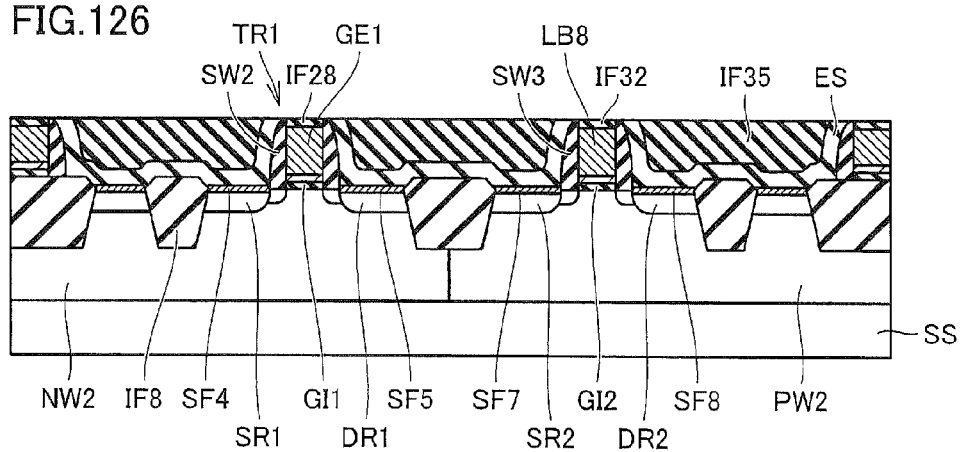
FIG. 126 is a cross-sectional view showing a manufacturing step subsequent to the manufacturing step shown in FIG. 123.
Figure 127:
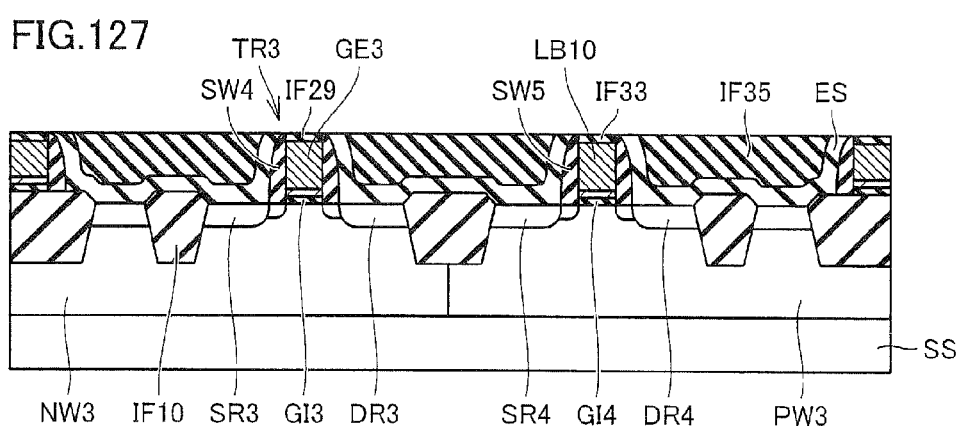
FIG. 127 is a cross-sectional view showing a manufacturing step subsequent to the manufacturing step shown in FIG. 124.

Next, as shown in FIGS. 125 to 127, an interlayer insulating film IF35 is deposited on etching stopper ES. Then, interlayer insulating film IF35 is flattened to expose the insulating films positioned on the upper end portions of unit bipolar dummy electrodes UD1 to UD6, insulating films IF28, IF29 formed on gate electrodes GE1, GE3, respectively, and insulating films IF32, IF33 positioned on the upper end portions of laminated bodies LB8, LB10, respectively.

Figure 128:
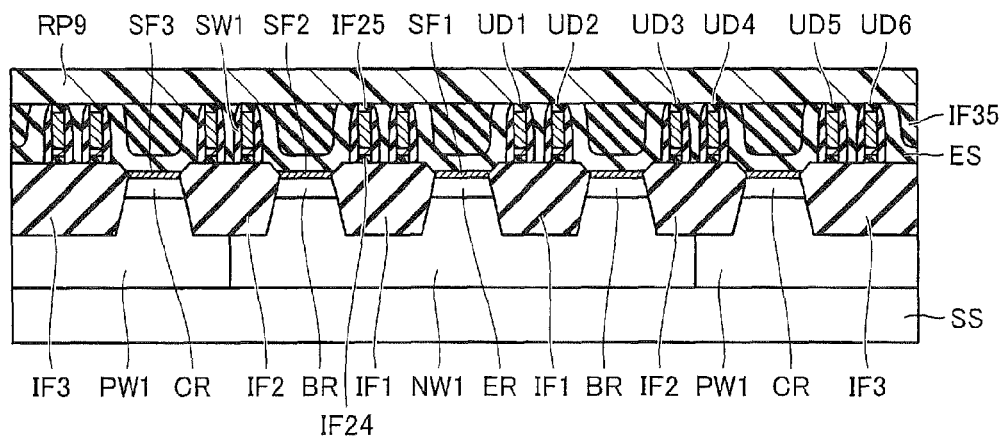
FIG. 128 is a cross-sectional view showing a manufacturing step subsequent to the manufacturing step shown in FIG. 125.
Figure 129:
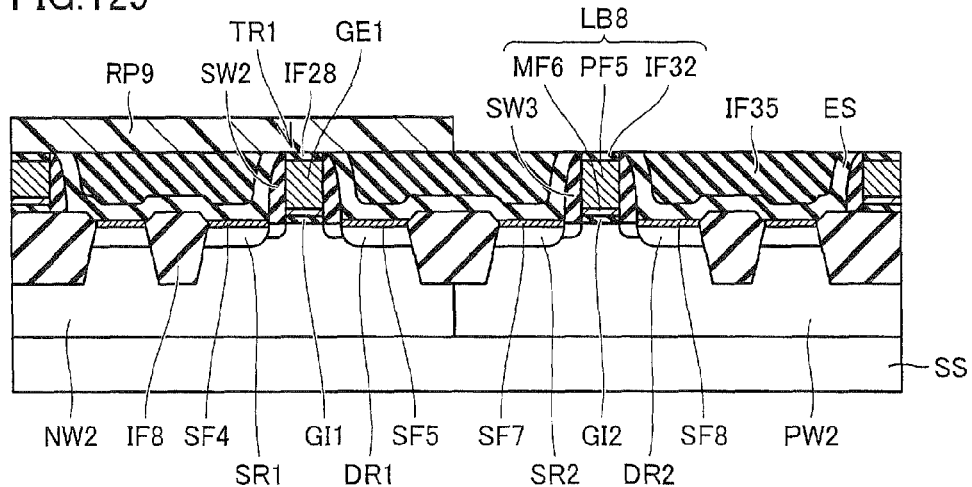
FIG. 129 is a cross-sectional view showing a manufacturing step subsequent to the manufacturing step shown in FIG. 126.
Figure 130:
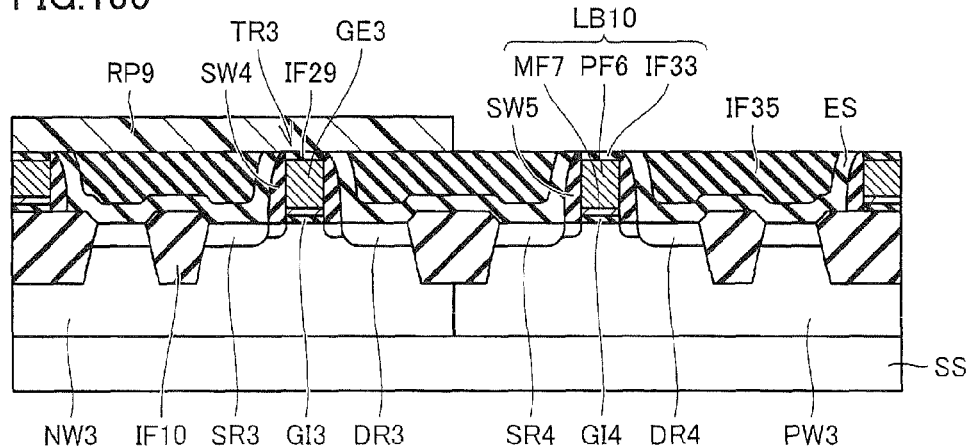
FIG. 130 is a cross-sectional view showing a manufacturing step subsequent to the manufacturing step shown in FIG. 127.

Next, as shown in FIGS. 128 to 130, a photoresist film is formed on interlayer insulating film IF35 and etching stopper ES and patterned, to form a resist pattern RP9.

As shown in FIGS. 129 and 130, insulating films IF32, IF33 positioned on the upper end portions of laminated bodies LB8, LB10, respectively, are exposed through resist pattern RP9. On the other hand, unit bipolar dummy electrodes UD1 to UD6, MOS transistor TR1 and MOS transistor TR3 are covered with resist pattern RP9.

Figure 131:
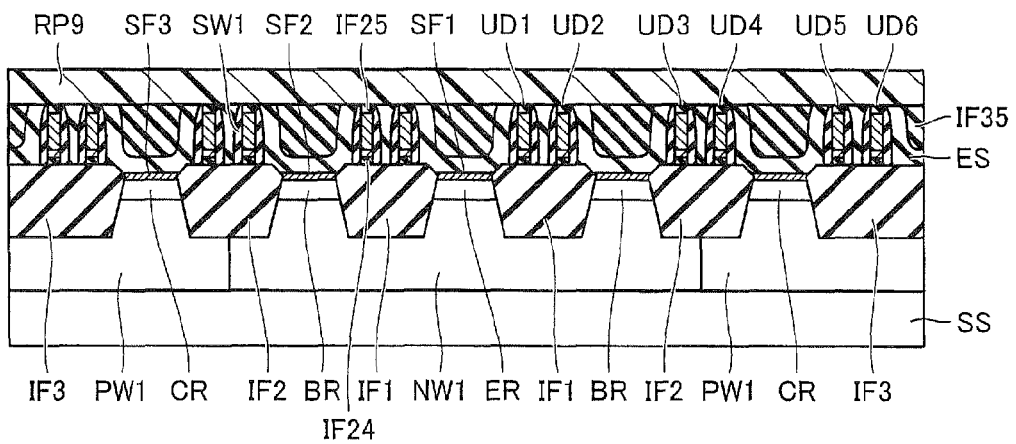
FIG. 131 is a cross-sectional view showing a manufacturing step subsequent to the manufacturing step shown in FIG. 128.
Figure 132:
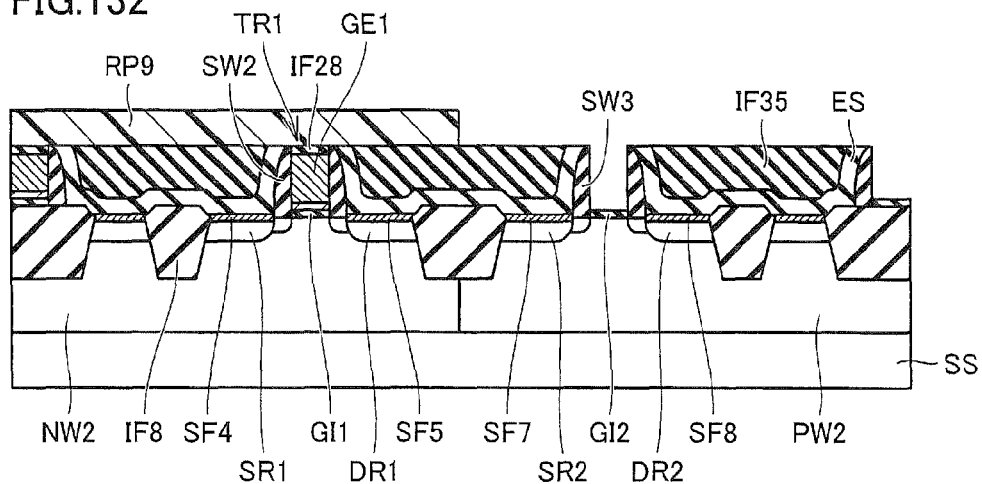
FIG. 132 is a cross-sectional view showing a manufacturing step subsequent to the manufacturing step shown in FIG. 129.
Figure 133:
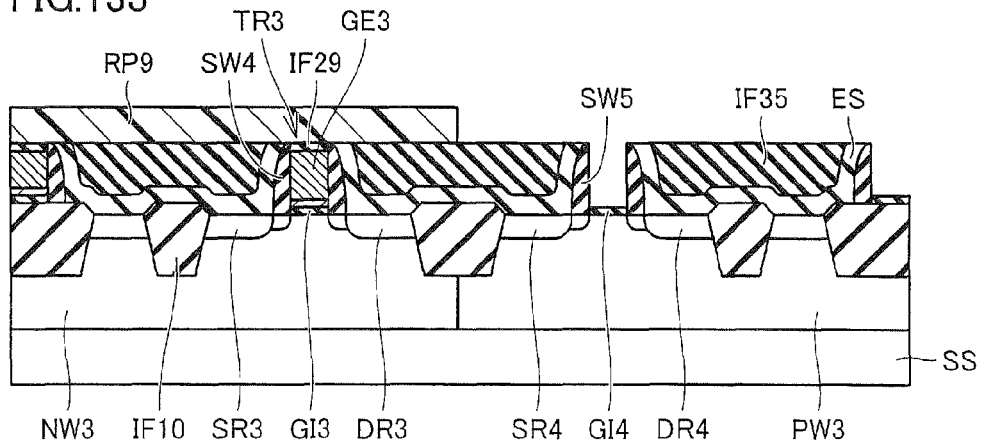
FIG. 133 is a cross-sectional view showing a manufacturing step subsequent to the manufacturing step shown in FIG. 130.

Next, as shown in FIGS. 131 to 133, insulating film IF32, polysilicon film PF5 and metal film MF6 shown in FIG. 129 are removed, and insulating film IF33, polysilicon film PF6 and metal film MF7 shown in FIG. 130 are removed. This exposes gate insulating film GI2 and gate insulating film GI4, as shown in FIGS. 132 and 133.

Figure 35:
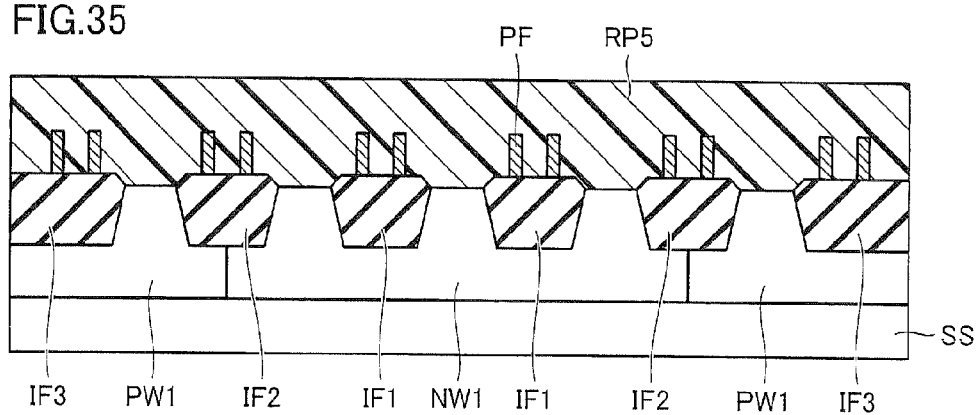
FIG. 35 is a cross-sectional view showing a manufacturing step subsequent to the manufacturing step shown in FIG. 31.
Figure 134:
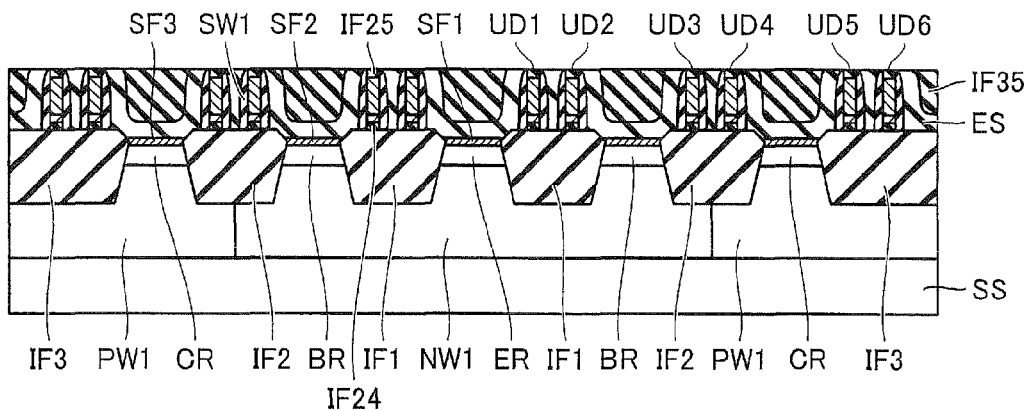
FIG. 134 is a cross-sectional view showing a manufacturing step subsequent to the manufacturing step shown in FIG. 131.
Figure 135:
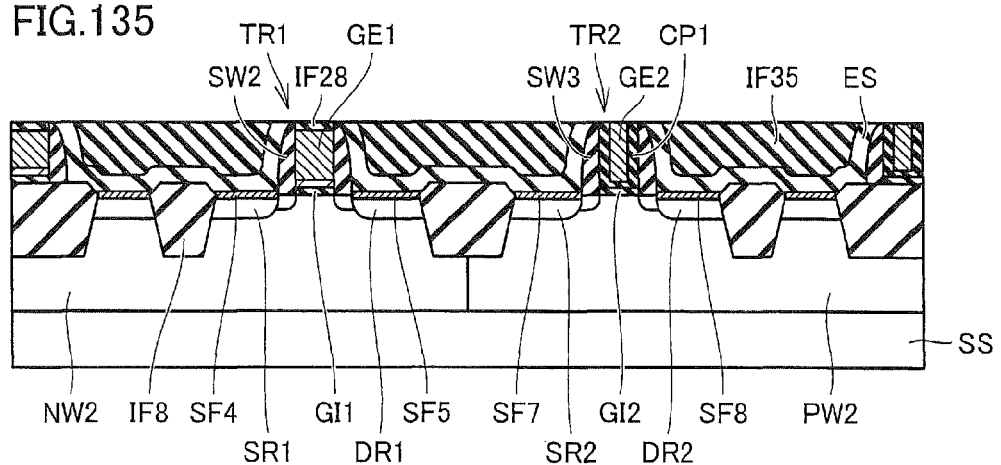
FIG. 135 is a cross-sectional view showing a manufacturing step subsequent to the manufacturing step shown in FIG. 132.

Next, as shown in FIGS. 134 to 135, resist pattern RP9 is removed. Then, a La compound film is deposited, and then a metal film is deposited. After the deposition of the metal film, the La compound film and the metal film are removed by CMP. Consequently, as shown in FIG. 35, cap film CP1 extending on the inner periphery of sidewall SW3 and the upper surface of gate insulating film GI2, and gate electrode GE2 are formed. MOS transistor TR2 is thus completed.

Figure 136:
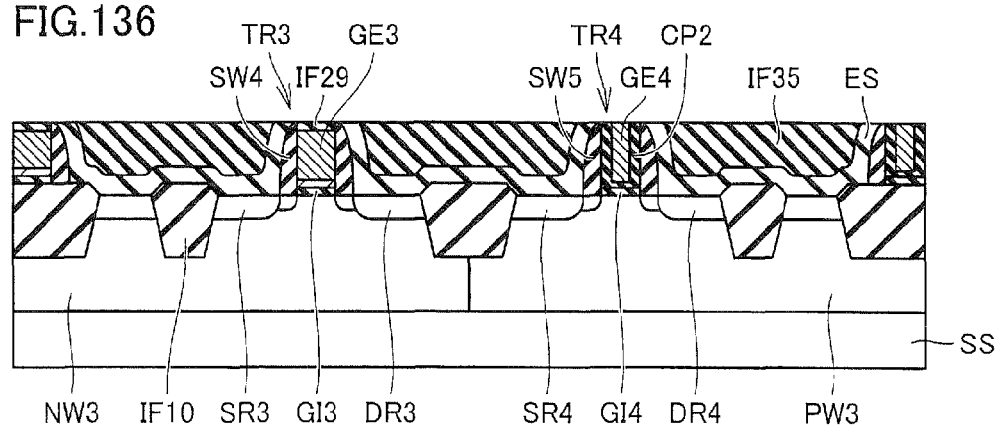
FIG. 136 is a cross-sectional view showing a manufacturing step subsequent to the manufacturing step shown in FIG. 133.

Likewise, as shown in FIG. 136, cap film CP2 extending on the inner periphery of sidewall SW5 and the upper surface of gate insulating film GI4, and gate electrode GE4 on cap film CP2 are formed. MOS transistor TR4 is thus completed.

Next, as shown in FIGS. 98 to 100, interlayer insulating film IF5 and insulating film IF6 are successively deposited. Then, connection members C, upper layer wires UL and insulating film IF7 are formed to fabricate semiconductor device 1 according to the third embodiment.

Fourth Embodiment

Referring to FIGS. 137 to 140, semiconductor device 1 according to a fourth embodiment of the present invention will be described. In FIGS. 137 to 140, the same reference signs are used to indicate elements the same as or corresponding to those shown in FIGS. 1 to 136, and descriptions thereof may not be repeated.

Figure 137:
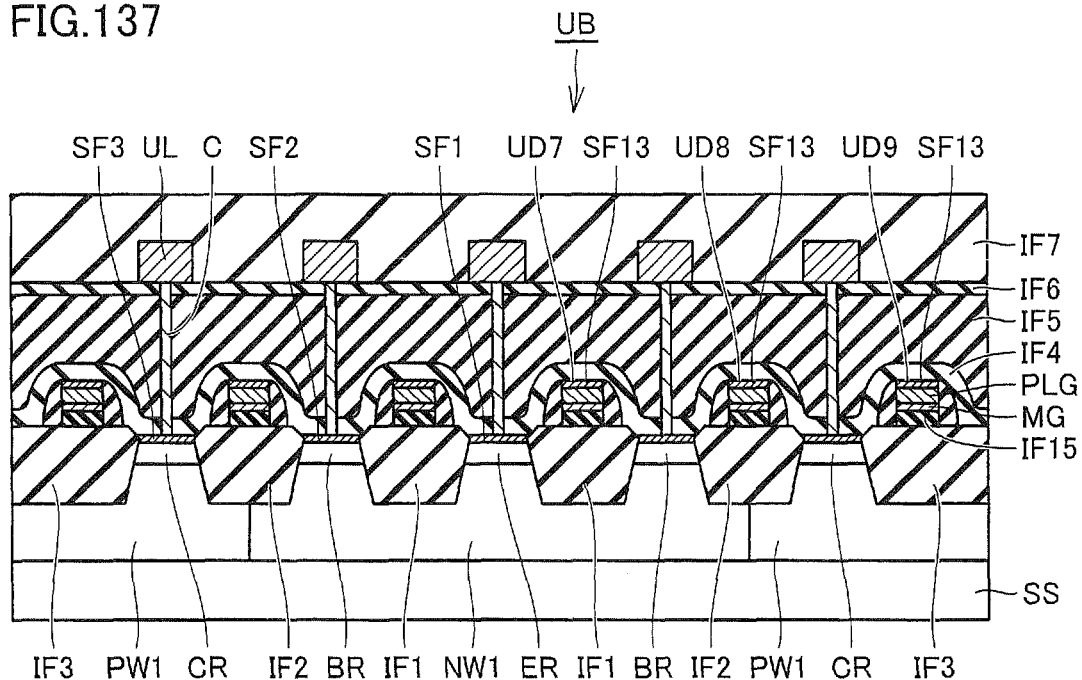
FIG. 137 is a cross-sectional view of unit bipolar transistor UB provided in the semiconductor device according to the third embodiment.
Figure 138:
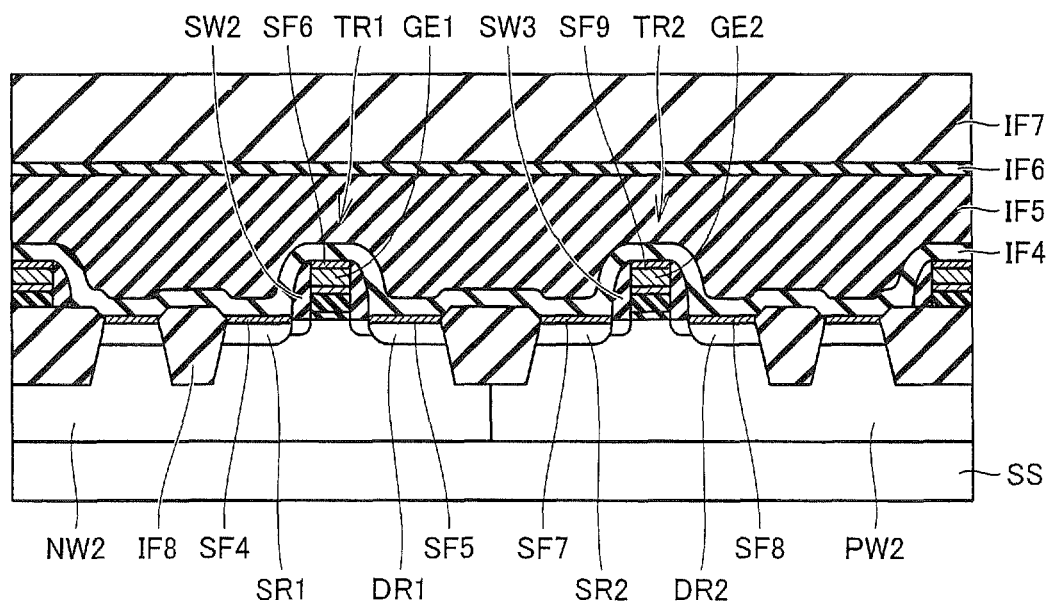
FIG. 138 is a cross-sectional view showing MOS transistors TR1, TR2.
Figure 139:
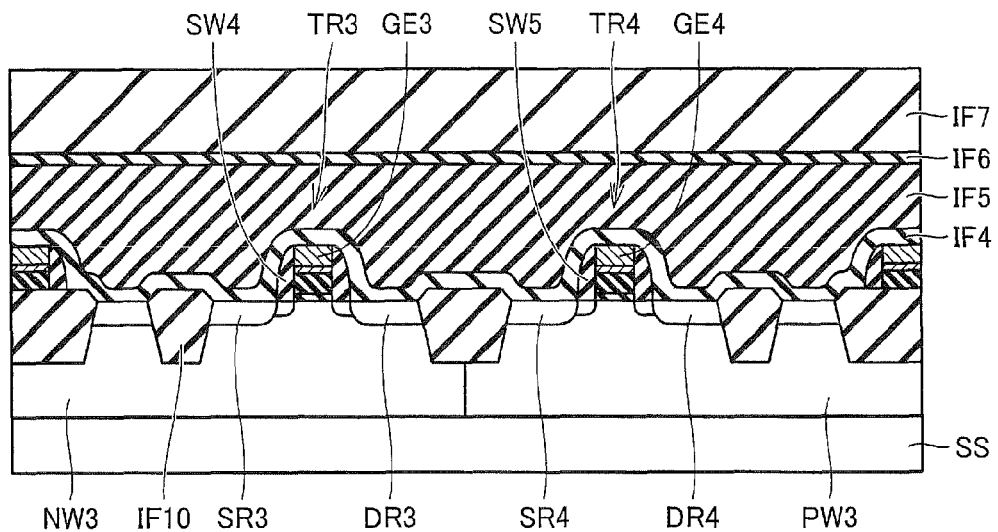
FIG. 139 is a cross-sectional view showing MOS transistors TR3, TR4.

FIG. 137 is a cross-sectional view of unit bipolar transistor UB provided in the semiconductor device according to the fourth embodiment. FIG. 138 is a cross-sectional view showing MOS transistor TR1, TR2. FIG. 139 is a cross-sectional view showing MOS transistor TR3, TR4.

As shown in FIG. 137, the unit bipolar dummy electrode includes a laminated insulating film IF15 formed on the isolation insulating film, a metal layer MG formed on the upper surface of laminated insulating film IF15, a polysilicon layer PLG formed on the upper surface of metal layer MG, a silicide film SF13 formed on polysilicon layer PLG, and a sidewall.

Figure 140:
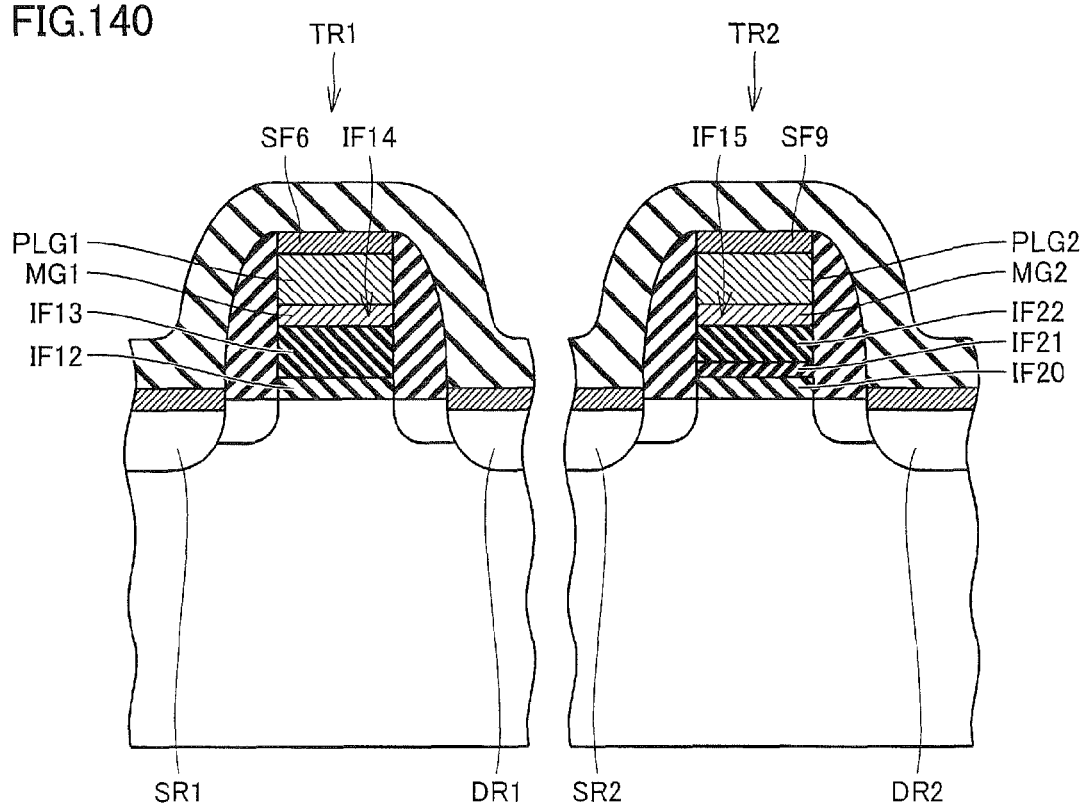
FIG. 140 is a cross-sectional view showing n type MOS transistor TR2.

As shown in FIG. 138, source region SR1, drain region DR1 and silicide film SF6 are formed on the upper surfaces of silicide film SF4, silicide film SF5 and gate electrode GE1 of MOS transistor TR1, respectively. Likewise, silicide film SF7, silicide film SF8 and silicide film SF9 are formed on the upper surfaces of source region SR2, drain region DR2 and gate electrode GE2 of MOS transistor TR2, respectively. On the other hand, as shown in FIG. 139, a silicide film is not formed on the upper surfaces of source regions SR3, SR4, drain regions DR3, DR4 and gate electrodes GE3, GE4 of MOS transistors TR3, TR4, respectively. FIG. 140 is a cross-sectional view showing the structures of p type MOS transistor TR1 and n type MOS transistor TR2 in detail. As shown in FIG. 140, MOS transistor TR1 includes a metal layer MG1 formed on the upper surface of a laminated insulating film IF14 formed on the upper surface of an active region, and a polysilicon layer PLG1 formed on the upper surface of metal layer MG1, with silicide film SF6 formed on the upper surface of polysilicon layer PLG1. The gate electrode of MOS transistor TR2 includes a metal layer MG2 formed on the upper surface of laminated insulating film IF15 formed on the upper surface of an active region, and a polysilicon layer PLG2 formed on the upper surface of metal layer MG2, with silicide film SF9 formed on the upper surface of polysilicon layer PLG2.

Laminated insulating film IF14 of MOS transistor TR1 includes an interface layer IF12 formed on the upper surface of the active region, and a high dielectric insulating film IF13 formed on the upper surface of interface layer IF12. Laminated insulating film IF15 of MOS transistor TR2 includes an interface layer IF20 formed on the upper surface of the active region, a diffusion barrier film IF21 formed on the upper surface of interface layer IF20, and a high dielectric insulating film IF22 formed on the upper surface of diffusion barrier film IF21.

Interface layers IF12, IF20 are formed of a silicon oxide film or a silicon nitride film, for example. Diffusion barrier film IF21 is made of $Al_2O_3$, Al, or SiN having a thickness of about 0.3 nm to 2.0 nm, for example. High dielectric insulating films IF13, IF22 are made of an insulating material such as HfSiON having a dielectric constant higher than that of interface layer IF20, and have a thickness of about 1 to 4 mm.

Metal layers MG1, MG2 are made of a metal having a work function suitable for forming the MOS transistors, and contain a rare earth element or Mg.

Gate electrode GE4 of MOS transistor TR4 is structured in a manner similar to gate electrode GE2. Gate electrode GE3 of MOS transistor TR3 does not have diffusion barrier film IF21 in a manner similar to gate electrode GE1, and has an interface layer, a high dielectric insulating film, a metal layer and polysilicon layer PLG laminated successively.

According to such gate electrodes GE1 to GE4, flat band voltages suitable for an nMOS and a pMOS, respectively, can be obtained.

As such, when a single metal/dual high-k structure is employed for gate electrodes GE1 to GE4, the unit bipolar dummy electrodes are structured in a manner similar to gate electrode GE1 or gate electrode GE2.

In the third embodiment as well, in a manner similar to the first and second embodiments, when etching protection film IF11, the unit bipolar dummy electrodes have been formed around emitter region ER, base region BR and collector region CR of unit bipolar transistor UB, to prevent protection film IF11 from remaining on the upper surfaces of emitter region ER, base region BR and collector region CR.

Thus, in the fourth embodiment as well, a uniform silicide film can be formed on the upper surfaces of emitter region ER, base region BR and collector region CR.

In the first to fourth embodiments, unit bipolar transistor UB includes base region BR, collector region CR and isolation insulating films IF1, IF2 formed in an annular shape, and the present invention has been applied to such unit bipolar transistor by way of example. Alternatively, the present invention is applicable to a bipolar transistor including emitter region ER and base region BR formed in a rectangular shape.

Figure 141:
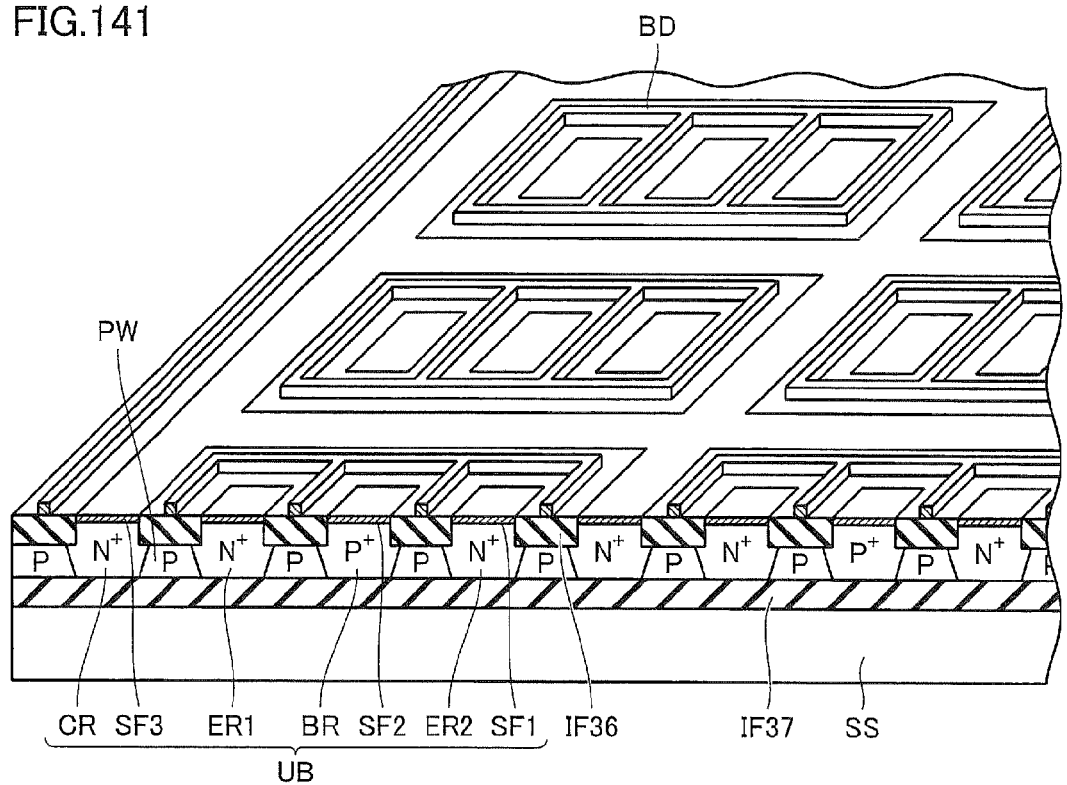
FIG. 141 is a cross-sectional perspective view showing a variation of unit bipolar transistor UB.

FIG. 141 is a cross-sectional perspective view showing a variation of unit bipolar transistor UB. In the example shown in FIG. 141, unit bipolar transistor UB includes base region BR formed on the main surface of semiconductor substrate SS, emitter regions ER1, ER2 formed on opposing sides of base region BR, an isolation insulating film IF36 passing between base region BR and emitter regions ER1, ER2, and collector region CR. Unit bipolar transistor UB includes silicide film SF2 formed on the upper surface of base region BR, silicide film SF1 formed on the upper surfaces of emitter regions ER1, ER2, and silicide film SF3 formed on the upper surface of collector region CR.

Isolation insulating film IF36 is formed to surround the peripheries of base region BR and emitter regions ER1, ER2. Isolation insulating film IF36 passes between emitter region ER1 and collector region CR, between base region BR and emitter region ER1, and between base region BR and emitter region ER2, on the main surface of semiconductor substrate SS, to isolate collector region CR, emitter regions ER1, ER2 and base region BR from one another. Collector region CR is an N type impurity region, and emitter regions ER1, ER2 are N type impurity regions. Base region BR is a P type impurity region.

A buried insulating film IF37 is formed in semiconductor substrate SS, with a P well region PW formed in semiconductor substrate SS between isolation insulating film IF36 and buried insulating film IF37. Due to P well region PW, collector region CR and emitter regions ER1, ER2 form pn junctions, and base region BR and emitter regions ER1, ER2 form pn junctions. Bipolar dummy electrode BD is formed on the upper surface of isolation insulating film IF36.

When forming a protection film in the process of manufacturing semiconductor device 1 including MOS transistors TR1 to TR4 shown in FIGS. 10 and 12 and the plurality of unit bipolar transistors UB shown in FIG. 141, bipolar dummy electrode BD is formed on isolation insulating film IF36 in advance.

Thus, a variation in thickness between the protection film deposited on unit bipolar transistor UB and the protection film deposited on MOS transistors TR1, TR2 can be suppressed.

As such, if unit bipolar transistor UB as shown in FIG. 141 is employed, a variation in thickness among silicide films SF1 to SF3 can be suppressed.

First Example

Referring to FIGS. 142 to 157, the results of experiments will be described in which the unit bipolar transistor having the bipolar dummy electrode according to an example of the present invention was compared with a unit bipolar transistor not having a bipolar dummy electrode in a comparative example.

Figure 142:
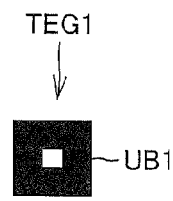
FIG. 142 is a plan view schematically showing a comparative element TEG1 provided with a unit bipolar transistor not having a bipolar dummy electrode.
Figure 143:
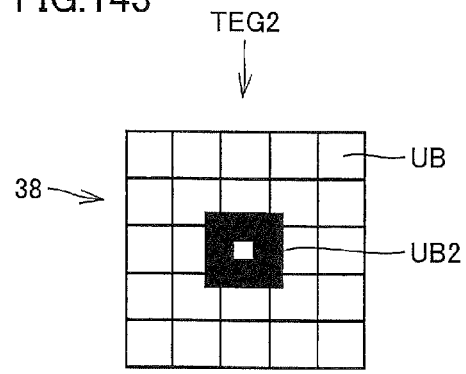
FIG. 143 is a plan view schematically showing a comparative element TEG2 provided with a unit bipolar transistor not having a bipolar dummy electrode.
Figure 144:
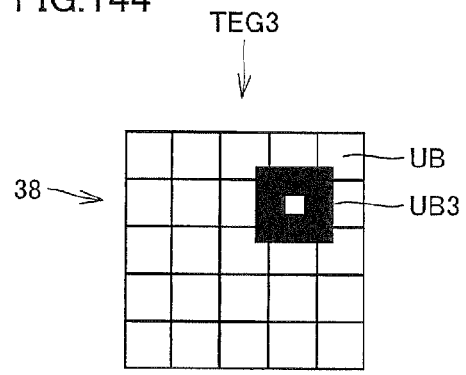
FIG. 144 is a plan view schematically showing a comparative element TEG3 provided with a unit bipolar transistor not having a bipolar dummy electrode.
Figure 145:
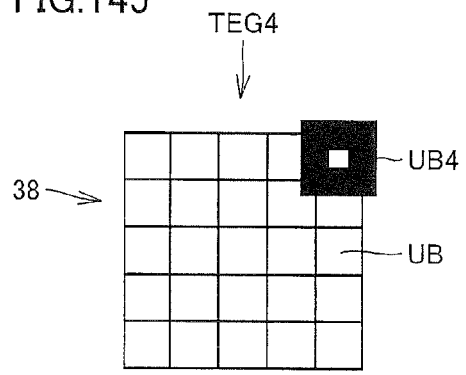
FIG. 145 is a plan view schematically showing a bipolar transistor not having a bipolar dummy electrode.

FIG. 142 is a plan view schematically showing a comparative element TEG1 provided with a unit bipolar transistor not having a bipolar dummy electrode. FIGS. 143 to 145 are plan views schematically showing comparative elements TEG2 to TEG4, respectively, each provided with a bipolar transistor including a plurality of unit bipolar transistors not having a bipolar dummy electrode.

In comparative element TEG1 shown in FIG. 142, a single unit bipolar transistor not having a bipolar dummy electrode is formed.

In comparative element TEG2 shown in FIG. 143, a bipolar transistor 38 including a plurality of unit bipolar transistors arranged in an array (5×5) is formed, For comparative element TEG2, the characteristics of a centrally positioned unit bipolar transistor UB2 were evaluated out of the plurality of unit bipolar transistors UB arranged in an array.

In comparative element TEG3 shown in FIG. 144, the bipolar transistor 38 including a plurality of unit bipolar transistors arranged in an array (5×5) is formed.

For comparative element TEG3, the characteristics of a unit bipolar transistor UB3 arranged on an immediately outer side of the centrally positioned unit bipolar transistor were evaluated out of the plurality of unit bipolar transistors arranged in an array.

In comparative element TEG4 shown in FIG. 145, the bipolar transistor 38 including a plurality of unit bipolar transistors arranged in an array (5×5) is formed. For comparative element TEG4, the characteristics of a unit bipolar transistor UB4 arranged on the outermost periphery were evaluated out of the plurality of unit bipolar transistor arranged in an array.

Figure 146:
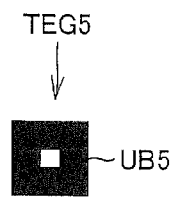
FIG. 146 is a plan view schematically showing an inventive element TEG5 provided with a unit bipolar transistor having a bipolar dummy electrode.
Figure 147:
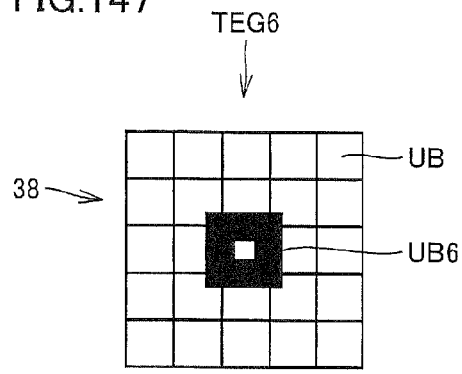
FIG. 147 is a plan view schematically showing an inventive element TEG6 provided with a unit bipolar transistor having a bipolar dummy electrode.
Figure 148:
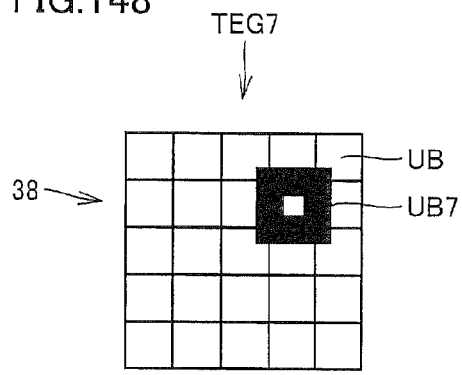
FIG. 148 is a plan view schematically showing an inventive element TEG7 provided with a unit bipolar transistor having a bipolar dummy electrode.
Figure 149:
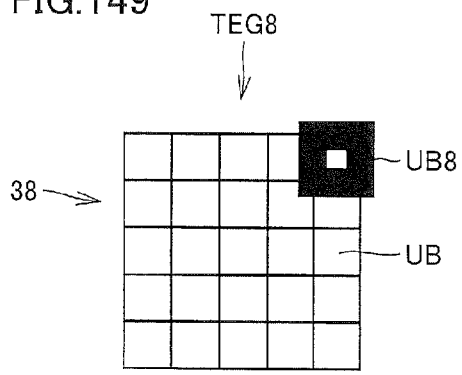
FIG. 149 is a plan view schematically showing an inventive element TEG8 provided with a unit bipolar transistor having a bipolar dummy electrode.

FIG. 146 is a plan view schematically showing an inventive element TEG5 provided with a single unit bipolar transistor having a bipolar dummy electrode. FIGS. 147 to 149 are plan views schematically showing inventive elements TEG6 to TEG8, respectively, each provided with the bipolar transistor including a plurality of unit bipolar transistors, with a bipolar dummy electrode formed in each unit bipolar transistor.

In inventive element TEG5 shown in FIG. 146, a single unit bipolar transistor having a bipolar dummy electrode is formed. For inventive element TEG6 shown in FIG. 147, the characteristics of a centrally positioned unit bipolar transistor UB6 were evaluated out of the plurality of unit bipolar transistors UB arranged in an array. In inventive element TEG7 shown in FIG. 148, the bipolar transistor including a plurality of unit bipolar transistors arranged in an array (5×5) is formed.

For inventive element TEG7, the characteristics of a unit bipolar transistor UB7 arranged on an immediately outer side of the centrally positioned unit bipolar transistor were evaluated out of the plurality of unit bipolar transistors arranged in an array.

In inventive element TEG8 shown in FIG. 149, the bipolar transistor including a plurality of unit bipolar transistors arranged in an array (5×5) is formed.

For inventive element TEG8, the characteristics of a unit bipolar transistor UB8 arranged on the outermost periphery of the plurality of unit bipolar transistor arranged in an array were evaluated.

FIGS. 150 to 153 illustrate the results of evaluation of base-emitter voltages of unit bipolar transistors UB1 to UB4 and unit bipolar transistors UB5 to UB8. In the examples shown in FIGS. 150 to 153, a PNP type bipolar transistor was employed for each unit bipolar transistor.

Figure 150:
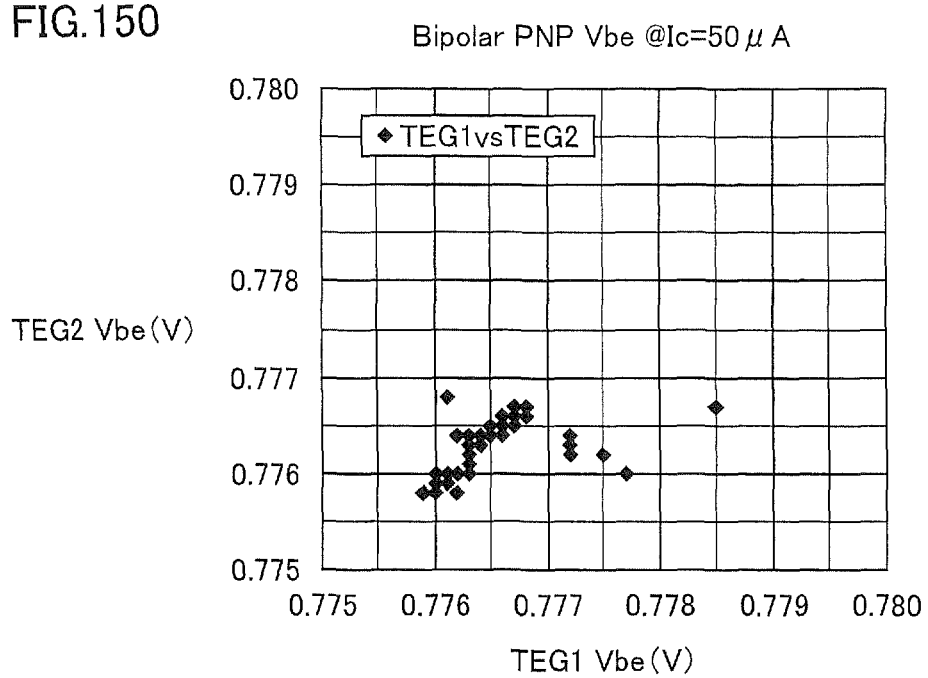
FIG. 150 is a graph illustrating the correlation of Vbe (base-emitter voltage) of a unit bipolar transistor UB1 of comparative element TEG1 with Vbe of a unit bipolar transistor UB2 of comparative element TEG2.
Figure 151:
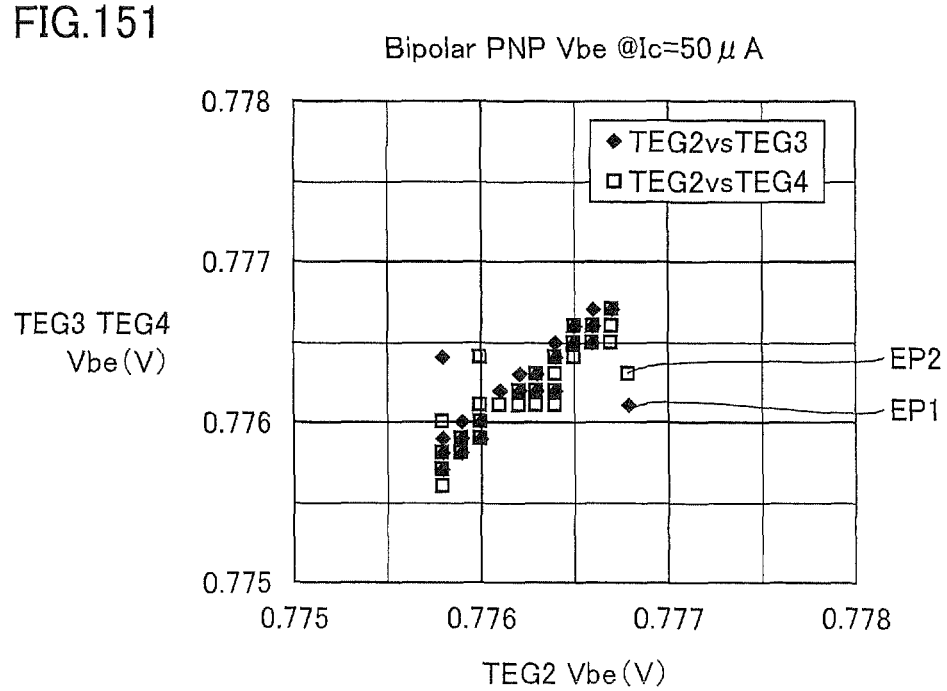
FIG. 151 is a graph illustrating the correlation of Vbe of unit bipolar transistor UB2 with Vbe of unit bipolar transistors UB3, UB4.

In the graphs shown in FIGS. 150 and 151, a plurality of comparative substrates having comparative elements TEG1 to TEG4 were prepared, and the base-emitter voltages were compared between the unit bipolar transistors formed on the same comparative substrate. Likewise, in the graphs shown in FIGS. 152 and 153, a plurality of substrates having inventive elements TEG5 to TEG8 were prepared, and the emitter-collector voltages were compared between the unit bipolar transistors formed on the same substrate.

The graph shown in FIG. 150 illustrates the correlation of Vbe (base-emitter voltage) of unit bipolar transistor UB1 of comparative element TEG1 and unit bipolar transistor UB2 of comparative element TEG2. The abscissa of the graph represents the base-emitter voltage of unit bipolar transistor UB1 of comparative element TEG1, and the ordinate represents the base-emitter voltage of unit bipolar transistor UB2 of comparative element TEG2.

As shown in FIG. 150, it can be seen that the correlation of base-emitter voltages of unit bipolar transistor UB 1 and unit bipolar transistor UB2 is low, with great variations.

FIG. 151 is a graph illustrating the correlation of Vbe of unit bipolar transistor UB2 and unit bipolar transistors UB3, UB4. In FIG. 151, the abscissa represents the base-emitter voltage of unit bipolar transistor UB2, and the ordinate represents the base-emitter voltages of unit bipolar transistors UB3, UB4. Comparative points EP1 in the graph represent the emitter-collector voltages of unit bipolar transistor UB2 and unit bipolar transistor UB3, and comparative points EP2 represent the emitter-collector voltages of unit bipolar transistor UB2 and unit bipolar transistor UB4.

As shown in FIG. 151, it can be seen both of comparative points EP1 and comparative points EP2 vary.

Figure 152:
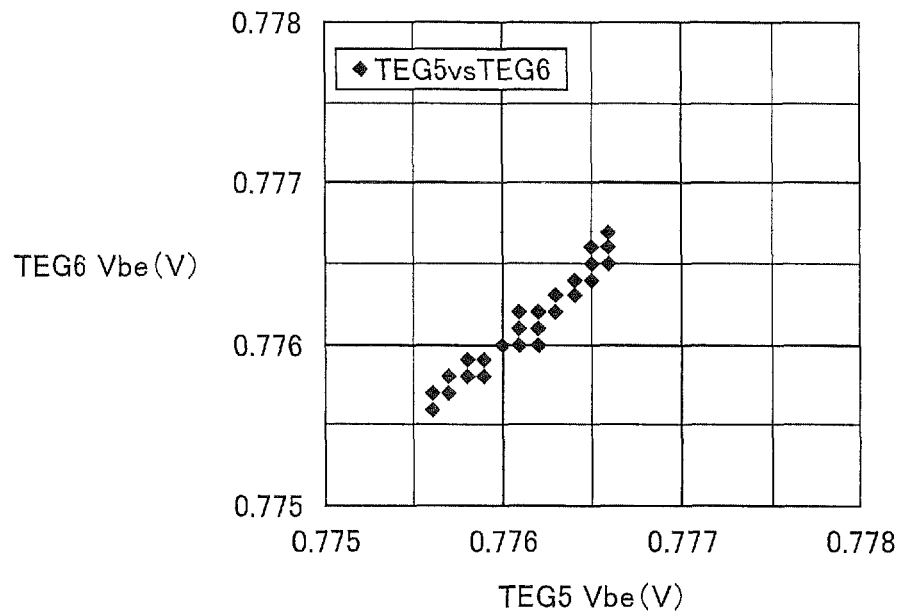
FIG. 152 is a graph illustrating the correlation of an emitter-collector voltage of unit bipolar transistor UB5 with an emitter-collector voltage of unit bipolar transistor UB6.

FIG. 152 is a graph illustrating the correlation of emitter-collector voltages of unit bipolar transistor UB5 of inventive element TEG5 and unit bipolar transistor UB6 of inventive element TEG6. The abscissa represents the emitter-collector voltage of unit bipolar transistor UB5, and the ordinate represents the emitter-collector voltage of unit bipolar transistor UB6. As shown in FIG. 152, it can be seen that there is not a great variation in emitter-collector voltage of unit bipolar transistor UB5 and unit bipolar transistor UB6.

Figure 153:
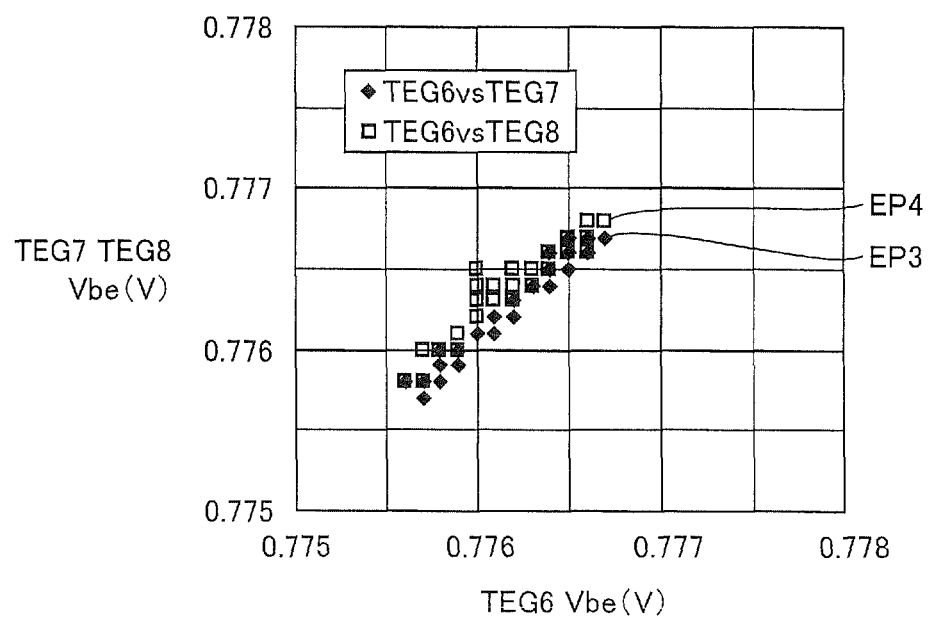
FIG. 153 is a graph illustrating the correlation of an emitter-collector voltage of inventive element TEG6 with an emitter-collector voltage of inventive elements TEG7, TEG8.

FIG. 153 is a graph illustrating the correlation of emitter-collector voltages of inventive element TEG6 and inventive elements TEG7, TEG8. The abscissa of the graph represents the emitter-collector voltage of unit bipolar transistor UB6 of inventive element TEG6, and the ordinate represents the emitter-collector voltages of unit bipolar transistors UB7, UB8 of inventive elements TEG7, TEG8. Comparative points EP3 in the graph represent the emitter-collector voltages of unit bipolar transistor UB6 and unit bipolar transistor UB7, and comparative points EP4 represent the emitter-collector voltages of unit bipolar transistor UB6 and unit bipolar transistor UB8. As shown in FIG. 153, it can be seen that there is not a great variation in emitter-collector voltage of unit bipolar transistors UB6, UB7, UB8.

To compare the comparative points shown in FIG. 153 to the results shown in FIG. 151, it can be seen that the comparative points shown in FIG. 153 vary less.

It was thus been found that, according to semiconductor device 1 of the present invention, a great variation in emitter-collector voltage of each unit bipolar transistor could be suppressed by arranging the unit bipolar transistors in an array.

The comparative example and the example were compared for a PNP bipolar transistor with reference to FIGS. 150 to 153. Referring now to FIGS. 154 to 157, the results of comparison between the comparative example and the example for an NPN bipolar transistor will be described.

Figure 154:
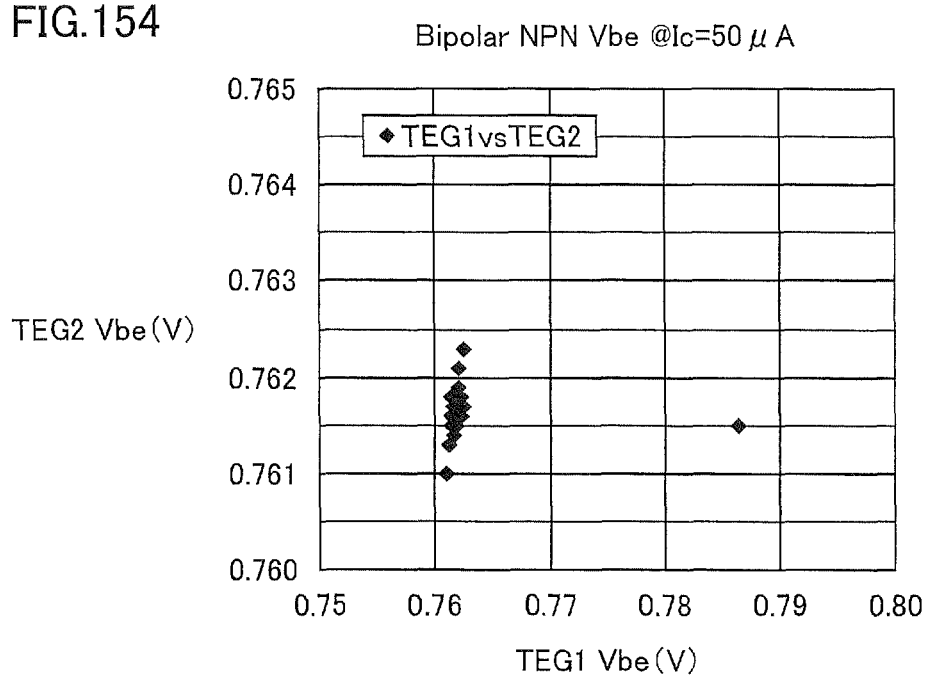
FIG. 154 is a graph illustrating the results of comparison between an emitter-collector voltage of unit bipolar transistor UB1 of comparative element TEG1 and an emitter-collector voltage of unit bipolar transistor UB2 of comparative element TEG2.
Figure 155:
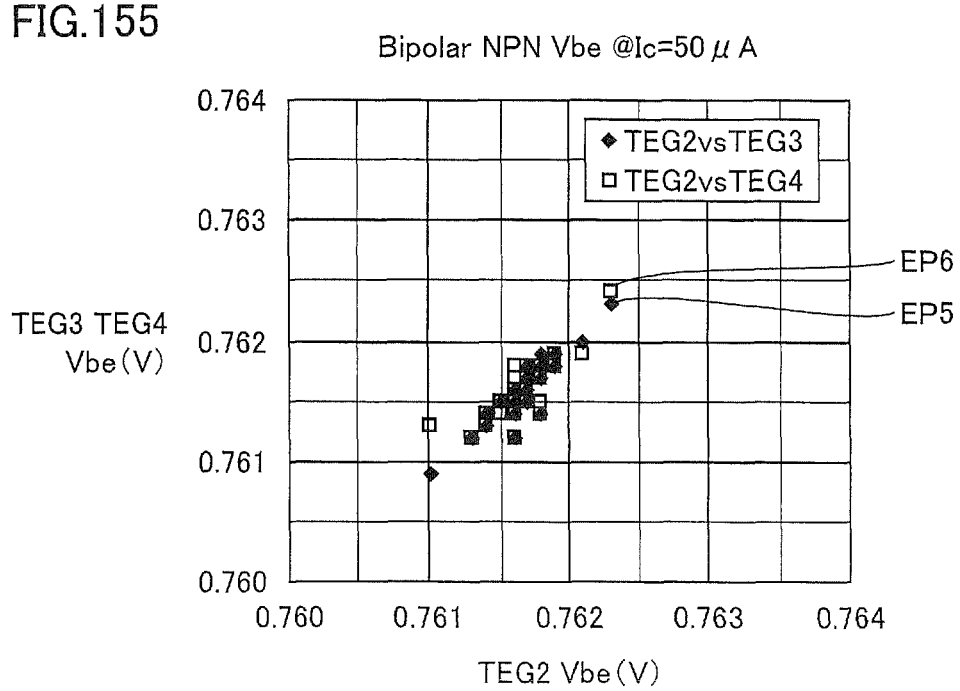
FIG. 155 is a graph illustrating the results of comparison between unit bipolar transistor UB2 of comparative element TEG2 and unit bipolar transistors UB3, UB4 of comparative elements TEG3, TEG4.

FIG. 154 is a graph illustrating the results of comparison of the emitter-collector voltages of unit bipolar transistor UB1 of comparative element TEG1 and unit bipolar transistor UB2 of comparative element TEG2. FIG. 155 is a graph illustrating the results of comparison between unit bipolar transistor UB2 of comparative element TEG2, and unit bipolar transistors UB3, UB4 of comparative elements TEG3, TEG4.

Comparative points EP5 in the graph of FIG. 155 represent the emitter-collector voltages of unit bipolar transistor UB2 and unit bipolar transistor UB3, and comparative points EP6 represent the emitter-collector voltages of unit bipolar transistor UB2 and unit bipolar transistor UB4.

Figure 156:
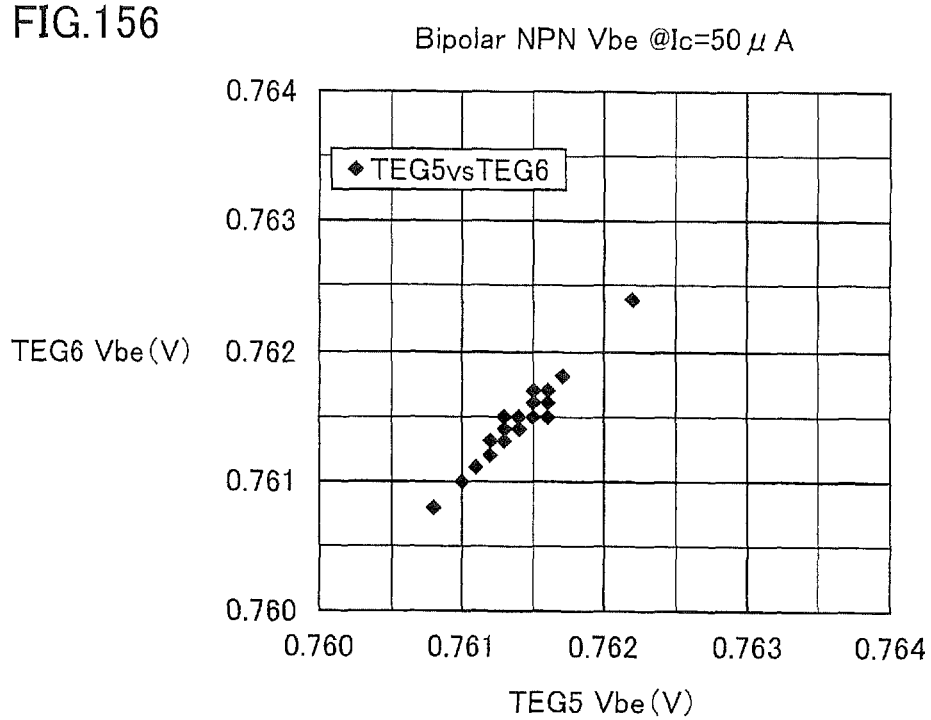
FIG. 156 is a graph illustrating emitter-collector voltages of unit bipolar transistor UB5 of inventive element TEG5 and inventive elements TEG6, TEG7.
Figure 157:
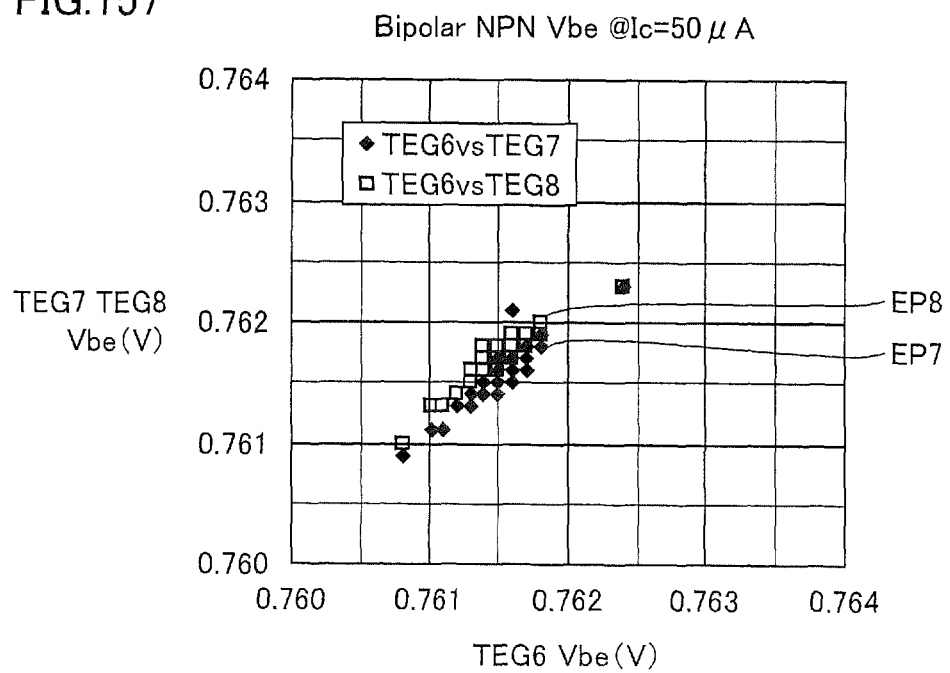

FIG. 156 is a graph illustrating the emitter-collector voltages of unit bipolar transistor UB5 of inventive element TEG5 and inventive elements TEG6, TEG7. FIG. 157 is a graph illustrating the emitter-collector voltages of unit bipolar transistor UB6 of inventive element TEG6, and unit bipolar transistors UB7, UB8 of inventive elements TEG7, TEG8. Comparative points EP7 in the graph represent the emitter-collector voltages of unit bipolar transistor UB6 and unit bipolar transistor UB7, and comparative points EP8 represent the emitter-collector voltages of unit bipolar transistor UB6 and unit bipolar transistor UB8.

To compare FIGS. 154 and 156, it can be seen that the variation is small in the unit bipolar transistor in this example even when a single unit bipolar transistor is formed.

Tables 2 and 3 illustrate the measurement results of the comparative elements and the inventive elements. Table 2 illustrates the experimental results of a direct current amplification factor (hFE) in the PNP unit bipolar transistors of the comparative elements and the inventive elements, and lists "Med (median value)," "Average (average value)," "Sigma ($\sigma$)," "Range (distribution range)," "Max" and "Min."

TABLE 2

| PNP hFE | TEG1 | TEG2 | TEG3 | TEG4 | TEG5 | TEG6 | TEG7 | TEG8 |
|---|---|---|---|---|---|---|---|---|
| Med | 3.341 | 3.355 | 3.341 | 3.354 | 3.337 | 3.352 | 3.339 | 3.349 |
| Average | 3.337 | 3.354 | 3.338 | 3.353 | 3.332 | 3.350 | 3.335 | 3.347 |
| Sigma | 0.028 | 0.027 | 0.027 | 0.026 | 0.029 | 0.028 | 0.027 | 0.026 |
| Range | 0.134 | 0.131 | 0.156 | 0.138 | 0.161 | 0.142 | 0.141 | 0.126 |
| Max | 3.397 | 3.415 | 3.410 | 3.431 | 3.404 | 3.418 | 3.408 | 3.410 |
| Min | 3.263 | 3.284 | 3.254 | 3.293 | 3.243 | 3.276 | 3.267 | 3.284 |

As shown in Table 2, it can be seen that "Range (distribution range)" of unit bipolar transistors UB7, UB8 of inventive elements TEG7, TEG8 are narrower than "Range (distribution range)" of unit bipolar transistors UB3, UB4 of comparative elements TEG3, TEG4.

Table 3 below illustrates the experimental results of a direct current amplification factor (hFE) in the NPN unit bipolar transistors of the comparative elements and the inventive elements, and lists "Med (median value)," "Average (average value)," "Sigma ($\sigma$)," "Range (distribution range)," "Max" and "Min."

TABLE 3

| NPN hFE | TEG1 | TEG2 | TEG3 | TEG4 | TEG5 | TEG6 | TEG7 | TEG8 |
|---|---|---|---|---|---|---|---|---|
| Med | 12.57 | 12.37 | 12.62 | 12.38 | 12.63 | 12.45 | 12.65 | 12.46 |
| Average | 12.461 | 12.279 | 12.512 | 12.319 | 12.589 | 12.368 | 12.552 | 12.355 |
| Sigma | 0.418 | 0.415 | 0.452 | 0.433 | 0.441 | 0.421 | 0.422 | 0.404 |
| Range | 1.470 | 1.690 | 1.690 | 1.490 | 1.650 | 1.520 | 1.450 | 1.420 |
| Max | 13.140 | 13.120 | 13.210 | 13.040 | 13.400 | 13.050 | 13.220 | 13.010 |
| Min | 11.670 | 11.430 | 11.640 | 11.550 | 11.750 | 11.530 | 11.770 | 11.590 |

It can be seen that "Range (distribution range)" of unit bipolar transistor UB6 of inventive element TEG6 is narrower than "Range (distribution range)" of unit bipolar transistor UB2 of comparative element TEG2. Likewise, it can be seen that "Range (distribution range)" of unit bipolar transistors UB7, UB8 of inventive elements TEG7, TEG8 are narrower than "Range (distribution range)" of unit bipolar transistors UB3, UB4 of comparative elements TEG3, TEG4. It was thus been found that, according to semiconductor device 1 of the present invention, a wide distribution of the direct current amplification factor (hFE) of each unit bipolar transistor UB could be suppressed.

Although the embodiments of the present invention have been described as above, it should be understood that the embodiments disclosed herein are illustrative and non-restrictive in every respect. The scope of the present invention is defined by the terms of the claims, and is intended to include any modifications within the scope and meaning equivalent to the terms of the claims. Furthermore, the numerical values and the like described above are illustrative, and the present invention is not limited to the numerical values and ranges described above.

INDUSTRIAL APPLICABILITY

The present invention is applicable to a semiconductor device and a method of manufacturing the semiconductor device.

REFERENCE SIGNS LIST 1 semiconductor device; 3 RAM; 4 timer; 5 flash memory; 6 clock generation circuit; 7 ROM; 8 system control logic; 9 input/output circuit; 10 data bus; 11 address bus; 12 peripheral circuit unit; 13, 14 converter; 15 power-on reset circuit; 16, 28 reference voltage generation circuit; 17 output buffer; 18 control circuit; 19 internal logic circuit; 20 relay terminal; 21 output buffer; 22, 47 static protection diode; 25 power supply line; 26 ground line; 27 clamping circuit between power supplies; 29 control signal; 30 charge circuit; 31 comparator; 32 buffer control logic circuit; 33 output signal; 34 power supply circuit; 38, 39, 40, 63 bipolar transistor; 41, 42, 43 resistor; 44, 59 power supply terminal; 45 output terminal; 46 comparison circuit; 48 VSS earthing terminal; AR1, AR2 active region; BD bipolar dummy electrode; BR base region; C connection member; CK internal clock signal; CLK external clock signal; CR collector region; DAR dummy active region; DAR1 first dummy active region; DAR2 second dummy active region; DE, DE1, DE2 dummy electrode; DR1, DR2, DR3, DR4 drain region; DUB dummy unit bipolar transistor; EP1, EP2, EP3, EP4, EP5, EP6, EP7, EP8 comparative point; ER emitter region; GE1, GE2, GE3, GE4 gate electrode; GI1, GI2, GI3, GI4 gate insulating film; IF1, IF2, IF3, IF8, IF10 isolation insulating film; IF4, IF6, IF7 insulating film; IF5 interlayer insulating film; IF11 protection film; IF15 laminated insulating film; IF20 interface layer; IF21 diffusion barrier film; IF22 high dielectric insulating film; LDR1, LDR2, LDR3, LDR4 low concentration drain region; LSR1, LSR2, LSR3, LSR4 low concentration source region; MF metal film; MG metal layer; NW1, NW2, NW3, PW3 well; PF, PL, PL1 polysilicon film; PLG polysilicon layer; PNP junction; RP1, RP2, RP3, RP4, RP5, RP6, RP7 resist pattern film; PW4 well region; SF1, SF2, SF3, SF4, SF5, SF6, SF7, SF8, SF9, SF10, SF11, SF12 silicide film; SR1, SR2, SR3, SR4 source region; SS semiconductor substrate; SW1, SW2, SW3, SW4, SW5 sidewall; TEG1 to TEG4 comparative element; TEG5 to TEG8 inventive element; UB1, UB2, UB3, UB4, UB5, UB6, UB7, UB8 unit bipolar transistor; UD1, UD2, UD3, UD4, UD5, UD6, UD7, UD8, UD9 unit bipolar dummy electrode; UDE1, UDE2 unit dummy electrode; UDR1, UDR2 unit dummy active region; UL upper layer wire.

The invention claimed is:

1. A semiconductor device comprising:
a semiconductor substrate having a main surface;
a first insulated gate field effect transistor including a pair of first source/drain regions formed on said main surface, and a first gate electrode formed on said main surface between said pair of first source/drain regions;
a second insulated gate field effect transistor including a pair of second source/drain regions formed on said main surface, and a second gate electrode formed on said main surface between said pair of second source/drain regions;
a bipolar transistor including an emitter region formed on said main surface, a base region formed on said main surface to form a pn junction with said emitter region, and a collector region formed on said main surface opposite to said emitter region relative to said base region to form a pn junction with said base region;
a first element isolation structure formed on said main surface above the pn junction formed between said emitter region and said base region;
a second element isolation structure formed on said main surface above the pn junction formed between said base region and said collector region; and
a third element isolation structure formed on said main surface opposite to said second element isolation structure relative to said collector region, wherein
said pair of first source/drain regions, said emitter region, said base region and said collector region each have a silicided surface, and said pair of second source/drain regions and said second gate electrode each have a non-silicided surface, and
said semiconductor device further comprises a first dummy gate electrode which is formed on at least one of said first element isolation structure, said second element isolation structure and said third element isolation structure, and which is not used as a circuit.

2. The semiconductor device according to claim 1, further comprising:
a first dummy active region formed on said main surface around said first insulated gate field effect transistor; and
a second dummy gate electrode formed on said first dummy active region, wherein
said first dummy gate electrode and said second dummy gate electrode each have a floating potential.

3. The semiconductor device according to claim 2, wherein
a plurality of said first dummy gate electrodes are provided,
a plurality of said first dummy active regions are provided,
a plurality of said second dummy gate electrodes are provided, and
the area of an upper surface of each of said first dummy gate electrodes is larger than the area of an upper surface of each of said second dummy gate electrodes.

4. The semiconductor device according to claim 3, further comprising:
a first well region formed on said main surface;
a second well region formed on said main surface and forming a pn junction with said first well region; and
an isolation structure formed on said main surface above the junction portion between said first well region and said second well region, wherein
said plurality of first dummy active regions and said plurality of second dummy gate electrodes are formed in the first well region and the second well region on opposing sides of said isolation structure.

5. The semiconductor device according to claim 2, wherein
a plurality of said first dummy active regions include a plurality of second dummy active regions formed on said main surface adjacent to said first insulated gate field effect transistor, and a plurality of third dummy active regions opposite to said first insulated gate field effect transistor relative to said second dummy active regions,
said plurality of second dummy active regions are spaced from one another with a first space,
said plurality of third dummy active regions are spaced from one another with a second space larger than said first space,
a plurality of said second dummy gate electrodes include a plurality of third dummy gate electrodes and a plurality of fourth dummy gate electrodes, and
the plane area of each of said second dummy active regions is smaller than the plane area of each of said third dummy active regions, and the plane area of each of said third dummy gate electrodes is smaller than the plane area of each of said fourth dummy gate electrodes.

6. The semiconductor device according to claim 1, wherein
said first insulated gate field effect transistor is provided in a logic circuit, and
said second insulated gate field effect transistor is provided in a reference voltage generation circuit.

7. The semiconductor device according to claim 1, wherein
said first insulated gate field effect transistor is provided in a memory circuit, and
said second insulated gate field effect transistor is provided in at least one circuit from the group consisting of an analog-digital conversion circuit, a digital-analog conversion circuit, a power supply circuit and a signal input/output circuit.

8. The semiconductor device according to claim 1, wherein
said first element isolation structure is formed on said main surface to surround the periphery of said emitter region, said base region is formed on said main surface to surround the periphery of said first element isolation structure, said second element isolation structure is formed on said main surface to surround the periphery of said base region, said collector region is formed on said main surface to surround the periphery of said second element isolation structure, and said third element isolation structure is formed on said main surface to surround the periphery of said collector region, and
a plurality of said first dummy gate electrodes are provided, said plurality of first dummy gate electrodes including a fifth dummy gate electrode extending along an inner peripheral edge portion of an element isolation structure on which said first dummy gate electrodes are provided, and a sixth dummy gate electrode extending along an outer peripheral edge portion of said element isolation structure.

9. The semiconductor device according to claim 1, wherein
said first element isolation structure is formed on said main surface to surround the periphery of said emitter region, said base region is formed on said main surface to surround the periphery of said first element isolation structure, said second element isolation structure is formed on said main surface to surround the periphery of said base region, said collector region is formed on said main surface to surround the periphery of said second element isolation structure, and said third element isolation structure is formed on said main surface to surround the periphery of said collector region, and said first dummy gate electrode is formed in an annular shape.

10. The semiconductor device according to claim 1, wherein a plurality of said first dummy gate electrodes are provided.

11. The semiconductor device according to claim 1, further comprising a dummy bipolar transistor formed on said main surface and having a floating potential, wherein said bipolar transistor is arranged adjacent to said dummy bipolar transistor.

12. The semiconductor device according to claim 1, wherein said first gate electrode includes a first silicon-containing film containing a silicon element, and said second gate electrode includes a second silicon-containing film containing a silicon element, and said first silicon-containing film has a silicided upper surface.

13. The semiconductor device according to claim 1, further comprising:

a first insulating film formed on said main surface and under said first gate electrode; and a second insulating film formed on said main surface and under said second gate electrode, wherein said first gate electrode includes a first metal film formed on said first insulating film, and a first silicon-containing film containing a silicon element formed on said first metal film, said second gate electrode includes a second metal film formed on said second insulating film, and a second silicon-containing film containing a silicon element formed on said second metal film, and said first silicon-containing film has a silicided upper surface.

14. A method of manufacturing a semiconductor device, comprising:

preparing a semiconductor substrate having a main surface;

forming a first insulated gate field effect transistor including a pair of first source/drain regions formed on said main surface, and a first gate electrode formed on said main surface between said pair of first source/drain regions;

forming a second insulated gate field effect transistor including a pair of second source/drain regions formed on said main surface, and a second gate electrode formed on said main surface between said pair of second source/drain regions;

forming a bipolar transistor including an emitter region formed on said main surface, a base region formed on said main surface to form a pn junction with said emitter region, and a collector region formed on said main surface opposite to said emitter region relative to said base region to form a pn junction with said base region;

forming a first element isolation structure on said main surface above the pn junction formed between said emitter region and said base region;

forming a second element isolation structure on said main surface above the pn junction formed between said base region and said collector region;

forming a third element isolation structure on said main surface opposite to said second element isolation structure relative to said collector region, forming a first dummy gate electrode, which is not used as a circuit, on an upper surface of at least one of said first element isolation structure, said second element isolation structure and said third element isolation structure;

forming a protection film to cover said first insulated gate field effect transistor, said second insulated gate field effect transistor, said bipolar transistor and said first dummy gate electrode;

patterning said protection film to expose said first insulated gate field effect transistor and said bipolar transistor;

forming a metal film to cover said first insulated gate field effect transistor and said bipolar transistor exposed through said protection film and patterned said protection film; and subjecting said metal film to heat treatment to form a silicide film on each of said first source/drain regions, said emitter region, said base region and said collector region.

15. The method of manufacturing a semiconductor device according to claim 14, further comprising:

forming a first dummy active region on said main surface; and forming a second dummy gate electrode on said first dummy active region, wherein said first insulated gate field effect transistor is formed on said main surface adjacent to said first dummy active region and said second dummy gate electrode.

16. The method of manufacturing a semiconductor device according to claim 15, wherein said forming a first dummy active region forms a plurality of said first dummy active regions, said step of forming a second dummy gate electrode forms a plurality of said second dummy gate electrodes, and the area of an upper surface of each of said second dummy gate electrodes is larger than the area of an upper surface of said first dummy gate electrode.

17. The method of manufacturing a semiconductor device according to claim 16, further comprising:

forming an element isolation structure on said main surface;

forming a first well region on said main surface adjacent to said element isolation structure; and forming a second well region on said main surface opposite to said first well region relative to said element isolation structure; wherein said plurality of first dummy active regions and said plurality of second dummy gate electrodes are formed in said first well region and said second well region.

18. The method of manufacturing a semiconductor device according to claim 16, wherein said forming a first dummy active region includes the steps of forming a first unit dummy region on said main surface, and forming a second unit dummy region having the area of an upper surface larger than the area of an upper surface of said first unit dummy region, said forming a second dummy gate electrode includes the forming a first unit dummy electrode on said first unit dummy region, and forming a second unit dummy electrode having the area of an upper surface larger than the area of an upper surface of said first unit dummy electrode on said second unit dummy region, and said first insulated gate field effect transistor is formed on said main surface closer to said first unit dummy electrode than to said second unit dummy electrode.

19. The method of manufacturing a semiconductor device according to claim 14, wherein
a logic circuit includes said first insulated gate field effect transistor, and
a reference voltage generation circuit includes said second insulated gate field effect transistor.

20. The method of manufacturing a semiconductor device according to claim 14, wherein
a memory circuit includes said first insulated gate field effect transistor, and
a peripheral circuit including at least one of an analog-digital conversion circuit, a digital-analog conversion circuit, a power supply circuit and a signal input/output circuit includes said second insulated gate field effect transistor.

21. The method of manufacturing a semiconductor device according to claim 14, wherein
said first element isolation structure is formed on said main surface to surround the periphery of said emitter region, said base region is formed on said main surface to surround the periphery of said first element isolation structure, said second element isolation structure is formed on said main surface to surround the periphery of said base region, said collector region is formed on said main surface to surround the periphery of said second element isolation structure, and said third element isolation structure is formed on said main surface to surround the periphery of said collector region, and
a plurality of said first dummy gate electrodes are provided, said plurality of first dummy gate electrodes including a first unit bipolar dummy electrode extending along an inner peripheral edge portion of an element isolation structure on which said first dummy gate electrodes are provided, and a second unit bipolar dummy electrode extending along an outer peripheral edge portion of said element isolation structure.

22. The method of manufacturing a semiconductor device according to claim 14, wherein
said first element isolation structure is formed on said main surface to surround the periphery of said emitter region, said base region is formed on said main surface to surround the periphery of said first element isolation structure, said second element isolation structure is formed on said main surface to surround the periphery of said base region, said collector region is formed on said main surface to surround the periphery of said second element isolation structure, and said third element isolation structure is formed on said main surface to surround the periphery of said collector region, and
said first dummy gate electrode is formed in an annular shape.

23. The method of manufacturing a semiconductor device according to claim 14, wherein
a plurality of said first dummy gate electrodes are arranged on an upper surface of an element isolation structure on which said first dummy gate electrodes are provided.

* * * * *